(12) United States Patent
Yukawa et al.

(10) Patent No.: US 8,399,881 B2
(45) Date of Patent: Mar. 19, 2013

(54) MEMORY ELEMENT, MEMORY DEVICE, AND SEMICONDUCTOR DEVICE

(75) Inventors: Mikio Yukawa, Atsugi (JP); Nobuharu Ohsawa, Zama (JP); Yoshinobu Asami, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/103,293

(22) Filed: May 9, 2011

(65) Prior Publication Data

US 2011/0210412 A1    Sep. 1, 2011

Related U.S. Application Data

(63) Continuation of application No. 11/885,970, filed as application No. PCT/JP2006/306373 on Mar. 22, 2006, now Pat. No. 7,956,352.

(30) Foreign Application Priority Data

Mar. 25, 2005    (JP) .................................. 2005-089114

(51) Int. Cl.
*H01L 29/08*    (2006.01)
*H01L 35/24*    (2006.01)
*H01L 51/00*    (2006.01)

(52) U.S. Cl. .............................. 257/40; 257/368; 438/99
(58) Field of Classification Search .................. None
See application file for complete search history.

(56) References Cited

U.S. PATENT DOCUMENTS

| | | | |
|---|---|---|---|
| 4,972,370 A | 11/1990 | Morimoto et al. | |
| 5,853,905 A | 12/1998 | So et al. | |
| 6,055,180 A | 4/2000 | Gudesen et al. | |
| 6,218,677 B1 | 4/2001 | Broekaert | |
| 6,465,828 B2 | 10/2002 | Agarwal | |
| 6,768,157 B2 | 7/2004 | Krieger et al. | |
| 6,806,526 B2 | 10/2004 | Krieger et al. | |
| 6,815,286 B2 | 11/2004 | Krieger et al. | |
| 6,838,720 B2 | 1/2005 | Krieger et al. | |
| 6,858,481 B2 | 2/2005 | Krieger et al. | |

(Continued)

FOREIGN PATENT DOCUMENTS

| | | |
|---|---|---|
| CA | 2 515 614 | 8/2004 |
| EP | 1 381 054 | 1/2004 |

(Continued)

OTHER PUBLICATIONS

International Search Report (Application No. PCT/JP2006/306373) dated Jul. 4, 2006.

(Continued)

*Primary Examiner* — Evan Pert
*Assistant Examiner* — Andres Munoz
(74) *Attorney, Agent, or Firm* — Eric J. Robinson; Robinson Intellectual Property Law Office, P.C.

(57) ABSTRACT

On object of the invention is to provide a nonvolatile memory device, in which data can be added to the memory device after a manufacturing process and forgery and the like by rewriting can be prevented, and a semiconductor device including the memory device. Another object of the invention is to provide a highly-reliable, inexpensive, and nonvolatile memory device and a semiconductor device including the memory device. A memory element includes a first conductive layer, a second conductive layer, a first insulating layer with a thickness of 0.1 nm or more and 4 nm or less being in contact with the first conductive layer, and an organic compound layer interposed between the first conductive layer, the first insulating layer, and the second conductive layer.

38 Claims, 27 Drawing Sheets

U.S. PATENT DOCUMENTS

| | | |
|---|---|---|
| 6,864,522 B2 | 3/2005 | Krieger et al. |
| 6,870,183 B2 | 3/2005 | Tripsas et al. |
| 6,947,321 B2 | 9/2005 | Tanabe |
| 6,950,331 B2 | 9/2005 | Yang et al. |
| 6,979,837 B2 | 12/2005 | Tripsas et al. |
| 6,992,323 B2 | 1/2006 | Krieger et al. |
| 7,026,702 B2 | 4/2006 | Krieger et al. |
| 7,075,105 B2 | 7/2006 | Kano |
| 7,170,779 B2 | 1/2007 | Miyawaki et al. |
| 7,220,985 B2 | 5/2007 | Cheung et al. |
| 7,254,053 B2 | 8/2007 | Krieger et al. |
| 7,282,380 B2 | 10/2007 | Maruyama et al. |
| 7,465,956 B1 | 12/2008 | Tripsas et al. |
| 7,791,066 B2 | 9/2010 | Yamazaki |
| 7,919,772 B2 | 4/2011 | Furukawa et al. |
| 7,956,352 B2 * | 6/2011 | Yukawa et al. ............ 257/40 |
| 2002/0056864 A1 | 5/2002 | Agarwal |
| 2003/0053350 A1 | 3/2003 | Krieger et al. |
| 2003/0137325 A1 * | 7/2003 | Yamazaki et al. .......... 327/80 |
| 2003/0155602 A1 | 8/2003 | Krieger et al. |
| 2004/0027849 A1 | 2/2004 | Yang et al. |
| 2004/0057323 A1 | 3/2004 | Tanabe |
| 2004/0084670 A1 | 5/2004 | Tripsas et al. |
| 2004/0108501 A1 | 6/2004 | Cheung et al. |
| 2004/0164302 A1 | 8/2004 | Arai et al. |
| 2004/0217347 A1 | 11/2004 | Tripsas et al. |
| 2004/0246768 A1 | 12/2004 | Krieger et al. |
| 2004/0246770 A1 * | 12/2004 | Kano ...................... 365/154 |
| 2005/0167767 A1 | 8/2005 | Akasaka |
| 2005/0214984 A1 | 9/2005 | Maruyama et al. |
| 2005/0274943 A1 | 12/2005 | Chen |
| 2006/0214008 A1 | 9/2006 | Asami et al. |
| 2007/0051940 A1 | 3/2007 | Clemens et al. |
| 2008/0017849 A1 | 1/2008 | Yukawa et al. |
| 2008/0042128 A1 | 2/2008 | Furukawa et al. |
| 2009/0065769 A1 | 3/2009 | Yukawa et al. |
| 2009/0081824 A1 | 3/2009 | Tripsas et al. |
| 2009/0140231 A1 | 6/2009 | Yukawa et al. |

FOREIGN PATENT DOCUMENTS

| | | |
|---|---|---|
| EP | 1 434 232 | 6/2004 |
| JP | 62-259478 A | 11/1987 |
| JP | 04-177769 A | 6/1992 |
| JP | 11-307261 | 11/1999 |
| JP | 2000-030870 | 1/2000 |
| JP | 2000-113152 A | 4/2000 |
| JP | 2001-101368 | 4/2001 |
| JP | 2002-026277 | 1/2002 |
| JP | 2002-110999 A | 4/2002 |
| JP | 2004-047791 A | 2/2004 |
| JP | 2004-095850 | 3/2004 |
| JP | 2004-513513 | 4/2004 |
| JP | 2004-200569 | 7/2004 |
| JP | 2004-304180 A | 10/2004 |
| JP | 2005-500682 | 1/2005 |
| JP | 2005-228804 A | 8/2005 |
| JP | 2005-311336 | 11/2005 |
| WO | WO 98/58383 | 12/1998 |
| WO | WO 02/37500 | 5/2002 |
| WO | WO 2006/043573 | 4/2006 |
| WO | WO 2006/064859 | 6/2006 |

OTHER PUBLICATIONS

Written Opinion (Application No. PCT/JP2006/306373) dated Jul. 4, 2006.

Chinese Office Action (Application No. 200910164150.5) dated Oct. 13, 2010.

Ma et al., "Organic Nonvolatile Memory by Controlling the Dynamic Copper-Ion Concentration Within Organic Layer," Appl. Phys. Lett. (Applied Physics Letters), Jun. 14, 2004, vol. 84, No. 24, pp. 4908-4910.

European Search Report (Application No. 06730321.4) dated Dec. 16, 2010.

Korean Office Action (Application No. 2007-7024409) Dated Oct. 29, 2012.

\* cited by examiner

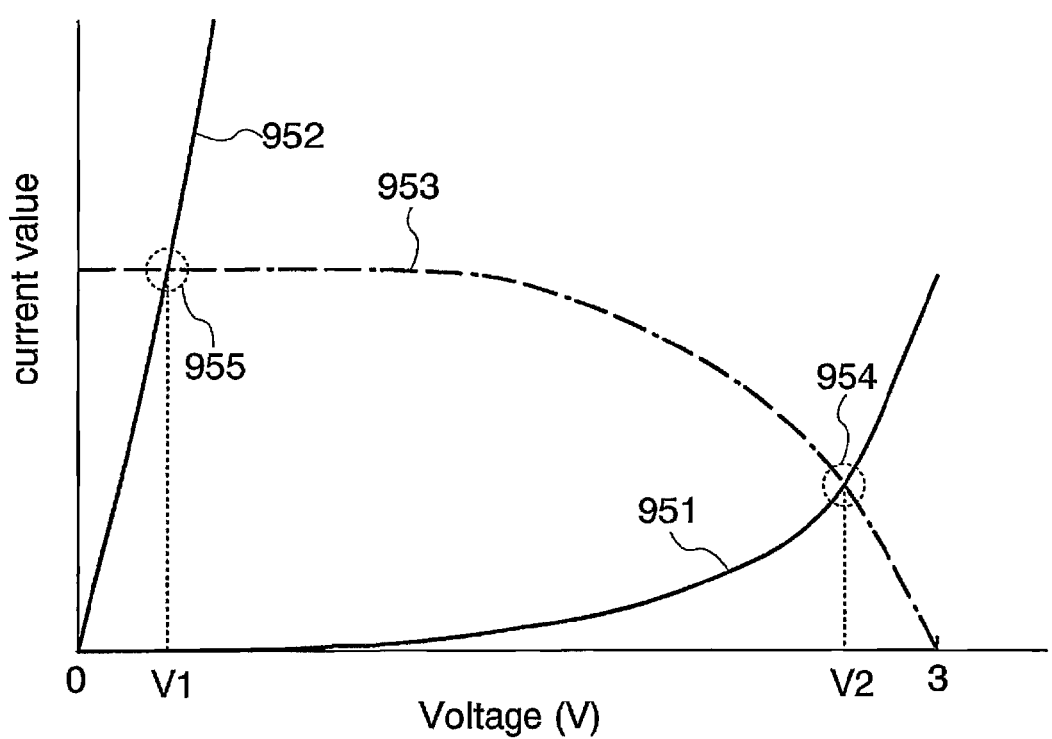

◆ ◇ one side of a memory element: 2um
▲ △ one side of a memory element: 3um

● Sample 16
▲ Sample 17

● Sample 18
▲ Sample 19
△ Sample 20

◇ Sample 44
□ Sample 45
△ Sample 46
○ Sample 47
∗ Sample 48

MEMORY ELEMENT, MEMORY DEVICE, AND SEMICONDUCTOR DEVICE

TECHNICAL FIELD

The present invention relates to a memory element, a memory device including the memory element, and a semiconductor device including the memory element.

BACKGROUND ART

In recent years, a semiconductor device having various functions, in which a plurality of circuits are integrated over an insulated surface, has been developed. Moreover, a semiconductor device which can conduct wireless transmission/reception of data by providing an antenna has been developed. Such a semiconductor device is referred to as a wireless chip (also referred to as an ID tag, an IC tag, an IC chip, a RF (Radio Frequency) tag, a wireless tag, an electronic tag, or a RFID (radio frequency identification)) tag, and has already brought to part of the market.

Many of these semiconductor devices that have already been put into practical use have a circuit (also referred to as an IC (integrated circuit) chip) using a semiconductor substrate such as an Si substrate and an antenna, and the IC chip includes a memory circuit (also referred to as a memory), a control circuit, and the like. In particular, by providing a memory circuit which can store much data, a semiconductor device with high added value providing higher performance can be provided. In addition, such semiconductor devices are required to be manufactured at low cost. In recent years, an organic memory and the like using an organic compound for a memory circuit and the like, have been actively developed (for example, Reference 1: Japanese Patent Application Laid-Open No. 2002-26277).

As a memory circuit, a DRAM (dynamic random access memory), an SRAM (static random access memory), an FeRAM (ferroelectric random access memory), a mask ROM (read only memory), an EPROM (electrically programmable read only memory), an EEPROM (electrically erasable and programmable read only memory), a flash memory, and the like are given. Among them, a DRAM and a SRAM are volatile memory circuits in which data is erased when power source is turned off; therefore, it is necessary to write data every time the power source is turned on. Although an FeRAM is a nonvolatile memory circuit, a manufacturing step thereof is increased because a capacitor element including a ferroelectric layer is used. A mask ROM has a simple structure; however, it is necessary to write data during a manufacturing process, and data cannot be rewritten. An EPROM, an EEPROM, and a flash memory are nonvolatile memory circuits; however, the number of manufacturing steps thereof is increased because an element having two gate electrodes is used.

To form a memory element by using an organic compound, the organic compound is provided between a pair of electrodes. When a thickness of the organic compound layer is increased, current does not easily flow and writing voltage is increased. Meanwhile, when a thickness of an organic compound layer is reduced to reduce writing voltage, short-circuiting may be caused between the electrodes in an initial state. This may result in reduction of reliability of a memory device and a semiconductor device.

DISCLOSURE OF INVENTION

In view of the foregoing problems, it is an object of the present invention to provide a nonvolatile memory element, in which data can be written once other than in manufacturing and forgery and the like due to rewriting can be prevented, a memory device including the memory element, and a semiconductor device including the memory device. It is another object of the present invention to provide a memory device and a semiconductor device, which are highly reliable and inexpensive.

In an aspect of the present invention, a memory element includes a first conductive layer, a second conductive layer, an organic compound layer interposed between the first and second conductive layers, and a first insulating layer with a thickness of 0.1 nm or more and 4 nm or less, which is provided between the first and second conductive layers and is in contact with the first conductive layer.

In another aspect of the present invention, a memory element includes a first conductive layer, a second conductive layer, an organic compound layer interposed between the first and second conductive layers, a first insulating layer with a thickness of 0.1 nm or more and 4 nm or less, which is provided between the first and second conductive layers and is in contact with the first conductive layer, and a second insulating layer with a thickness of 0.1 nm or more and 4 nm or less, which is provided between the first and second conductive layers and is in contact with the second conductive film.

The first and second insulating layers may be discontinuous layers, for example, nonuniform shapes are randomly dispersed as shown in FIG. 3A. Further, as shown in FIG. 3B, the first and second insulating layers may be striped discontinuous layers. As the striped discontinuous layers, the width of the striped discontinuous layers and a space of the adjacent striped discontinuous layers may be equal to or different from one another. In addition, as shown in FIG. 3C, the first and second insulating layers may be reticulated discontinuous layers.

Further, each of the first and second insulating layers may be a continuous layer covering at least a surface of the first conductive layer as shown in FIG. 1C. Furthermore, as shown in FIG. 1D, the first and second insulating layers may have concavity and convexity. Typically, an interface between the first or second insulating layer and the organic compound layer may have concavity and convexity. In addition, an interface between the first insulating layer and the first conductive layer or an interface between the second insulating layer and the second conductive layer may have concavity and convexity. In another aspect of the present invention, a memory element includes a first conductive layer, a second conductive layer, an organic compound layer interposed between the first and second conductive layers, and an insulating particle with a diameter of 0.1 nm or more and 4 nm or less, which is provided between the first and second conductive layers and is in contact with the first conductive layer. In another aspect of the present invention, a memory element includes a first conductive layer, a second conductive layer, an organic compound layer interposed between the first and second conductive layers, a first insulating particle with a diameter of 0.1 nm or more and 4 nm or less, which is provided between the first and second conductive layers and is in contact with the first conductive layer, and a second insulating particle with a diameter of 0.1 nm or more and 4 nm or less, which is provided between the first and second conductive layers and is in contact with the second conductive layer.

The organic compound layer of the memory element of the present invention is formed using an electron transporting material or a hole transporting material. Data is written in the memory element by using a change in resistance value which is generated by applying voltage to the memory element.

After writing data in the memory element, the first and second conductive layers are partly connected to each other. The memory element may also include a diode connected to the first or second conductive layer.

In another aspect of the present invention, a memory device includes a memory cell array in which the above mentioned memory elements are arranged in a matrix form, and a write circuit.

The memory cell array and the write circuit may be provided over a glass substrate or a flexible substrate, and the write circuit may be formed using a thin film transistor. Alternatively, the memory cell array and the write circuit may be provided over a crystalline semiconductor substrate, and the write circuit may be formed using a field-effect transistor.

In another aspect of the present invention, a semiconductor device includes the above mentioned memory element, a first transistor connected to the memory element, a conductive layer serving as an antenna, and a second transistor connected to the conductive layer.

In the semiconductor device, the first transistor, the second transistor, the memory element, and the conductive layer serving as the antenna may be formed over a first substrate. Alternatively, the first transistor may be formed over the first substrate, the memory element may be formed over a second substrate, and a conductive layer serving as a source wiring or a drain wiring of the first transistor may be connected to the memory element through a conductive particle. Further, the second transistor may be formed over the first substrate, the conductive layer sewing as the antenna may be formed over the second substrate, and the conductive layer serving as the source wiring or the drain wiring of the second transistor may be connected to the conductive layer serving as the antenna through a conductive particle.

Thicknesses of the first and second insulating layers of the present invention can be measured by an AFM (atomic force microscopy), a DFM (dynamic force microscopy), an MFM (magnetic force microscopy), an EFM (electric force microscopy), a TEM (transmission electron microscopy), and the like.

According to the present invention, it is possible to obtain a semiconductor device, in which data can be written once other than in manufacturing a chip and forgery and the like due to rewriting can be prevented. Further, by providing an insulating layer with a thickness of 4 nm or less, and preferably, 2 nm or less between a conductive layer and an organic compound layer to be in contact with the conductive layer, tunnel current flows through the insulating layer, and therefore, variations in applied voltage and amount of current in writing data in the memory element can be reduced. Further, by providing the insulating layer with a thickness of 4 nm or loess, and preferably, 2 nm or less, between the conductive layer and the organic compound layer to be in contact with the conductive layer, a charge injecting property of the memory element is increased due to a tunnel effect, and a thickness of the organic compound layer can be increased, thereby making it possible to prevent short-circuiting in an initial state. As a consequence, reliability of the memory device and the semiconductor device can be improved. Furthermore, each of the memory device and the semiconductor device of the present invention includes the memory element having a simple structure in which the organic compound layer is interposed between the pair of conductive layers, and therefore, the memory device and the semiconductor device are less expensive.

BRIEF DESCRIPTION OF DRAWINGS

FIG. 11 is a graph explaining current-voltage characteristics of a memory element and a resistance element;

BEST MODE FOR CARRYING OUT THE INVENTION

Figure 1A:
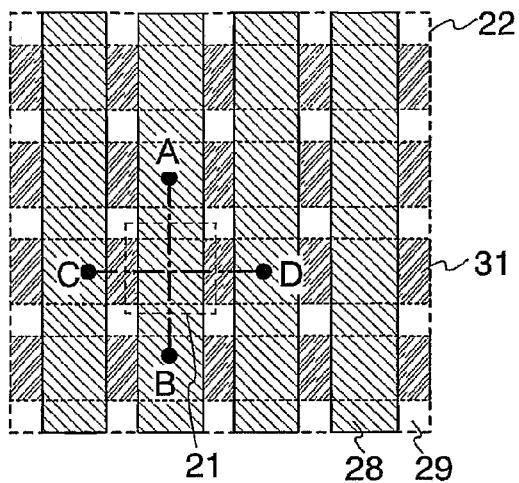
FIG. 1A is a top view and FIGS. 1B to 1E are cross sectional views explaining memory devices of the present invention.

The embodiment modes according to the present invention will hereinafter be described referring to the accompanying drawings. It is easily understood by those who skilled in the art that the embodiment modes and details herein disclosed can be modified in various ways without departing from the purpose and the scope of the invention. The present invention should not be interpreted as being limited to the description of the embodiment modes to be given below. Further, reference numerals indicating same portions are commonly used in the drawings.

(Embodiment Mode 1)

In this embodiment mode, structural examples of a memory element included in a memory device of the present invention will be described with reference to the drawings. Specifically, examples of a memory device having a passive matrix type structure will be shown.

Figure 5A:
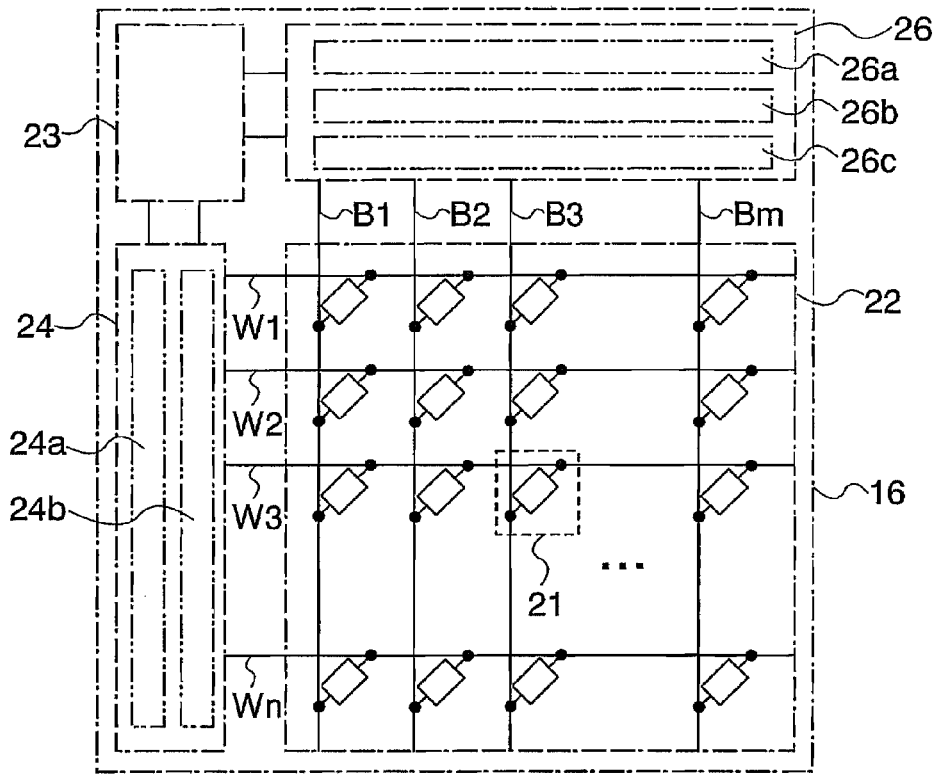
FIGS. 5A and 5C are diagrams explaining memory devices of the present invention.

FIG. 5A shows one structural example of an organic memory (a memory circuit 16) of this embodiment mode. The memory circuit 16 includes a memory array 22 in which memory cells 21 are arranged in a matrix form, a bit line driver circuit 26 having a column decoder 26a, a readout circuit 26b, and a selector 26c, a word line driver circuit 24 having a row decoder 24a and a level shifter 24b, and an interface 23 having a write circuit and the like and communicating with an external portion. Note that the structure of the memory circuit 16 shown in FIG. 5A is just one example; and therefore, the memory circuit may further include other circuit such as a sense amplifier, an output circuit, and a buffer, or, a write circuit may be provided in the bit line driver circuit.

Each of the memory cells 21 has a first conductive layer constituting a bit line Bx ($1 \leq x \leq m$), a second conductive layer constituting a word line Wy ($1 \leq y \leq n$), an insulating layer being in contact with the first conductive layer, and an organic compound layer. The organic compound layer is provided between the first conductive layer and the second conductive layer and includes a singe layer or plural layers.

Figure 1B:
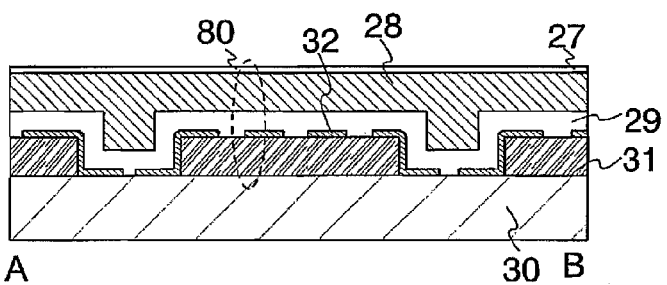

Examples of a top structure and cross sectional structures of the memory cell array 22 are shown in FIGS. 1A to 1E. FIG. 1A shows a top structure of the memory cell array 22 and FIG. 1B shows a cross sectional structure along a line A-B of FIG. 1A. Note that an insulating layer 27 serving as a protection film is not shown in FIG. 1A.

In the memory cell array 22, the memory cells 21 are provided in a matrix form (see FIG. 1A). Each of the memory cells 21 has a memory element 80 (see FIG. 1B). Over a substrate 30, the memory element 80 includes a first conductive layer 31 extending in a first direction, an organic compound layer 29 covering the first conductive layer 31, a second conductive layer 28 extending in a second direction orthogonal to the first direction, and an insulating layer 32 being in contact with the first conductive layer 31 and the organic compound layer 29. The insulating layer 32 can inject charges to the organic compound layer by a tunnel effect at voltage more than a predetermined level. Further, an insulating film 27 serving as a protection film is formed to cover the second conductive layer 28 here.

In the memory element 80, as the substrate 30, a quartz substrate, a silicon substrate, a metal substrate, a stainless steel substrate, a paper made from a fibrous material, and the like can be used in addition to a glass substrate and a flexible substrate. The flexible substrate can be bent, and for example, a plastic substrate made from polycarbonate, polyacrylate, polyethersulfone, or the like can be given. Alternatively, a film having a thermoplastic property (which is made from polypropylene, polyester, vinyl, polyvinyl fluoride, vinyl chloride, or the like) can be used. In addition, the memory cell array 22 can be provided over a field-effect transistor (FET) formed over a semiconductor substrate such as an Si substrate, or a thin film transistor (TFT) formed over a substrate such as a glass substrate.

Further, each of the first conductive layer 31 and the second conductive layer 28 can include a single layer or a laminated structure formed using metal, an alloy, a compound, and the like, which have high conductivity. Typically, metal, an alloy, a conductive compound, which have a high work function (concretely, 4.0 eV or more), a mixture thereof; and metal, an alloy, a conductive compound, which have a low work function (concretely, 3.8 eV or less), a mixture thereof; and the like can be used.

As typical examples of metal, an alloy, a conductive compound having a high work function (concretely, 4.0 eV or more), indium tin oxide (hereinafter referred to as ITO), indium tin oxide containing silicon, indium oxide containing 2 to 20% zinc oxide (ZnO), and the like can be given. Further, titanium (Ti), gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride: TiN, tungsten nitride (WN), molybdenum nitride (MoN), or the like), and the like can be used.

As typical examples of metal, an alloy, a conductive compound having a low work function (concretely, 3.8 eV or less), metal belonging to Group 1 or 2 of the periodic table, i.e., alkali metal such as lithium (Li) and cesium (Cs), alkali earth metal such as magnesium (Mg), calcium (Ca), and strontium (Sr), an alloy containing either alkali metal or alkali earth metal (such as MgAg, and AILi), rare earth metal such as europium (Eu) and ytterbium (Yb), an alloy containing rare earth metal, and the like can be given.

When an electrode, which injects holes to the organic compound layer, i.e., an anode is used for the first conductive layer 31 or the second conductive layer 28, an electrode having a high work function is preferably used. On the other hand, when an electrode, which injects electrons to the organic compound layer, is used for the first or second conductive layer, an electrode having a low work function is preferably used.

Further, as each of the first conductive layer 31 and the second conductive layer 28, a layer made from the above mentioned metal, alloy, or compound having high conductivity may be laminated with a layer formed using a semiconductor material. In this case, a semiconductor layer is preferably provided to be closer to the insulating layer 32 or the organic compound layer 29.

As the layer formed using a semiconductor material, a layer formed using a semiconductor element such as silicon and germanium, a layer formed using semiconductor oxide such as tin oxide, molybdenum oxide, indium oxide, zinc oxide, tungsten oxide, titanium oxide, copper oxide, nickel oxide, vanadium oxide, yttrium oxide, and chromium oxide, and the like can be arbitrarily used.

The first conductive layer 31 is formed by evaporation, sputtering, CVD, printing, electrolytic plating, electroless plating, or the like.

The second conductive layer 28 can be formed by evaporation, sputtering, CVD, printing, or a droplet discharging method. Note that, the droplet discharging method is a method by which a pattern with a predetermined shape is formed by discharging a liquid droplet of a composition containing a fine particle through a minute port.

Here, after forming a titanium film with a thickness of 50 to 200 nm by sputtering, the titanium film is etched to have a desired shape by photolithography so as to form the first conductive layer 31. In addition, the second conductive layer 28 is formed by evaporating aluminum to have a thickness of 50 to 200 nm.

The organic compound layer 29 is formed using an organic compound whose crystal state, conductivity, and shape are changed by being applied with voltage from an external portion. The organic compound layer 29 may include a single layer or plural layers formed by laminating layers made from different organic compounds.

Further, the organic compound layer 29 is formed to have a thickness by which electric resistance of the memory element is changed by being applied with voltage from an external portion. A typical thickness of the organic compound layer 29 is 5 nm to 100 nm, and preferably, 10 nm to 60 nm, and more preferably, 5 nm to 20 nm or 5 nm to 10 nm.

Further, the organic compound layer 29 can be formed using an organic compound having a hole transporting property or an organic compound having an electron transporting property.

As the organic compound having a hole transporting property, the following substances can be used: an aromatic amine (i.e., including a benzene ring-nitrogen bond) compound such as 4,4'-bis [N-(1-naphthyl)-N-phenyl-amino]-biphenyl (abbreviation: α-NPD), 4,4'-bis [N-(3-methylphenyl)-N-phenyl-amino]-biphenyl (abbreviation: TPD), 4,4',4"-tris(N, N-diphenyl-amino)-triphenylamine (abbreviation: TDATA), 4,4',4"-tris[N-(3-methylphenyl)-N-phenyl-amino]riphenylamine (abbreviation: MTDATA), and 4,4'-bis(N-(4-(N,N-di-m-tolylamino)phenyl)-N-phenylamino) biphenyl (abbreviation: DNTPD); a phthalocyanine compound such as phthalocyanine (abbreviation: $H_2Pc$), copper phthalocyanine (abbreviation: CuPc), and vanadyl phthalocyanine (abbreviation: VOPc); polyvinyl carbazole (abbreviation: PVK); and the like. The organic compounds mentioned above mainly have hole mobility of $10^{-6}$ cm$^2$/Vs or more, and preferably, $10^{-6}$ to $10^{-2}$ cm$^2$/VS.

As the organic compound having a strong electron transporting property, it is possible to use a material made from a metal complex having a quinoline skeleton or a benzoquinoline skeleton such as tris(8-quinolinolato) aluminum (abbreviation: Alq), tris(4-methyl-8-quinolinolato) aluminum (abbreviation: Almq$_3$), bis(10-hydroxybenzo[h]-quinolinato) beryllium (abbreviation: BeBq$_2$), and bis(2-methyl-8-quinolinolato)-4-phenylphenolato-aluminum (abbreviation: BAN), or the like. In addition, a metal complex having an oxazole ligand or a thiazole ligand such as bis[2-(2-hydroxyphenyl)-benzoxazolato] zinc (abbreviation: Zn(BOX)$_2$) and bis[2-(2-hydroxyphenyl)-benzothiazolato] zinc (abbreviation: Zn(BTZ)$_2$) can also be used. In addition to the above mentioned metal complexes, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like can also be used as a substance having a strong hole transporting property. The substances mentioned here mainly have electron mobility of $10^{-6}$ cm$^2$/Vs or more, and preferably, $10^{-6}$ to $10^{-2}$ cm$^2$/Vs.

Further, the organic compound layer may be formed by laminating the above mentioned different organic compounds.

Furthermore, the organic compound layer may be formed by a mixture of the above mentioned different organic compounds.

The organic compound layer 29 can be formed by evaporation, electron beam evaporation, sputtering, CVD, or the like. Alternatively, the organic compound layer 29 may be formed by spin coating, a sol-gel method, printing, a droplet discharging method, or the like. Further, the former mentioned methods may be combined with the latter mentioned methods.

The insulating layer 32 injects holes or electrons to the organic compound layer from the first conductive layer or the second conductive layer by the tunnel effect. Typically, electric conductivity of the insulating layer 32 is preferably $10^{-10}$ to $10^{-2}$ μm or less, and more preferably, $10^{-10}$ to $10^{-14}$ S/m. The insulating layer 32 is formed to have a thickness by which charges can be injected in the organic compound layer 29 at a predetermined voltage by the tunnel effect. A typical thickness of the insulating layer 32 is 0.1 nm or more and 4 nm or less, preferably, 1 nm or more and 4 nm or less, and more preferably, 0.1 nm or more and 2 nm or less, and still more preferably, 1 nm or more and 2 nm or less. Since the thickness of the insulating layer 32 is extremely thin as 0.1 nm or more and 4 nm or less, the tunnel effect is generated in the insulating layer 32, so that a charge injecting property with respect to the organic compound layer 29 is improved. Accordingly, when the thickness of the insulating layer 32 exceeds 4 nm, the tunnel effect is not generated in the insulating layer 32, so that it is difficult to inject charges to the organic compound layer 29. This increases voltage applied to the memory element when writing data in the memory element. In addition, the thickness of the insulating layer 32 is extremely thin as 0.1 nm or more and 4 nm or less, and therefore, throughput is improved.

The insulating layer 32 is formed using a compound which is thermally and chemically stable. Typically, an inorganic compound or an organic compound to which carriers are not injected is preferable to form the insulating layer 32.

As typical examples of inorganic compounds having insulating properties, the following substances can be given: oxide having an insulating property such as $Li_2O$, $Na_2O$, $K_2O$, $Rb_2O$, BeO, MgO, CaO, SrO, BaO, $Sc_2O_3$, $ZrO_2$, $HfO_2$; $RfO_2$, TaO, TcO, $Fe_2O_3$, CoO, PdO, $Ag_2O$, $Al_2O_3$, $Ga_2O_3$, and $Bi_2O_3$; fluoride having an insulating property such as LiF, NaF, KF, RbF, $BeF_2$, $MgF_2$, $CaF_2$, $SrF_2$, $BaF_2$, $AlF_3$, $NF_3$, $SF_6$, AgF, and $MnF_3$; chloride having an insulating property such as LiCl, NaCl, KCl, CsCl, $BeCl_2$, $CaCl_2$, $BaCl_2$, $AlCl_3$, $SiCl_4$, $GeCl_4$, $SnCl_4$, AgCl, $ZnCl_2$, $TiCl_4$, $TiCl_3$, $ZlCl_4$, $FeCl_3$, $PdCl_2$, $SbCl_3$, $SbCl_2$, $SrCl_2$, TlCl, CuCl, $MnCl_2$, and $RuCl_2$; bromide having an insulating property such as KBr, CsBr, AgBr, $BaBr_2$, $SiBr_4$, and LiBr; iodide having an insulating property such as NaI, KI, $BaI_2$, TlI, AgI, $TiI_4$, $CaI_2$, $SiI_4$, and CsI; carbonate having an insulating property such as $Li_2CO_3$, $K_2CO_3$, $Na_2CO_3$, $MgCO_3$, $CaCO_3$, $SrCO_3$, $BaCO_3$, $MnCO_3$, $FeCO_3$, $CoCO_3$, $NiCO_3$, $CuCO_3$, $Ag_2CO_3$, and $ZnCO_3$; sulfate having an insulating property such as $Li_2SO_4$, $K_2SO_4$, $Na_2SO_4$, $MgSO_4$, $CaSO_4$, $SrSO_4$, $BaSO_4$, $Ti_2(SO_4)_3$, $Zr(SO_4)_2$, $MnSO_4$, $FeSO_4$, $Fe_2(SO_4)_3$, $CoSO_4$, $Co_2(SO_4)_3$, $NiSO_4$, $CuSO_4$, $Ag_2SO_4$, $ZnSO_4$, $Al_2(SO_4)_3$, $In_2(SO_4)_3$, $SnSO_4$, $Sn(SO_4)_2$, $Sb_2(SO_4)_3$, and $Bi_2(SO_4)_3$; nitrate having an insulating property such as $LiNO_3$, $KNO_3$, $NaNO_3$, $Mg(NO_3)_2$, $Ca(NO_3)_2$, $Sr(NO_3)_2$, $Ba(NO_3)_2$, $Ti(NO_3)_4$, $Sr(NO_3)_2$, $Ba(NO_3)_2$, $Ti(NO_3)_4$, $Zr(NO_3)_4$, $Mn(NO_3)_2$, $Fe(NO_3)_2$, $Fe(NO_3)_3$, $Co(NO_3)_2$, $Ni(NO_3)_2$, $Cu(NO_3)_2$, $AgNO_3$, $Zn(NO_3)_2$, $Al(NO_3)_3$, $In(NO_3)_3$, and $Sn(NO_3)_2$; nitride having an insulating property such as AlN and SiN.

In the case where the insulating layer 32 is formed using an inorganic compound, the thickness of the insulating layer is preferably 0.1 nm or more and 3 nm or less, and more preferably, 1 nm or more and 2 nm or less. When the thickness of the insulating layer 32 is more than 3 nm, the voltage applied to the memory element is increased in writing data in the memory element.

In the case where the insulating layer 32 is formed using an organic compound having an insulating property, as the organic compound having the insulating property, it is preferable to use an organic compound which is difficult to be injected with carriers and has a band gap of 3.5 to 6 eV, and more preferably, 4 eV or more and 5 eV or less. As typical examples of organic compounds having insulating properties, a high molecular material such as polyimide, acrylic, polyimide, benzocyclobutene, and polyester; an organic resin such as a novolac resin, a melamine resin, a phenol resin, an epoxy resin, a silicon resin, a furan resin, and a diallyl phthalate resin; can be given.

Further, the insulating layer 32 is preferably formed using an organic compound having a HOMO level which is different from a HOMO level of an organic compound used for forming the organic compound layer. Furthermore, when the insulating layer 32 is formed using an organic compound, the thickness of the insulating layer is preferably 0.1 nm or more and 4 nm or less, and more preferably, 1 nm or more and 4 nm or less.

The insulating layer 32 may also be formed using a plurality of inorganic compounds having insulating properties. Alternatively, the insulating layer 32 may be formed using a plurality of the above mentioned organic compounds. Furthermore, the insulating layer 32 may be formed using a mixture of a plurality of inorganic compounds and a plurality of organic compounds.

The insulating layer 32 can be formed by evaporation, electron beam evaporation, sputtering, CVD, or the like. Further, the insulating layer can also be formed by spin coating, a sol-gel method, printing, a droplet discharging method, or the like.

Figure 3A:
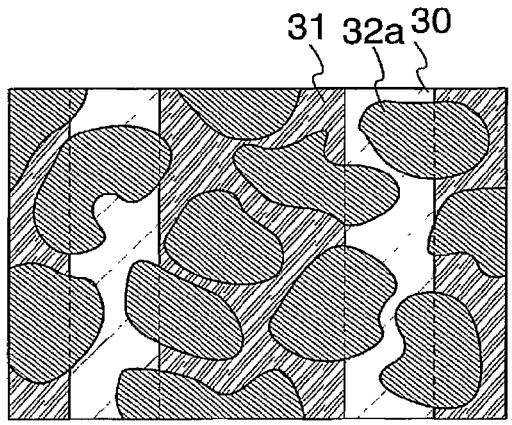
FIGS. 3A to 3C are top views explaining memory devices of the present invention.
Figure 3B:
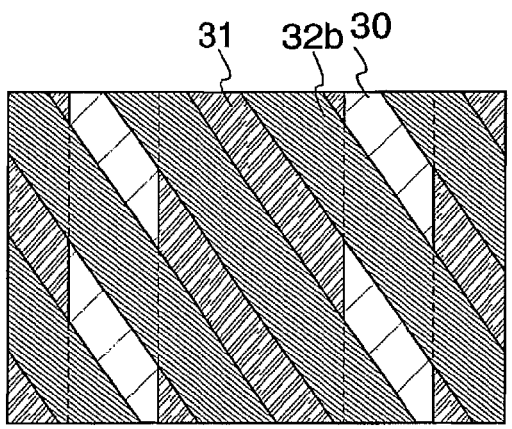
Figure 3C:
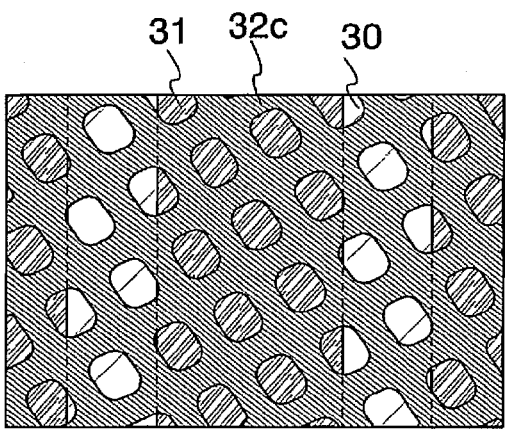

Here, shapes of the insulating layer 32 will be described with reference to FIGS. 3A to 3C. Each of FIGS. 3A to 3C is a top view showing the first conductive layer 31 and insulating layers formed over the substrate 30 having the insulating property. Here, as the insulating layer 32 mentioned above, insulating layers 32a, insulating layers 32b, and insulating layers 32c are shown in FIGS. 3A to 3C.

As shown in FIG. 3A, the insulating layers 32a are discontinuous layers dispersed over the first conductive layer. Specifically, the insulating layers 32a have island-like shapes which partly cover the first conductive layer 31. In this case, the insulating layers 32a, which are the plurality of discontinuous layers, are randomly dispersed over the first conductive layer 31 and the surface of the substrate 30 having the insulating property.

As shown in FIG. 3B, the insulating layers 32b are striped discontinuous layers. In this case, the insulating layers 32b have striped shapes extending in a second direction having predetermined degrees (more than 0 degree and less than 90 degrees) with respect to a first direction to which the first conductive layer 31 extends. Further, the insulating layers 32b having the striped shapes may extend in parallel with the first direction. Furthermore, the insulating layers 32b may extend in a direction orthogonal to the first direction.

As shown in FIG. 3C, the insulating layers 32c can be reticulated discontinuous layers.

Figure 1C:
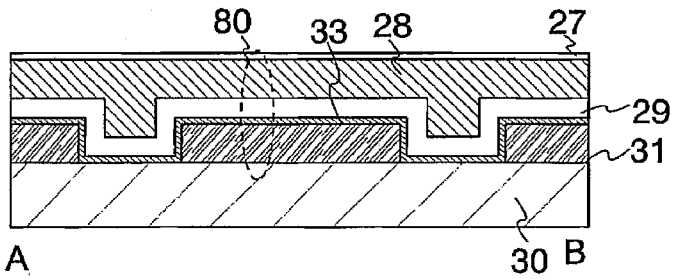
Figure 1D:
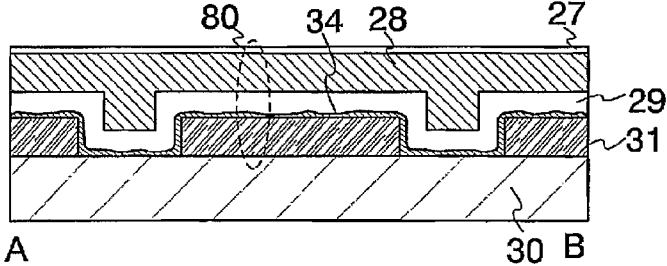

Further, as shown in FIG. 1C, an insulating layer 33, which is a continuous layer covering the surface of the first conductive layer 31, may be provided as a substitute for the insulating layers 32a, 32b, and 32c. In this case, the insulating layer 33 is preferably a unimolecular film. Furthermore, as shown in FIG. 1D, an insulating layer 34, which is a continuous layer having concavity and convexity and covering the surface of the first conductive layer 31, may be used as a substitute for the insulating layers 32a, 32b, and 32c. Note that, in this case, the thickness of the convexity of the insulating layer 34 is preferably 1 nm or more and 4 nm or less, and more preferably, 2 nm or more and 4 nm or less, whereas the thickness of the concavity of the insulating layer 34 is preferably 0.1 nm or more and 2 nm or less, and more preferably, 1 nm or more and 2 nm or less.

Figure 1E:
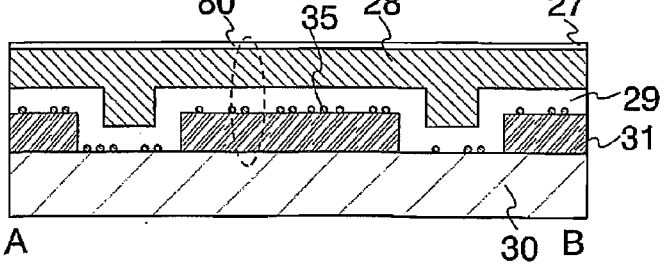

Moreover, as shown in FIG. 1E, insulating particles 35 may be provided between the first conductive layer and the organic compound layer as a substitute for the insulating layers 32a, 32b, and 32c. In this case, the diameter of each of the insulating particles is 0.1 nm or more and 4 nm or less.

Figure 2A:
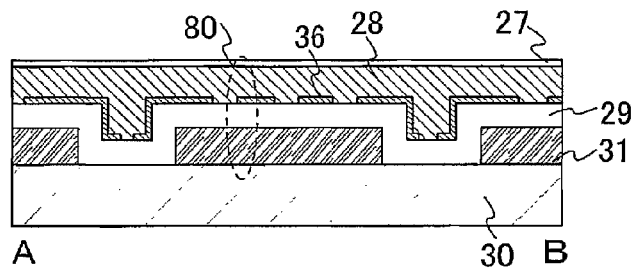
FIGS. 2A to 2E are cross sectional views explaining memory devices of the present invention.

In addition, the insulating layers 32 to 34 or the insulating particles 35 shown in FIGS. 1B to 1E may be provided between the organic compound layer 29 and the second conductive layer 28 (see FIG. 2A). In FIG. 2A, insulating layers 36 having the shapes as shown in FIG. 1B are provided between the organic compound layer 29 and the second conductive layer 28.

Figure 2B:
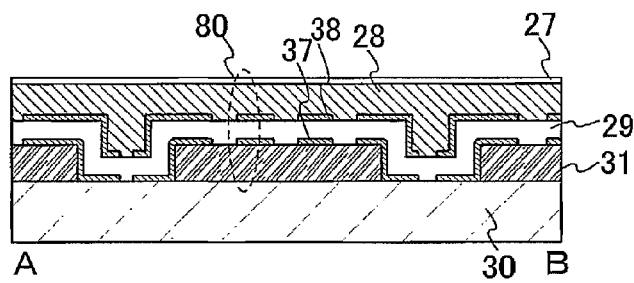

As shown in FIG. 2B, first insulating layers 37 may be provided between the first conductive layers 31 and the organic compound layer 29 and second insulating layers 38 may be provided between the organic compound layer 29 and the second conductive layer 28. In this case, as the first insulating layers 37 and the second insulating layers 38, the insulating layers 32 to 34 and the insulating particles 35 having the shapes as shown in FIGS. 1B to 1E can arbitrarily be employed. Here, both of the first insulating layers 37 and the second insulating layers 38 have the same shapes as the insulating layers 32 of FIG. 1B.

Figure 2C:
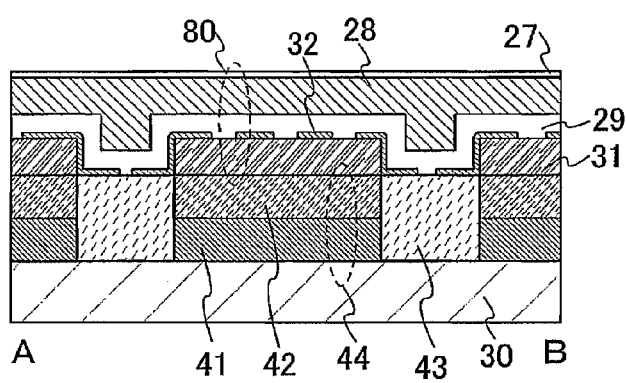

In the above memory element, an element having a rectifying property may be provided at the opposite side of the organic compound layer 29 through the first conductive layers 31 (FIG. 2C). The element having the rectifying property is a Schottky diode, a PN junction diode, a PIN junction diode, or a transistor whose gate electrode and drain electrode are connected to each other. Here, a diode 44 including third conductive layers 41 and semiconductor layers 42 is provided to be in contact with the first conductive layers 31. Note that an element having a rectifying property may be provided at the opposite side of the organic compound layer through the second conductive layer. An element having a rectifying property may be provided between the organic compound layer 29 and the first conductive layers 31. Also, an element having a rectifying property may be provided between the organic compound layer 29 and the second conductive layer 28. As typical examples of diodes, a PN junction diode, a PIN junction diode, an avalanche diode, and the like can be given. Alternatively, a diode having other structure may be used. By providing an element having a rectifying property in such a manner, current only flows in one direction, and therefore, readout errors are reduced and a readout margin is improved. Reference numeral 43 is an insulating layer for insulating the diode.

Further, a thin film transistor (TFT) may be provided over a substrate having an insulating property and a memory element 80 may be provided thereover. As a substitute for the substrate having the insulating property, a field-effect transistor (1'ET) may be formed over a semiconductor substrate such as an Si substrate or an SOI substrate, and the memory element 80 may be provided thereover. Note that the examples in each of which the memory element is formed over the thin film transistor or the field effect transistor are shown here; however, the memory element may be attached to the thin film transistor or the field-effect transistor. In this case, the memory element and the thin film transistor or the field-effect transistor are manufactured through different processes from each other, and then the memory element and the thin film transistor or the field-effect transistor are attached to each other by using a conductive film, an anisotropic conductive adhesive agent, or the like. Furthermore, any known structure may be used for the thin film transistor or the field-effect transistor.

When there is a concern that an adverse effect of an electric field is caused between the adjacent memory elements, partition walls (insulating layers) may be provided between the organic compound layers provided in each of memory elements so as to isolate the organic compound layers provided in each of the memory elements from one another. Alternatively, the organic compound layer may be selectively provided in each memory cell.

Figure 2D:
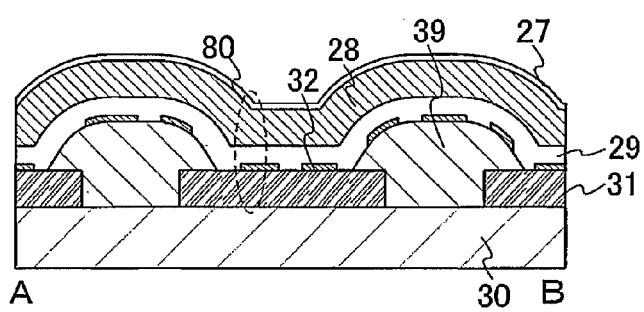

Typically, when an organic compound layer 29 is provided to cover the first conductive layers 31, partition walls (insulating layers) 39 may be provided so as to prevent a disconnection of the organic compound layer 29 caused by steps of the first conductive layers 31 or an adverse effect of an electric field in the horizontal direction between adjacent memory cells (FIG. 2D). Note that in cross sections of the partition walls (insulating layers) 39, a side surface of each of the partition walls (insulating layers) 39 preferably has an angle of gradient of 10 degrees or more and less than 60 degrees, and more preferably, 25 degrees or more and 45 degrees or less with respect to the surfaces of the first conductive layers 31. Furthermore, the partition walls (insulating layers) 39 preferably have a curved shape. Thereafter, the insulating layers 32, the organic compound layer 29, and the second conductive layer 28 are provided so as to cover the first conductive layers 31 and the partition walls (insulating layers) 39.

Further, after forming the insulating layers 32 over the first conductive layers 31, the partition walls (insulating layers) 39 may be formed. In this case, in processes of forming the partition walls (insulating layers) 39 using an etching process, the insulating layers 32 are preferably formed without using the etching process whereas the partition walls (insulating layers) 39 are preferably formed using a compound, which is selectively etched, as a material for the partition walls (insulating layers) 39.

Furthermore, in the case of forming the partition walls (insulating layers) 39, residues generated in a process of forming the partition walls (insulating layers) 39 may be used to form the insulating layers 32.

Figure 2E:
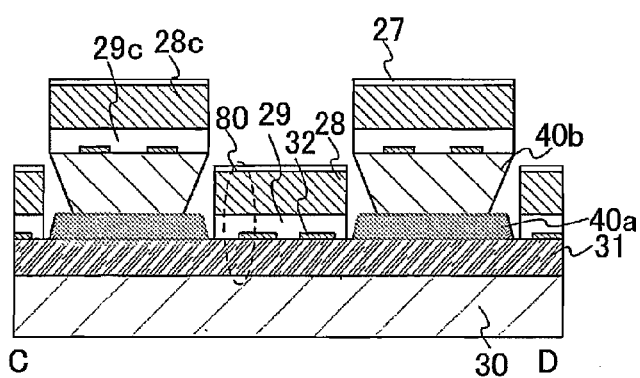

In place of the partition walls (insulating layers) 39, an interlayer insulating layer 40a partly covering the first conductive layer 31 extending in the first direction may be provided over the substrate 30, and partition walls (insulating layers) 40b may be provided over the interlayer insulating layers (FIG. 2E).

The interlayer insulating layers 40a partly covering the first conductive layer 31 have openings for each memory cell 80. The partition walls (insulating layers) 40b are provided in regions where the openings are not provided. The partition walls (insulating layers) 40b extend in the second direction as well as the second conductive layers 28. Further, a cross section of each of the partition walls (insulating layers) 40b has an angle of gradient of 95 degrees or more and 135 degrees or less with respect to a surface of each of the interlayer insulating layers 40a.

The partition walls (insulating layers) 40b are formed by photolithography, wherein a positive photosensitive resin in which a non exposure portion remains, is used, and light exposure or developing time is controlled such that a lower portion of a pattern is more etched. The height of the partition walls (insulating layers) 40b is set larger than the thickness of the organic compound layer 29 and the second conductive layers 28. As a result, the striped organic compound layers 29 and the striped second conductive layers 28, which are electrically isolated from one another in plural regions and extend in a direction intersect with the first direction of the first conductive layers 31, can be formed only by a process of evaporating the organic compound layers 29 and the second conductive layers 28 over an entire surface of the substrate 30. Therefore, the number of processes can be reduced. Note that organic compound layers 29c and conductive layers 28c are also provided over the partition walls (insulating layers) 40b; however, they are not connected to the organic compound layers 29 and the conductive layers 28.

Figure 4A:
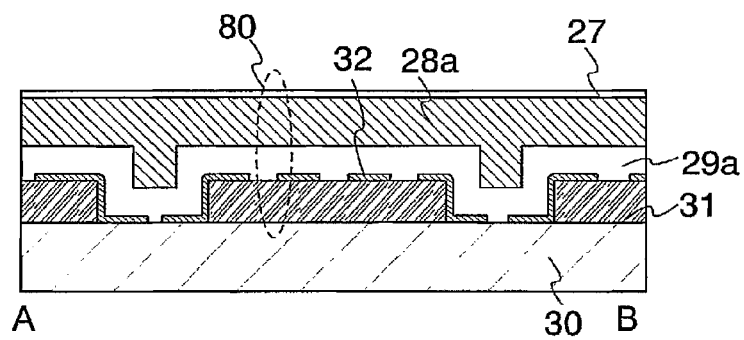
FIGS. 4A and 4B are cross sectional views explaining memory devices of the present invention.
Figure 4B:
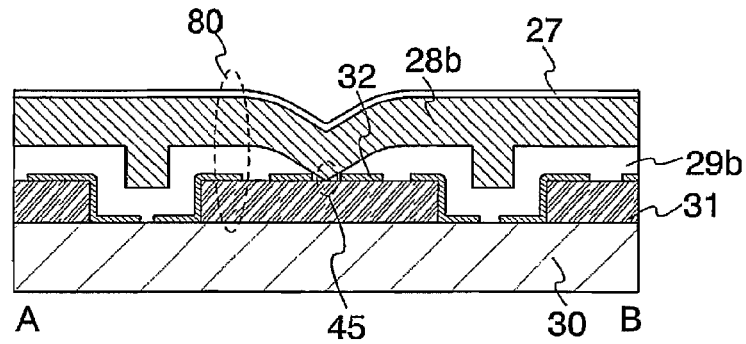

When data is written in the memory element by being applied with voltage, one memory cell 21 is selected by a row decoder 24a, a column decoder 26a, and a selector 26c, and then, data is written in the memory cell 21 by using a write circuit (see FIG. 5A). When voltage is applied between the first conductive layer 31 and the second conductive layer 28 of the memory cell 21, charges are generated between the first conductive layer 31 and the second conductive layer 28a (see FIG. 4A). When voltage more than the predetermined voltage is applied between the first conductive layer 31 and the second conductive layer 28a, charges are injected in the organic compound layer 29a, and current flows through the organic compound layer 29a, thereby generating Joule heat in the organic compound layer 29a. With the generation of the Joule heat, a temperature of the organic compound layer 29a is increased to exceed a glass transition point, and fluidity of the organic compound layer 29a is increased, thereby causing unevenness in thickness of the organic compound layer. As a consequence, a shape of the organic compound layer 29a and a shape of the second conductive layer 28a are changed. The first conductive layer 31 is short circuited with a second conductive layer 28b, and therefore, electric resistance of the memory element is varied (see FIG. 4B). Note that in FIG. 4B, reference numeral 29b indicates the organic compound layer whose shape is changed. When data is written in the memory cell, forward voltage is applied to the memory cell. Alternatively, reverse voltage may be applied thereto.

As compared to other memory element, electric resistance of the short-circuited memory element is largely lowered. By applying voltage to the memory cell, data is written in the memory cell while utilizing a change in electric resistance between two conductive layers.

A specific operation in writing data in an organic memory will be described below (see FIG. 5).

When data "1" is written in one memory cell 21, the memory cell 21 is selected by the row decoder 24a, the level shifter 24b, the column decoder 26a, and the selector 26c. Specifically, predetermined voltage V2 is applied to a word line W3 connected to the memory cell 21 by the row decoder 24a and the level shifter 24b. Further, a bit line B3 connected to the memory cell 21 is connected to a readout/write circuit 26b by the column decoder 26a and the selector 26c. Then, writing voltage V1 is input in the bit line B3 from the readout/write circuit 26b. Thus, voltage Vw=V1−V2 is applied between the first conductive layer and the second conductive layer included in the memory cell 21. By property selecting the voltage Vw, the organic compound layer 29 provided between the first and second conductive layers is physically or electrically changed so that the data "1" is written in the memory cell 21. Specifically, as for readout operation voltage, electric resistance between the first and second conductive layers in the case where the memory cell 21 is in the state of the data "1" may be largely lowered than electric resistance therebetween in the case where the memory cell 21 is in the state of data "0". For example, the voltage (V1, V2) may be arbitrarily selected from a range of (0 V, 5 to 15 V) or a range of (3 to 5 V, −12 to −2 V). The voltage Vw may be set to be 5 to 15 V, or −5 to −15 V.

Further, non-selected word lines and non-selected bit lines are controlled such that the data "1" is not written in the memory cells connected to the non selected word lines and the non-selected bit lines. For example, the non-selected word lines and the non-selected bit lines may be made in a floating state. A portion between the first and second conductive layers included in one memory cell must have a characteristic by which selectivity can be secured, such as a diode characteristic.

On the other hand, when data "0" is written in the memory cell 21, an electric action may not be applied to the memory cell 21. As for a circuit operation, for example, one memory cell 21 is selected by the row decoder 24a, the level shifter 24b, the column decoder 26a, and the selector 26c as well as the case of writing data "1"; however, an amount of potential output to the bit line B3 from the readout/write circuit 26b may be set be the same as potential of the selected word line W3 or potential of the non-selected word lines, and voltage (for example, −5 to 5 V), by which an electric characteristic of the memory cell 21 is not changed, may be applied between the first and second conductive layers included in the memory cell 21.

Figure 5B:
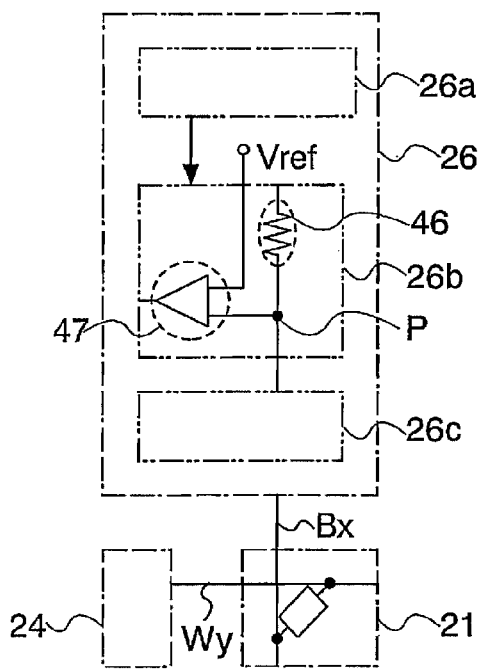
Figure 5C:
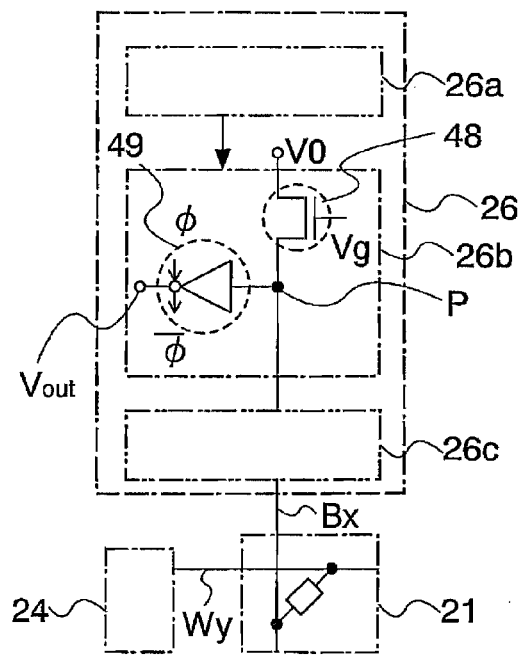

Subsequently, a concrete operation in the case of reading out data from an organic memory will be described (FIG. 5B). Reading out data is performed by utilizing a difference in electric characteristics between the first and second conductive layers included in a memory cell having the data "0" and a memory cell having the data "1". For example, a method for reading out data by utilizing a difference in electric resistance in a case where effective electric resistance between the first and second conductive layers included in the memory cell having the data "0" (hereinafter, simply referred to as electric resistance of the memory cell) is R0 at a reading voltage and electric resistance of the memory cell having data "1" is R1 at a reading voltage, will be described. Note that R1<<R0. As a structure of a readout portion of the readout/write circuit, for example, a readout/write circuit 26b including a resistance element 46 and a differential amplifier 47 as shown in FIG. 5B can be thought. The resistance element 46 has resistance value Rr, wherein R1<Rr<R0. A transistor 48 may be used as a substitute for the resistance element 46, or a clocked inverter 49 may be used as a substitute for the differential amplifier 47 (FIG. 5C). A signal φ or an inversion signal φ, which becomes Hi in a case of reading out data and Lo in a case of reading out no data, is input in the clocked inverter 49. Of course, the circuit structures are not limited to FIGS. 5B and 5C.

When data is read out from one memory cell 21, the memory cell 21 is selected by the row decoder 24a, the level shifter 24b, the column decoder 26a, and the selector 26c. Specifically, predetermined voltage Vy is applied to a word line Wy connected to the memory cell 21 by the row decoder 24a and the level shifter 24b. Further, a bit line Bx connected to the memory cell 21 is connected to a terminal P of the readout/write circuit 26b by the column decoder 26a and the selector 26c. As a result, potential Vp of the terminal P becomes a value determined by resistance division generated by the resistance element 46 (resistance value Rr) and the memory cell 21 (resistance value R0 or R1). Accordingly, when the memory cell 21 has the data "0", Vp0=Vy+(V0−Vy)×R0/(R0+Rr). Further, when the memory cell 21 has the data "1", Vp1=Vy+(V0−Vy)×R1/(R1+Rr). As a result, by selecting Vref to be between Vp0 and Vp1 in FIG. 5B and by selecting a variation point of the clocked inverter between Vp0 and Vp1 in FIG. 5C, Lo/Hi (or Hi/Lo) is output as output voltage Vout in accordance with the data "0" and data "1", reading out can be carried out.

For example, the differential amplifier is operated in a case where Vdd is 3 V, and Vy is set to be 0 V; V0, 3 V; and Vref, 1.5 V. If R0/Rr=Rr/R1=9, when the memory cell has the data "0", Vp0 becomes 2.7 V and Hi is output as Vout. When the memory cell has the data "1", Vp1 becomes 0.3 V and Lo is output as Vout. Thus, data can be read out from the memory cell.

According to the above described method, as a condition of electric resistance of the organic compound layer 29 is read out by a voltage value by utilizing a difference in resistance values and resistance division. Of course, the readout method is not limited thereto. For example, the condition of electric resistance of the organic compound layer may be read out by utilizing a difference in current value instead of utilizing a different in electric resistance. Further, when an electronic characteristic of a memory cell has a diode property in which threshold voltage is differed between the data "0" and the data "1", the condition of electric resistance of the organic compound layer may be read out by utilizing a difference in threshold voltage. Furthermore, a method by which resistance of a memory element is replaced by an amount of current to be read out, or a method by which a bit line is pre-charged can be employed.

According to the present invention, by providing an insulating layer with a thickness of 4 nm or less, and preferably, 2 nm or less, between a conductive layer and an organic compound layer, charges are injected in the organic compound layer by a tunnel effect. According to the tunnel effect of the insulating layer, variations in amount of current and voltage applied to a memory element in writing data in the memory element can be reduced. Further, by providing the insulating layer with the thickness of 4 nm or less, and preferably, 2 nm or less, between the conductive layer and the organic compound layer, even when the thickness of the organic compound layer of the memory element is thin, short-circuiting between electrodes can be reduced. Moreover, since a charge injecting property is improved, a thickness of an organic compound layer interposed between a pair of conductive layers can be increased, making it possible to prevent short-circuiting between the conductive layers before writing data in a memory element, which is caused due to roughness of a surface of a first conductive layer, and improve reliability of a memory element. Consequently, reliability of a memory device and a semiconductor device can be improved.

(Embodiment Mode 2)

In this embodiment mode, a memory device having a different structure from those of Embodiment Mode 1, will be described. Specifically, the memory device has an active matrix type structure.

Figure 6A:
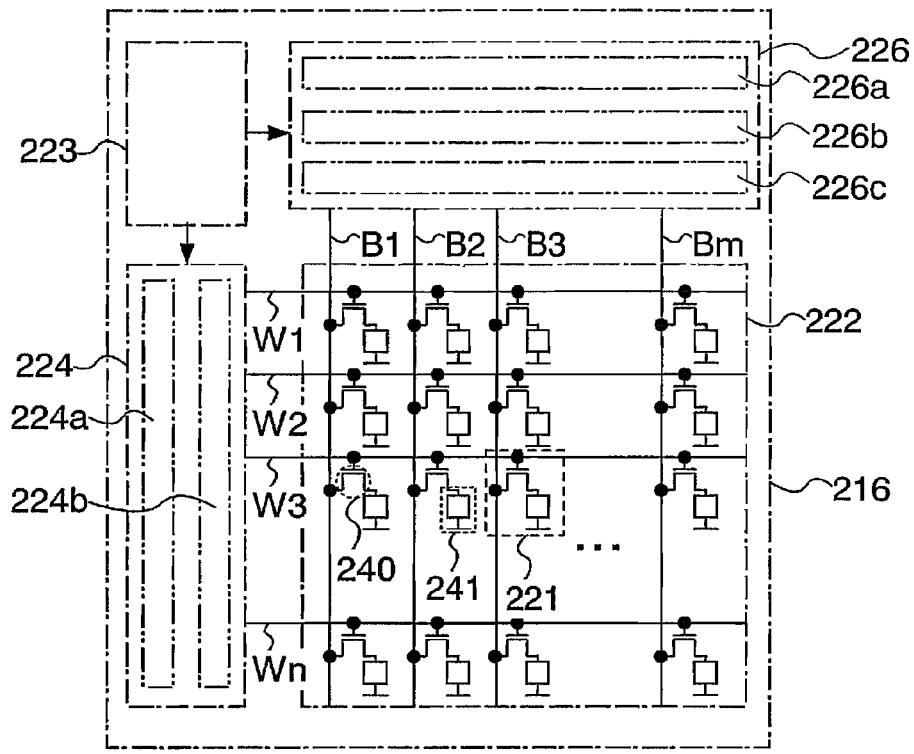
FIGS. 6A and 6B are diagrams explaining memory devices of the present invention.

FIG. 6A shows a structural example of an organic memory shown in this embodiment mode. The organic memory includes a memory cell array 222 in which memory cells 221 are arranged in a matrix form, a bit line driver circuit 226 having a column decoder 226a, a readout circuit 226b, and a selector 226c, a word line driver circuit 224 having a row decoder 224a and a level shifter 224b, and an interface 223 having a write circuit and the like and communicating with an external portion. Note that the structure of the memory circuit 216 shown in FIG. 6A is just one example; and therefore, the memory circuit may further include other circuit such as a sense amplifier, an output circuit, and a buffer, or, a write circuit may be provided in the bit line driver circuit.

Each of the memory cells 221 has a first wiring constituting a bit line Bm ($1 \leq m \leq x$), a second wiring constituting a word line Wn ($1 \leq n \leq y$), a transistor 240, and a memory element 241. The memory element 241 has a structure in which an insulating layer and an organic compound layer are interposed between a pair of conductive layers.

Figure 7A:
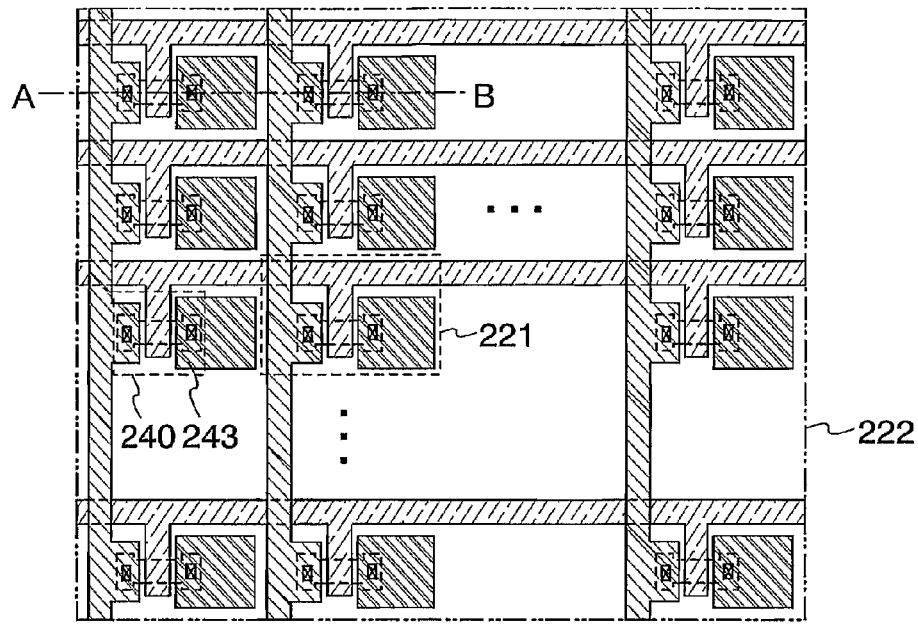
FIG. 7A is a top view and FIGS. 7B and 7C are cross sectional views explaining memory devices of the present invention.

Next, examples of a top view and cross sectional views of the memory cell array 222 having the above mentioned structure will be described with reference to FIGS. 7A to 7C. FIG.

7A is a top view of the memory cell array 222. FIG. 7B is a cross sectional view along a line A-B of FIG. 7A. In FIG. 7A, partition walls (insulating layers) 249, insulating layers 242, an organic compound layer 244, and a second conductive layer 245, which are formed over first conductive layers 243, are omitted.

In the memory cell array 222, a plurality of memory cells 221 are provided in a matrix form. Each of the memory cells 221 has a transistor 240 serving as a switching element and a memory element 241 connected to the transistor 240 over a substrate 230 having an insulated surface (see FIGS. 7A and 7B). The memory element 241 has first conductive layers 243 formed over an insulating layer 248, partition walls (insulating layers) 249 covering a part of the first conductive layers 243, insulating layers 242 with a thickness of 0.1 nm or more and 4 nm or less, and preferably, 1 nm or more and 4 nm or less, formed over the first conductive layers 243, an organic compound layer 244 covering the first conductive layers 243, the partition walls (insulating layers) 249, and the insulating layers 242, and a second conductive layer 245. As for the insulating layers 242, any of the forms of the insulating layers 32 to 38 shown in Embodiment Mode 1 can be employed. Here, a memory element 241 including the insulating layers 242 having the same form as the insulating layers 32 as shown in FIG. 2D is shown. As the transistor 240, a thin film transistor is used. The memory cell array 222 further includes an insulating layer 246 serving as a protection film so as to cover the second conductive layer 245.

The insulating layers 242 are formed over the partition walls (insulating layers) 249 and the first conductive layer 243; however, residues remaining over the first conductive layer 243, which are generated in forming the partition walls (insulating layers) 249, may be used as the insulating layers 242. Specifically, an insulating layer is formed over the insulating layer 248 and the first conductive layers 243 and the insulating layer is etched to form the partition walls (insulating layers) 249. In this process, etching residues remain over the first conductive layers 243. This residues may be used as the insulating layers 242. In this case, the partition walls (insulating layers) 249 and the insulating layers 242 are formed by using the same compound. Further, the insulating layers 242 are only provided over the first conductive layer 243, and are not provided over the partition walls (insulating layers) 249. In the memory device having such a structure, a process for forming the insulating layers 242 can be eliminated, making it possible to improve throughput.

Figure 16A:
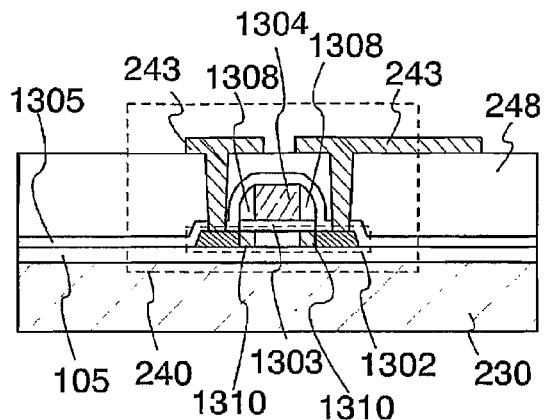
FIGS. 16A to 16D are cross sectional views explaining memory devices of the present invention.

One modes of a thin film transistor, which can be used for the transistor 240, will be described with reference to FIGS. 16A to 16D. FIG. 16A shows an example of a top gate type thin film transistor. An insulating layer 105 is provided over a substrate 230 having an insulated surface, and a thin film transistor is provided over the insulating layer 105. The thin film transistor includes a semiconductor layer 1302 provided over the insulating layer 105, and an insulating layer 1303 serving as a gate insulating layer. Over the insulating layer 1303, a gate electrode 1304 is provided corresponding to the semiconductor film 1302. Over the gate electrode 1304, an insulating layer 1305 serving as a protection layer and an insulating layer 248 serving as an interlayer insulating layer are provided. First conductive layers 243 connected to a source region and a drain region of the semiconductor layer are formed. In addition, an insulating layer serving as a protection layer may be provided over the first conductive layers 243.

The semiconductor layer 1302 is formed by a semiconductor having a crystalline structure, and can be formed using an amorphous semiconductor or a single crystalline semiconductor. In particular, a crystalline semiconductor formed by crystallizing an amorphous or microcrystalline semiconductor by laser irradiation, a crystalline semiconductor formed by crystallizing an amorphous or microcrystalline semiconductor by heat treatment, a crystalline semiconductor formed by crystallizing an amorphous or microcrystalline semiconductor by heat treatment and laser irradiation, or the like is preferable. In the heat treatment, a crystallization method using a metal element such as nickel, which has a function of promoting crystallization of a silicon semiconductor, can be employed.

In the case of the crystallization with laser irradiation, it is possible to conduct crystallization in such a way that a portion in a crystalline semiconductor that is melted by irradiation with laser light is continuously moved in a direction where the laser light is delivered, wherein the laser light is continuous wave laser light or ultrashort pulsed laser light having a high repetition rate of 10 MHz or more and a pulse width of 1 nanosecond or less, preferably 1 to 100 picoseconds. By using such a crystallization method, a crystalline semiconductor having a large grain diameter with a crystal grain boundary extending in one direction can be obtained. By making a drift direction of carriers conform to the direction where the crystal grain boundary extends, the electric field effect mobility in the transistor can be increased. For example, 400 $cm^2$/V·sec or more can be achieved.

In the case of applying the above crystallization step to a crystallization process where the temperature is not more than the upper temperature limit of a glass substrate (approximately 600° C.), a large glass substrate can be used. Therefore, a large number of semiconductor devices can be manufactured with one substrate, and cost can be decreased.

The semiconductor layer 1302 may be formed by conducting a crystallization step through heating at the temperature higher than the upper temperature limit of a glass substrate. Typically, a quartz substrate is used as the insulating substrate and an amorphous or microcrystalline semiconductor is heated at 700° C. or more to form the semiconductor layer 1302. As a result, a semiconductor with superior crystallinity can be formed. Therefore, a thin film transistor which is superior in response speed, mobility, and the like and which is capable of high-speed operation can be provided.

As the insulating layer 1303, a single layer or a laminated layer of an insulating film of silicon nitride, silicon oxide, and other material containing silicon is formed by using a thin film forming method such as plasma CVD and sputtering. The insulating layer 1303 can also be formed using a solution having an insulating property by a droplet discharging method, a coating method, a sol-gel method, or the like. As typical examples of the solution having an insulating property, a solution in which an inorganic oxide fine particle is dispersed; $SiO_2$ having Si—$CH_2$ bonds typified by polyimide, polyamide, polyester, acrylic, PSG (phosphorus glass), BPSG (boron phosphorus glass), silicate-based SOG (spin on glass), alkoxy silicate-based SOG, polysilazane-based SOG, and polymethyl siloxane; or the like can be arbitrarily used.

The gate electrode 1304 can be formed using metal or a polycrystalline semiconductor added with an impurity having one conductivity type. When the gate electrode 1304 is formed using metal, tungsten (W), molybdenum (Mo), titanium (Ti), tantalum (Ta), aluminum (Al), or the like can be used. In addition, metal nitride formed by nitriding the above mentioned metal, can be used. Further, the gate electrode 1304 may include a first layer made from the metal nitride and a second layer made from the metal. In the case where the gate electrode 1304 has a laminated structure, an edge of the first layer may protrude from an edge of the second layer. In this case, when the first layer is formed using metal nitride, the first layer can serve as barrier metal. Therefore, such the first layer can prevent metal contained in the second layer from dispersing in the insulating layer 1303 and the underlying semiconductor layer 1302.

Sidewalls (sidewall spacers) 1308 are provided at the both sides of the gate electrode 1304. The sidewalls can be formed by forming an insulating layer over a substrate using silicon oxide by CVD, and by being subjected to an anisotropic etching by an RIE (reactive ion etching) method.

The thin film transistor including the semiconductor layer 1302, the insulating layer 1303, the gate electrode 1304, and the like can employs various kinds of structures such as a single drain structure, an LDD (lightly doped drain) structure, and a gate overlapping drain structure. A thin film transistor having an LDD structure in which low concentration impurity regions 1310 are formed in the semiconductor layer overlapped with the sidewalls, is shown here. In addition, a single gate structure, a multi-gate structure, in which thin film transistors, to which gate voltage having the same potential in term of equivalence, are connected in series, a dual-gate structure in which a semiconductor layer is interposed between gate electrodes, or the like can be applied.

The insulating layer 248 is formed by using an inorganic insulating material such as silicon oxide and silicon oxynitride, or an organic insulating material such as an acrylic resin and a polyimide resin. When a coating method such as spin coating and roll coater is used, after applying a liquid material for an insulating film, the liquid material is subjected to heat treatment to form an insulating layer made from silicon oxide. For example, a material containing silicon bonds is applied, and is subjected to heat treatment at 200 to 400° C. so as to obtain an insulating layer containing silicon oxide. When an insulating layer formed by a coating method or an insulating layer which is planarized by reflow is formed as the insulating layer 248, disconnection of a wiring provided over the insulating layer can be prevented. Further, such a method can be effectively used in a case of forming a multilayer wiring.

The first conductive layers 243 formed over the insulating layer 248 can be provided to be intersected with a wiring formed in the same layer as the gate electrode 1304. A multilayer wiring structure is formed. By laminating a plurality of insulating layers having the same function as the insulating layer 248 and forming a wiring thereover, a multilayer structure can be formed. The first conductive layer 243 is preferably formed using a laminated structure of titanium (Ti) and aluminum (Al), a laminated structure of molybdenum (Mo) and aluminum (Al), a combination of a low resistance material such as aluminum (Al) and bather metal using a high melting point metal material such as titanium (Ti) and molybdenum (Mo).

Figure 16B:
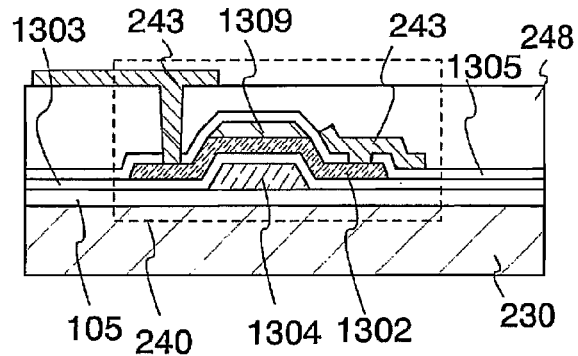

FIG. 16B shows one example of employing a bottom-gate type thin film transistor. An insulating layer 105 is formed over a substrate 230 having an insulated surface, and a thin film transistor 240 is provided thereover. The thin film transistor includes a gate electrode 1304, an insulating layer 1303 serving as a gate insulating layer, a semiconductor layer 1302, a channel protection layer 1309, an insulating layer 1305 serving as a protection layer, and an insulating layer 248 serving as an interlayer insulating layer. Further, an insulating layer serving as a protection layer may be provided thereover. The first conductive layer 243 can be formed over the insulating layer 1305 or the insulating layer 248. Note that the insulating layer 105 may not be provided in the case of the bottom-gate type thin film transistor.

In a case where the substrate 230 having the insulated surface is a flexible substrate, the substrate 230 has lower heat resistance as compared to a non-flexible substrate such as a glass substrate. Therefore, the thin film transistor is preferably formed using an organic semiconductor.

Figure 16C:
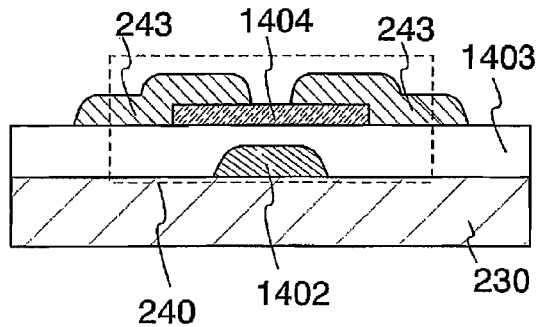

Here, a structure of a thin film transistor formed using an organic semiconductor will be described with reference to FIGS. 16C and 16D. FIG. 16C shows an example of applying a staggered organic semiconductor transistor. An organic semiconductor transistor is provided over a flexible substrate 1401. The organic semiconductor transistor includes a gate electrode 1402, an insulating layer 1403 serving as a gate insulating film, a semiconductor layer 1404 being overlapped with the gate electrode and the insulating layer 1403 serving as the gate insulating film, and first conductive layers 243 being connected to the semiconductor layer 1404. Further, the semiconductor layer 1404 is partly interposed between the insulating layer 1403 serving as the gate insulating film and the first conductive layers 243.

The gate electrode 1402 can be formed using the same material and the same method as the gate electrode 1304. Further, the gate electrode 1402 can also be formed by a droplet discharging method and by drying and baking. Furthermore, a paste containing a conductive fine particle is printed over a flexible substrate by printing and the paste is dried and baked so as to form the gate electrode 1402. As a typical example of the conductive fine particle, a fine particle mainly containing any one of gold, copper, an alloy of gold and silver, an alloy of gold and copper, an alloy of silver and copper, and an alloy of gold, silver, and copper may be used. In addition a fine particle mainly containing conductive oxide such as indium tin oxide (ITO) may be used.

The insulating layer 1403 serving as the gate insulating film can be formed using the same material through the same method as the insulating layer 1303. Note that when an insulating layer is formed by heat treatment after application of a liquid material for an insulating film, the heat treatment is performed at a lower temperature than a allowable temperature limit of the flexible substrate.

As a material for the semiconductor layer 1404 of the organic semiconductor transistor, a polycyclic aromatic compound, a conjugated double bond compound, phthalocyanine, a charge transfer complex, and the like can be given. For example, anthracene, tetracene, pentacene, 6T (hexathiophene), TCNQ (tetra-cyanoquinodimethane), PTCDA (a perylene carboxylic acid anhydrous compound), NTCDA (a naphthalenecarboxylic acid anhydrous compound), and the like can be given. Further, as a material for the semiconductor layer 1404 of the organic semiconductor transistor, a pi-conjugated system high molecule such as an organic high molecular compound, carbon nanotube, polyvinyl pyridine, a phthalocyanine metal complex, and the like can be given. In particular, a pi-conjugated system high molecule composed of a conjugated double bond such as polyacetylene, polyaniline, polypyrrole, polythienylene, a polythiophene derivative, poly(3alkylthiophene), a polyparaphenylene derivative, and a polyparaphenylenevinylene derivative, is preferably used.

As a method for forming the semiconductor layer of the organic semiconductor transistor, a method for forming a film having a uniform thickness may be used. The thickness of the semiconductor layer is preferably set to be 1 nm or more and 1,000 nm or less, and more preferably, 10 nm or more and 100 nm or less. As a specific method of the organic semiconductor transistor, an evaporation method, a coating method, a spin coating method, a overcoat method, a solution cast method, a dipping method, a screen printing method, a roll coater method, or a droplet discharging method can be used.

Figure 16D:
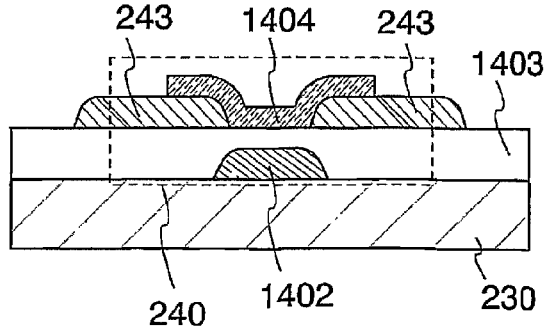

FIG. 16D shows an example of applying a coplanar type organic semiconductor transistor. An organic semiconductor transistor is provided over a flexible substrate 1401. The organic semiconductor transistor includes a gate electrode 1402, an insulating layer 1403 serving as a gate insulating film, first conductive layers 243, and a semiconductor layer 1404 being overlapped with the gate electrode and the insulating layer 1403 serving as the gate insulating layer. Further, each of the first conductive layers 243 is partly interposed between the insulating layer serving as the gate insulating layer and the semiconductor layer.

Further, the thin film transistor and the organic semiconductor transistor may be provided to have any structure so long as they can serve as switching elements.

Furthermore, a transistor may be formed using a single crystalline substrate or an SOI substrate, and a memory element may be provided thereover. The SOI substrate may be formed by using a method in which a wafer is attached, a method of forming an insulating layer in an interior portion by doping an oxygen ion in an Si substrate, which is also referred to as an SIMOX. Here, as shown in FIG. 7C, a memory element 241 is connected to a field-effect transistor 262 provided over a single crystalline semiconductor substrate 260. Further, an insulating layer 250 is provided to cover a wiring of the field-effect transistor 262, and a memory element 241 is provided over the insulating layer 250.

Since the transistor formed using such a single crystalline semiconductor has good characteristics such as high response speed and good mobility, the transistor can be operated at high speed. Further, such a transistor have slight variations in its characteristics, and therefore, a highly-reliable semiconductor device can be provided by using the transistor.

The memory element 241 includes a first conductive layer 264, insulating layers 242 with a thickness of 0.1 nm or more and 4 nm or less, preferably, 1 nm or more and 4 nm or less, which are formed over the first conductive layer 264, partition walls (insulating films) 249, an organic compound layer 244 covering the insulating layers 242, and a second conductive layer 245.

Accordingly, by forming the memory element 241 after forming the insulating layer 250, the first conductive layer 264 can be freely arranged. That is, the memory element 241 must be provided in a region outside of a wiring of the transistor 240, in the structure as shown in each of FIGS. 7A and 7B; however, by using the above structure, for example, the memory element 241 can be formed over the transistor 262, which is provided in a layer 251 having transistors. As a result, memory circuits 216 can be highly integrated. Further, the transistors and the memory circuits 216 may be partly or entirely overlapped with one another.

Figure 7B:
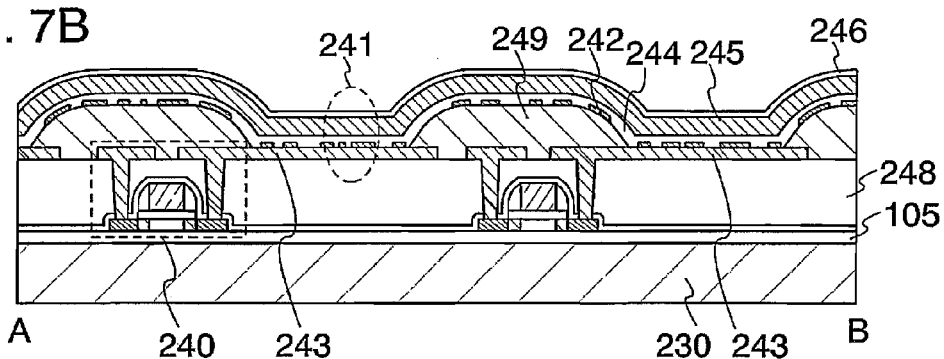
Figure 7C:
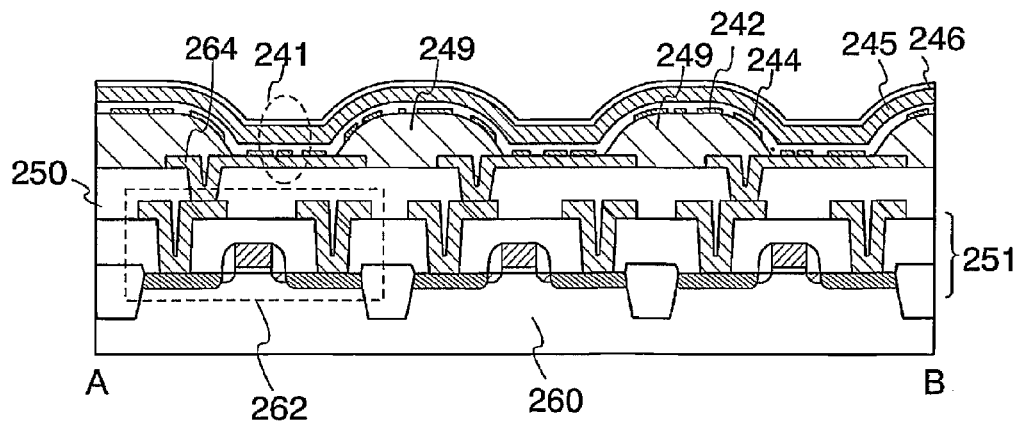

In each of FIGS. 7B and 7C, the organic compound layer 244 is provided over an entire surface of the substrate. Alternatively, organic compound layers 244 may be selectively provided only in respective memory cells. In this case, an organic compound is discharged by using a droplet discharging method or the like and baked to selectively form organic compound layers, making it possible to improve material use efficiency.

The first conductive layers 243 and 264 can be formed using the same material through the same method as those of the first conductive layer 81 and the second conductive layer 28 shown in Embodiment Mode 1.

Further, the insulating layers 242 and the organic compound layer 244 can be provided by using the same material through the same method as those of the organic compound layer 29 shown in Embodiment Mode 1.

Furthermore, an element having a rectifying property may be provided between the first conductive layers 243 or 264 and the organic compound layer 244. The element having a rectifying property is a transistor whose gate and drain electrodes are connected to each other or a diode. Further, an element having the rectifying property may be provided between the organic compound layer 244 and the second conductive layer 245.

Figure 10:
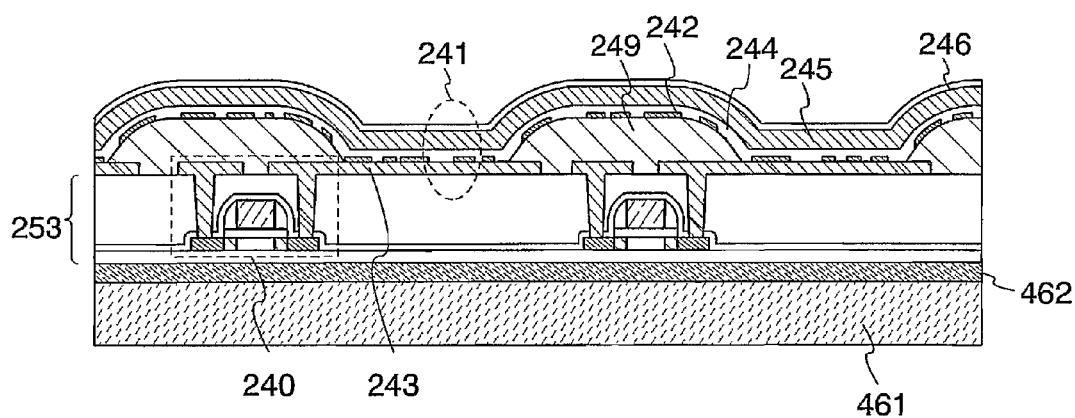
FIG. 10 is a cross sectional view explaining a semiconductor device of the present invention.

Moreover, after a separation layer is provided over the substrate 230 having the insulated surface and a layer 253 having a transistor and a memory element 241 are provided over the separation layer, the layer 253 having the transistor and the memory element 241 may be separated from the separation layer and may be attached to a substrate 461 through an adhesive layer 462 (see FIG. 10). As a separation method, the following four methods and the like can be employed: a separation method 1 where a metal oxide layer is provided as a separation layer between a substrate having high heat resistance and a layer having a transistor, and the metal oxide layer is weakened by crystallization so as to separate the layer having the transistor from the substrate; a separation method 2 where an amorphous silicon film containing hydrogen is provided as a separation layer between a substrate having high heat resistance and a layer having a transistor, and hydrogen gas contained in the amorphous silicon film is released by laser irradiation so as to separate the substrate having high heat resistance, or an amorphous silicon film is provided as a separation layer and the amorphous silicon film is removed by etching so as to separate the layer having the transistor; a separation method 3 where a substrate having high heat resistance over which a layer having a transistor is provided, is mechanically removed or removed by etching with a use of a solution; and a separation method 4 where after a metal layer and a metal oxide layer are provided as separation layers between a substrate having high heat resistance and a layer having a transistor, the metal oxide layer is weakened by crystallization, and a part of the meal layer is removed by etching with a use of a solution or halogen fluoride gas such as $NF_3$, $BrF_3$, and $ClF_3$, and then the weakened metal oxide layer is physically separated.

When a flexible substrate like the substrate 30 shown in Embodiment Mode 1, a film having a thermoplastic property, a paper made from a fibrous material, or the like is used as the substrate 461, a small, thin, and lightweight memory device can be realized.

Figure 6B:
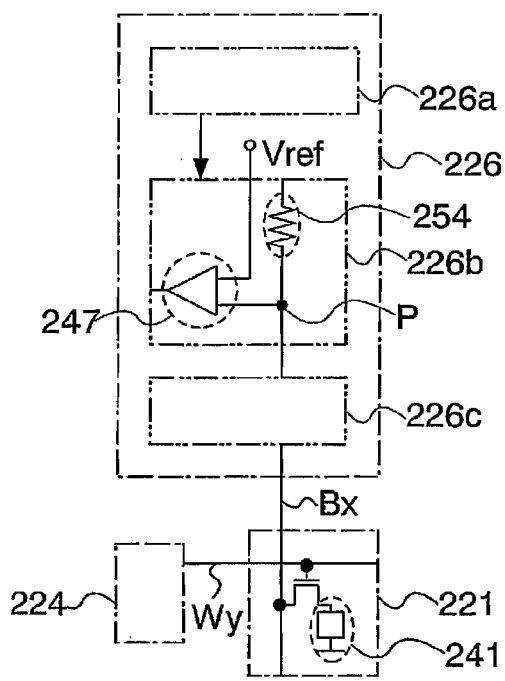

Next, an operation in writing date in the memory circuit 216 will be described (FIGS. 6A and 6B).

First, an operation of writing data in the memory circuit 216 by applying voltage, will be described. Specifically, a case of writing data in a memory cell 221 in the m-th column and the n-the row, will be described. In this case, a bit line Bm in the m-th column and a word line Wn in the n-th row are selected by a row decoder 224a, a column decoder 226a, and a selector 226c, and a transistor 240 included in the memory cell 221 in the m-th column and the n-the row is turned on. Subsequently, predetermined voltage is applied to the bit line Bm in the m-th column by a write circuit. By applying the predetermined voltage, both electrodes of the memory element 241 are short-circuited to each other. Therefore, voltage higher than usual is applied to the bit line Bm.

The voltage applied to the bit line Bm in the m-th column is applied to a first conductive layer 243, and then difference in electrical potential is caused between the first conductive layer 243 and the second conductive layer 245 (see FIG. 7B). Thus, charges are generated between the first conductive layer 243 and the insulating layers 242. When voltage more than the predetermined voltage is applied between the first conductive layer 243 and the second conductive layer 245, charges are injected in the organic compound layer. As a result, current flows through the organic compound layer 244 so that Joule heat is generated. With generation of this Joule heat, a temperature of the organic compound layer 244 is increased to exceed a glass transition point, fluidity of the organic compound layer 244 is also increased so that a thickness of the organic compound layer become uneven. Consequently, a shape of the organic compound layer 244 and a shape of the second conductive layer are changed, and the first conductive layer 243 and the second conductive layer 245 are short-circuited with each other, thereby changing electric resistance of the memory element. Meanwhile, the resistance values of the memory elements through which current does not flow are not changed.

Next, an operation in reading out data by applying voltage will be described in detail (see FIGS. 6A and 6B and FIGS. 7A to 7C).

When data "1" is written in one memory cell 221, the memory cell 221 is selected by the row decoder 224a, the level shifter 224b, the column decoder 226a, and the selector 226c. Specifically, predetermined voltage V22 is applied to a word line Wn connected to the memory cell 221 by the row decoder 224a and the level shifter 224b. Further, a bit line Bm connected to the memory cell 221 is connected to the readout/write circuit 226b by the column decoder 226a and the selector 226c. Then, writing voltage V21 is output to the bit line B3 from the readout/write circuit 226b.

The transistor 240 constituting the memory cell is made in an on state in such a manner, the bit line is electrically connected to the memory element 241, and voltage of about Vw=Vcom−V21 is applied. Further, one of electrodes of the memory element 241 is connected to a common electrode with potential Vcom. By property selecting the potential Vw, the organic compound layer 29 provided between the conductive layers is physically or electrically changed, and thus, the data "1" is written in the memory element. Specifically, in voltage of reading out operation, electric resistance between the first conductive layer and the second conductive layer in the state of the data "1" is preferably reduced significantly as compared to a case of being in a state of the data "0", and short-circuiting may simply be generated between the first conductive layer and the second conductive layer. Note that the potential V21 may be property selected from 5 to 15V, the potential V22 may be property selected from 5 to 15 V, and the potential Vcom may be property selected from 0 V. Alternatively, the potential V21 may be property selected from −12 to 0 V, the potential V22 may be property selected from −12 to 0 V, and the potential Vcom may be property selected from 3 to 5 V. The voltage Vw may be set to be 5 to 15 V, or −5 to −15 V.

Note that non-selected word lines and non-selected bit lines are controlled such that the data "1" is not written in the memory cells connected to the non-selected word and bit lines. Specifically, potential (e.g., 0 V), by which transistors of memory cells connected to the non-selected word lines are made in an off state, may be applied to the non-selected word lines whereas the non-selected bit lines may be made in a floating state or applied with potential, which is the same level as Vcom.

On the other hand, when the data "0" is written in the memory cell 221, no electric action may be applied to the memory cell 221. In a circuit operation, for example, in the same manner as the case of writing in the data "1", one memory cell 221 is selected by the row decoder 224a, the level shifter 224b, the column decoder 226a, and the selector 226c; however, an output potential, which is the same level as Vcom, is applied to a bit line B3 from the readout/write circuit 226b, or the bit line B3 is made to be in a floating state. As a result, low voltage (e.g., about −5 to 5 V) is applied to the memory element 241, or no voltage is applied to the memory element 241, and therefore, an electric characteristic of the memory element is not changed and writing of the data "0" can be realized.

Next, an operation in reading out data by an electric action will be described. Data is read out by utilizing difference in electric characteristics of the memory elements 241, which are different between a memory cell having data "0" and another memory cell having data "1". For example, a method for reading out data by utilizing difference in electric resistance will be described under conditions where electric resistance of a memory element constituting a memory cell having the data "0" is set to be R0 at a reading voltage, and electric resistance of a memory element constituting a memory cell having the data "1" is set to be R1 at a reading voltage. Note that R1<<R0. As a structure of a readout portion of the readout/write circuit, for example, the readout/write circuit 226b including the resistance element 254 and the differential amplifier 247 shown in FIG. 6B can be given. The resistance element has a resistance value Rr, wherein R1<Rr<R0.

When data is read out from the memory cell 221 in the x-th row and the y-th column, the memory cell 221 is selected by the row decoder 224a, the level shifter 224b, the column decoder 226a, and the selector 226c. Specifically, predetermined voltage V24 is applied to a word line Wy connected to the memory cell 221 by the level shifter 224b, and the transistor 240 is turned on. A bit line Bx connected to the memory cell 221 is connected to a terminal P of the readout/write circuit 226b by the column decoder 226a and the selector 226c. As a result, potential Vp of the terminal P becomes a value which is determined by resistance division of Vcom and V0 caused by the resistance element 254 (resistance value Rr) and the memory element 241 (resistance value R0 or R1). Therefore, in a case where the memory cell 221 has the data "0", Vp0=Vcom+(V0−Vcom)×R0/(R0+Rr). When the memory cell 221 has the data "1", Vp1=Vcom+(V0−Vcom)×R1/(R1+Rr). As a result, by selecting Vref to be between Vp0 and Vp1, Lo/Hi (or Hi/Lo) of an output potential Vout is output in accordance with the data "0" or data "1", and hence, the data can be read out.

For example, it is assumed that the differential amplifier is operated at Vdd=3V, and Vcom is set to be 0 V; V0, 3 V; and Vref, 1.5 V. If R0/Rr=Rr/R1=9 and on-resistance of the transistor 240 can be ignored, in a case where a memory cell has the data "0", Vp0 becomes 2.7 V and Hi is output as Vout. Meanwhile, in a case where a memory cell has the data "1", Vp1 becomes 0.3 V and Lo is output as Vout. In this manner, readout of memory cells can be performed.

Next, an operation in reading out data of a memory element by applying voltage in a case of using a transistor instead of the resistance element 254, will be described by giving a specific example in FIG. 11.

FIG. 11 shows a current-voltage characteristic 951 of a memory element in which the data "0" is written, a current-voltage characteristic 952 of a memory element in which the data "1" is written, and a current-voltage characteristic 953 of a transistor. Further, a case where 3 V is applied between the first conductive layer 243 and the second conductive layer 245 as operation voltage when reading out data, will be described.

In FIG. 11, in a memory cell having the memory element, in which data "0" is written, an intersection point 954 of the current-voltage characteristic 951 of the memory element with the current-voltage characteristic 953 of the transistor is an operation point. In this case, potential of a node P becomes V2 (V). A potential of the node P is supplied to the differential amplifier 247. In the differential amplifier 247, data stored in the memory cell is determined as "0".

On the other hand, in a memory cell having the memory element, in which the data "1" is written, an intersection point 955 of the current-voltage characteristic 952 of the memory element with the current-voltage characteristic 953 of the transistor is an operation point. In this case, potential of the node P becomes V1 (V) (V1<V2). The potential of the node P is supplied to the differential amplifier 247. In the differential amplifier 247, data stored in the memory cell is determined as "1".

By reading out potential which is subjected to resistance division in accordance with a resistance value of the memory elements 241, data stored in the memory cells can be determined.

According to the above described method, data is read out by voltage value while utilizing a difference in resistance values of the memory elements 241 and resistance division; however, data may be read out by an amount of current as information stored in the memory elements 241.

Furthermore, this embodiment mode can be implemented by being freely combined with the above described embodiment mode.

According to the present invention, by providing an insulating layer with a thickness of 4 nm or less, and preferably, 2 nm or less between a conductive layer and an organic compound layer, a charge injecting property of the insulating layer can be improved by a tunnel effect, and variations in amount of current and voltage applied to a memory element when writing data in the memory element can be reduced. In addition, since the charge injecting property can be improved by providing the insulating layer with a thickness of 4 nm or less, and preferably, 2 nm or less between the conductive layer and the organic compound layer, a thickness of the organic compound layer of a memory element can be increased, making it possible to reduce short-circuiting between electrodes in an initial state. As a consequence, reliability of a memory device and a semiconductor device can be improved.

(Embodiment Mode 3)

In this embodiment mode, an example of a semiconductor device having a memory device as shown in the above described embodiment modes, will be described with reference to the drawings.

One feature of the semiconductor device shown in this embodiment mode is that data can be read out from and written in the semiconductor device without contact. Data transmitting types can be largely classified into three of an electromagnetic coupling type in which a pair of coils are placed to face each other and communication is performed by mutual induction; an electromagnetic induction type in which communication is performed by an induction field; and a radio wave type in which communication is performed by utilizing radio waves. Any type can be employed. Further, there are two types of layouts of an antenna used for transmitting data: one is a case where an antenna is provided over a substrate over which a transistor and a memory element are provided; and the other is a case where a terminal portion is provided over a substrate over which a transistor and a memory element are provided and an antenna, which is provided over the other substrate, is connected to the terminal portion. As a part of a cross section of the semiconductor device, an antenna, a circuit connected to the antenna, and a part of a memory circuit are shown here.

First, a structural example of a semiconductor device in a case where an antenna is provided over a substrate over which a plurality of elements and a plurality of memory elements are provided, will be described with reference to FIGS. 8A and 8B.

Figure 8A:
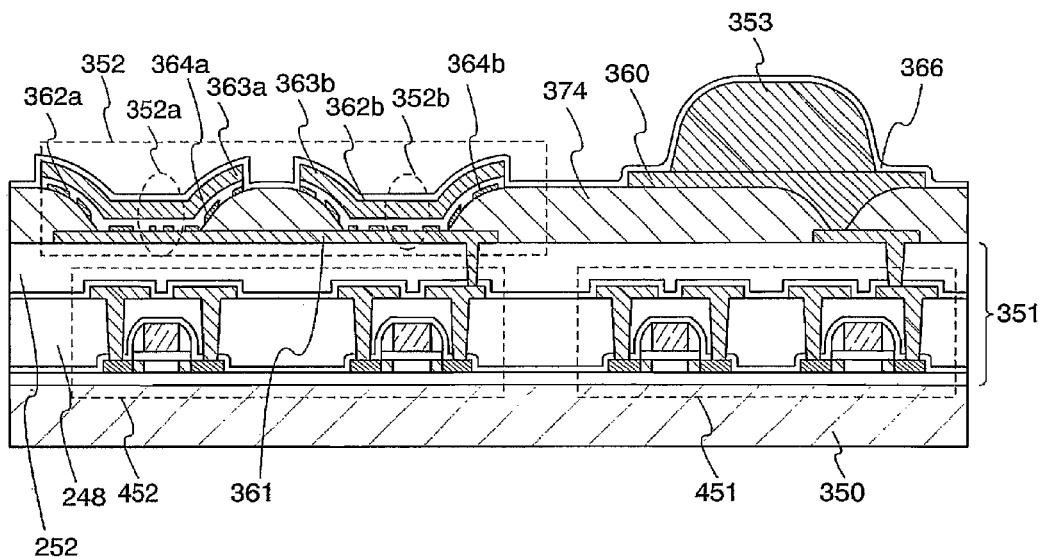
FIGS. 8A and 8B are cross sectional views explaining semiconductor devices of the present invention.

FIG. 8A shows a semiconductor device having a passive matrix type memory circuit. Over a substrate 350, the semiconductor device includes a layer 351 having transistors 451 and 452, a memory element portion 352 formed over the layer 351 having the transistors, and a conductive layer 353 serving as an antenna.

Note that a case where the semiconductor device includes the memory element portion 352 and the conductive layer 353 serving as an antenna over the layer 351 having the transistors; however, the present invention is not limited thereto. The memory element portion 352 or conductive layer 353 serving as an antenna may be provided under or in the same layer as the layer 351 having the transistors.

The memory element portion 352 has a plurality of memory elements 352a and 352b. The memory element 352a includes a first conductive layer 361 formed over an insulating layer 252, partition walls (insulating layers) 374 partly covering the first conductive layer, insulating layers 364a with a thickness of 0.1 nm or more and 4 nm or less, and preferably, 1 nm or more and 4 nm or less, which cover the first conductive layer 361 and the partition walls (insulating layers) 374, an organic compound layer 362a covering the first conductive layer 361, the partition walls (insulating layers) 374, and the insulating layers 364a, and a second conductive layer 363a. The memory element 352b includes the first conductive layer 361 formed over the insulating layer 252, the partition walls (insulating layers) 374 partly covering the first conductive layer, insulating layers 364b with a thickness of 0.1 nm or more and 4 nm or less, and preferably, 1 nm or more and 4 nm or less, which cover the first conductive layer 361 and the partition walls (insulating layers) 374, an organic compound layer 362b covering the first conductive layer 361, the partition walls (insulating layers) 374, and the insulating layer 364b, and a second conductive layer 363b.

Further, an insulating layer 366 serving as a protection film is formed to cover the second conductive layers 363a and 363b and the conductive layer 353 serving as an antenna. The first conductive layer 361 of the memory element portion 352 is connected to a wiring of a transistor 452. The memory element portion 352 can be formed using the same material through the same manufacturing method as those shown in the above embodiment modes. Since the passive matrix type memory circuit is shown here, the plurality of insulating layers 364a and 364b, the organic compound layers 362a and 362b, the second conductive layers 363a and 363b are formed over the first conductive layer 361 so as to constitute the plurality of memory elements 352a and 352b. Note that the transistor 452 serves as a switch for controlling potential of the memory element portion 352 of the first conductive layer 361.

In the memory element portion 352, as shown in the above embodiment modes, an element having a rectifying property may be provided between the first conductive layer 361 and the organic compound layers 362a and 362b, or between the organic compound layers 362a and 362b and the second conductive layers 363a and 363b. The same element having the rectifying property described in Embodiment Mode 1 can be used as the element having the rectifying property.

In this embodiment mode, the conductive layer 353 serving as an antenna is provided over the conductive layer 360 which is formed in the same layer as the second conductive layers 363a and 363b. Note that, the conductive layer serving as antenna may be formed in the same layer as the second conductive layers 363a and 363b. The conductive layer 353 serving as an antenna is connected to a source wiring or a drain wiring of the transistor 451. Further, the transistor 452 constitutes a part of a circuit connecting to the antenna.

As a material for the conductive layer 353 serving as the antenna, one element selected from gold (Au), platinum (Pt), nickel (Ni), tungsten (W), molybdenum (Mo), cobalt (Co), copper (Cu), aluminum (Al), manganese (Mn), titanium (Ti), and the like; or an alloy containing a plurality of the above mentioned elements; and the like can be given. As a method for forming the conductive layer 353 serving as the antenna, evaporation, sputtering, CVD, various kinds of printing methods such as screen printing and gravure printing, a droplet discharging method, or the like can be used.

The transistors 240 and 262 shown in Embodiment Mode 2 can be arbitrarily used as the transistors 451 and 452 contained in the layer 351 having the transistors.

Furthermore, a separation layer, the layer 351 having the transistors, the memory element portion 352, and the conductive layer 353 serving as the antenna are provided over a substrate, and the layer 351 having the transistors, the memory element portion 352, and the conductive layer 353 serving as the antenna are separated from the substrate by property using the separation method mentioned in Embodiment Mode 2. Thereafter, the layer 351 having the transistors, the memory element portion 352, and the conductive layer 353 serving as the antenna separated from the substrate may be attached to another substrate by using an adhesive layer. Utilizing a flexible substrate shown as the substrate 30 in Embodiment Mode 1, a film having a thermoplastic property, a paper made from a fibrous material, a base material film, or the like as the other substrate makes it possible to achieve a small, thin, and lightweight memory device.

Figure 8B:
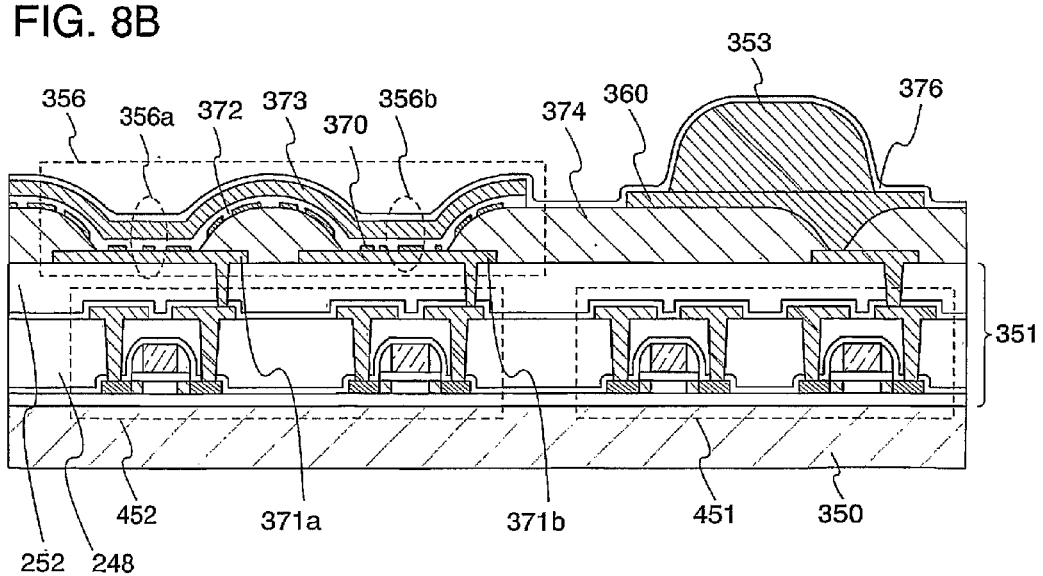

FIG. 8B shows an example of a semiconductor device having an active matrix type memory circuit. Portions different from those of FIG. 8A will be described in FIG. 8B.

The semiconductor device shown in FIG. 8B includes the layer 351 having the transistors 451 and 452 over the substrate 350, a memory element portion 356 over the layer 351 having the transistors, and the conductive layer 353 serving as the antenna over the layer 351 having the transistors. Note that, a case where the transistor 452 serving as a switching element of the memory element portion 356 is formed in the same layer as the transistor 451 and the memory element portion 356 and the conductive layer 353 serving as the antenna are formed over the layer 351 having the transistors, is shown here; however, the memory element portion 356 and the conductive layer 353 serving as the antenna can be formed under or in the same layer as the layer 351 having the transistors.

The memory element portion 356 includes the memory elements 356a and 356b. The memory element 356a includes first conductive layer 371a formed over the insulating layer 252, partition walls (insulating layers) 374 partly covering the first conductive layer 371a, insulating layers 370 with a thickness of 0.1 nm or more and 4 nm or less, and preferably, 1 nm or more and 4 nm or less, an organic compound layer 372 covering the first conductive layer 371a, the partition walls (insulating layers) 374, and the insulating layers 370, and a second conductive layer 373. The memory element 356b includes a first conductive layer 371b formed over the insulating layer 252, the partition walls (insulating layers) 374 partly covering the first conductive layer 371b, the insulating layers 370 with a thickness of 0.1 nm or more and 4 nm or less, and preferably, 1 nm or more and 4 nm or less, which cover the first conductive layer 371b and the partition walls (insulating layers) 374, the organic compound layer 372 covering the first conductive layer 371b, the partition walls (insulating layers) 374, and the insulating layers 370, and the second conductive layer 373. Since the active matrix type memory circuit is shown here, the first conductive layer 371a and the first conductive layer 371b are connected to wirings of each of the transistors. That is, each of the first conductive layers of the memory elements is connected to each transistor. Further, an insulating layer 376 serving as a protection film is formed to cover the second conductive layer 373 and the conductive layer 353 serving as an antenna.

Note that the same material and the same manufacturing method as shown in Embodiment Modes 1 and 2 can be used for forming the memory elements 356a and 356b. Further, in the memory elements 356a and 356b, as described above, an element having a rectifying property may be provided between the first conductive layers 371a and 371b and the organic compound layer 372 or between the organic compound layer 372 and the second conductive layer 373.

The layer 351 having the transistors, the memory element portion 356, and the conductive layer 353 serving as the antenna can be formed by using evaporation, sputtering, CVD, printing, a droplet discharging method, or the like as described above. Further, they may be formed by different methods depending on their portions to be formed.

Furthermore, a separation layer, the layer 351 having the transistors, the memory element portion 356, and the conductive layer 353 serving as the antenna may be provided over a substrate, the layer 351 having the transistors, the memory element portion 356, and the conductive layer 353 serving as the antenna may be separated from the substrate by property using the separation method shown in Embodiment Mode 2. The layer 351 having the transistors, the memory element portion 356, and the conductive layer 353 serving as the antenna separated from the substrate may be attached to the other substrate by using an adhesive layer. By utilizing a flexible substrate shown as the substrate 30 in Embodiment Mode 1, a film having a thermoplastic property, a paper made from a fibrous material, a base material film, or the like as the other substrate, it is possible to achieve a small, thin, and lightweight memory device.

Note that a sensor may be provided to be connected to the transistors. As a sensor, an element which detects temperature, humidity, illuminance, gas, gravity, pressure, sound (vibration), acceleration, and other characteristics by physical means or chemical means, can be given. The sensor is typically formed using an element such as a resistance element, a capacitance coupled element, an inductively-coupled element, a photovoltaic element, a photoelectric conversion element, a thermovoltaic element, a transistor, a thermistor, a diode electrostatic capacitance type element, and a piezoelectric element.

Next, a structural example of a semiconductor device including a first substrate, which includes a layer having transistors, a terminal portion being connected to the transistors, and a memory element, and a second substrate, over which an antenna being connected to the terminal portion, will be described with reference to FIGS. 9A and 9B. Note that, portions different from those of FIGS. 8A and 8B will be described in FIGS. 9A and 9B.

Figure 9A:
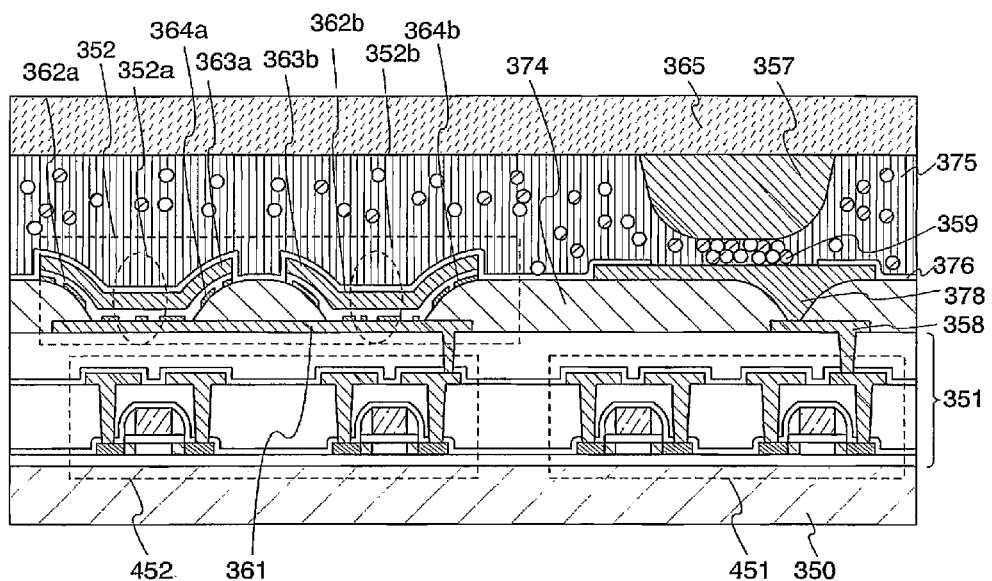
FIGS. 9A and 9B are cross sectional views explaining semiconductor devices of the present invention.

FIG. 9A shows a semiconductor device having a passive matrix type memory circuit. The semiconductor device includes a layer 351 having transistors 451 and 452 formed over a substrate 350, a memory element portion 352 formed over the layer 351 having the transistors, a connection terminal 378 being connected to the transistor 451, and a substrate 365, over which a conductive layer 357 serving as an antenna is provided. The conductive layer 357 is connected to the connection terminal 378 by conductive particles 359. Note that, a case in which the memory element portion 352 is provided over the layer 351 having the transistors, is shown here; however, the present invention is not limited thereto. Alternatively, the memory element portion 352 may be provided under or in the same layer as the layer 351 having the transistors.

The memory element portion 352 can be formed using the memory element portion 352 having the structure as shown in FIG. 8A.

Further, the substrate including the layer 351 having the transistors and the memory element portion 352 and the substrate 365 including the conductive layer 357 serving as the antenna are attached to each other with a resin 375 having an adhesion property. The layer 351 having the transistors and a conductive layer 358 are electrically connected to each other through the conductive particles 359 contained in the resin 375. Alternatively, the substrate including the layer 351 having the transistors and the memory element portion 352 and the substrate 365 including the conductive layer serving as the antenna, may be attached to each other by using a conductive adhesive agent such as a silver paste, a copper paste, and a carbon paste or a solder joint method.

Figure 9B:
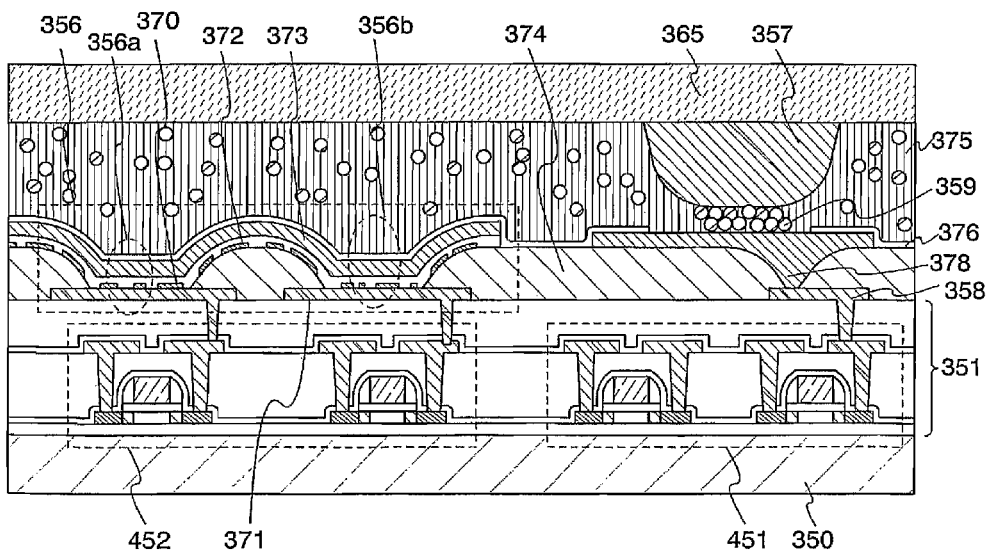

FIG. 9B shows a semiconductor device having the memory device shown in Embodiment Mode 2. The semiconductor device includes a layer 351 having transistors 451 and 452 formed over a substrate 350, a memory element portion 356 formed over the layer 351 having the transistors, a connection terminal 378 being connected to the transistor 451, and a substrate 365, over which a conductive layer 357 serving as an antenna is provided. The conductive layer 357 and the connection terminal 378 are connected to each other by conductive particles 359. Note that a case where in the layer 351 having the transistors 451 and 452, the transistor 451 is formed in the same layer as the transistor 452 and the conductive layer 357 serving as the antenna is formed over the layer 351 having the transistors, is shown here; however, the present invention is not limited thereto. Alternatively, the memory element portion 356 may be provided under or in the same layer as the layer 351 having the transistors.

The memory element portion 356 can be formed using the memory elements 356a and 356b having the structure shown in FIG. 8B.

Also, in FIG. 9B, the substrate, which includes the layer 351 having the transistors and the memory element portion 356, and the substrate 365, over which the conductive layer 357 serving as the antenna is provided, are attached to each other by a resin 375 containing the conductive particles 359. Further, the conductive layer 357 and the connection terminal 378 are connected to each other by the conductive particles 359.

Furthermore, a separation layer, the layer 351 having the transistors, and the memory element portion 356 may be provided over a substrate, and the layer 351 having the transistors and the memory element portion 356 may be separated from the substrate by using the separation method shown in Embodiment Mode 2. The layer 351 having the transistors and the memory element portion 356 may be attached to the other substrate by using an adhesive layer. By utilizing a flexible substrate shown as the substrate 30 in Embodiment Mode 1, a film having a thermoplastic property, a paper made from a fibrous material, a base material film, or the like as the other substrate, it is possible to achieve a small, thin, and lightweight memory device.

Moreover, each of the memory element portions 352 and 356 may be provided over the substrate 365 over which the conductive layer serving as the antenna is provided. Specifically, a first substrate, over which a layer having transistors is provided, and a second substrate, over which a memory element portion and a conductive layer serving as an antenna are provided, may be attached to each other by using a resin containing conductive particles. A sensor being connected to the transistors may also be provided as well as the semiconductor devices shown in FIGS. 8A and 8B.

Furthermore, the present embodiment mode can be implemented by being freely combined with the above described embodiment modes.

By providing an insulating layer with a thickness of 4 nm or less, and preferably, 2 nm or less between a conductive layer and an organic compound layer, a charge injecting property of the insulating layer can be improved by a tunnel effect, and variations in amount of current and voltage applied to a memory element when writing data in the memory element, can be reduced. In addition, the charge injecting property can be improved by providing the insulating layer with the thickness of 4 nm or less, and preferably, 2 nm or less between the conductive layer and the organic compound layer, a thickness of the organic compound layer of the memory element can be increased, making it possible to reduce short-circuiting between electrodes in an initial state. As a consequence, reliability of a semiconductor device can be improved.

(Embodiment 1)

In this embodiment, a memory element is manufactured over a substrate, and current-voltage characteristics in writing data by applying voltage to the memory element will be described with reference to FIGS. 15A and 15B. Note that, in this embodiment, data was written in a memory element by applying voltage to the memory element to generate short-circuiting. The memory element was an element in which a first conductive layer, an insulating layer, an organic compound layer, and a second conductive layer were laminated in this order. The first conductive layer was formed using titanium. The insulating layer was formed using calcium fluoride. The organic compound layer was formed using 4,4'-bis[N-(1-naphthyl)-N-phenylamino]biphenyl (abbreviation: NPB). The second conductive layer was formed using aluminum. The insulating layer was formed to have 2 nm in thickness. The organic compound layer was formed to have 8 nm in thickness. The second conductive layer was formed to have 200 nm in thickness. Further, the first conductive layer was formed by sputtering. The insulating layer, the organic compound layer, and the second conductive layer were formed by evaporation. A memory element including such a structure and having a square top surface with 100 μm on a side is referred to as a sample 1. Memory elements each including such a structure and each having a square top surface with 10 μm on a side are referred to as a sample 2 and a sample 3.

As a comparative sample with respect to the samples 1 to 3, an element, in which a first conductive layer, an organic compound layer, and as a second conductive layer were laminated in this order, was formed. The first conductive layer was formed using titanium. The organic compound layer was formed using 4,4'-bis[N-(1-naphthyl)-N-phenylamino]biphenyl (abbreviation: NPB). The second conductive layer was formed using aluminum. Further, a thickness of the organic compound layer was set to be 8 nm, and a thickness of the second conductive layer was set to be 200 nm. The first conductive layer was formed by sputtering. The organic compound layer and the second conductive layer were formed by evaporation. A memory element including such a structure and having a square top surface with 100 μm on a side is referred to as a comparative sample 1. Memory elements each including such a structure and each having a square top surface with 10 μm on a side are referred to as a comparative sample 2 and a comparative sample 3.

Voltage-current characteristics of the memory elements (the sample 1 and the comparative sample 1) when voltage was applied to the memory elements and data was written in the memory elements, will be described with reference to FIG. 15A. In FIG. 15A, a horizontal axis indicates voltage whereas a vertical axis indicates current.

Figure 15A:
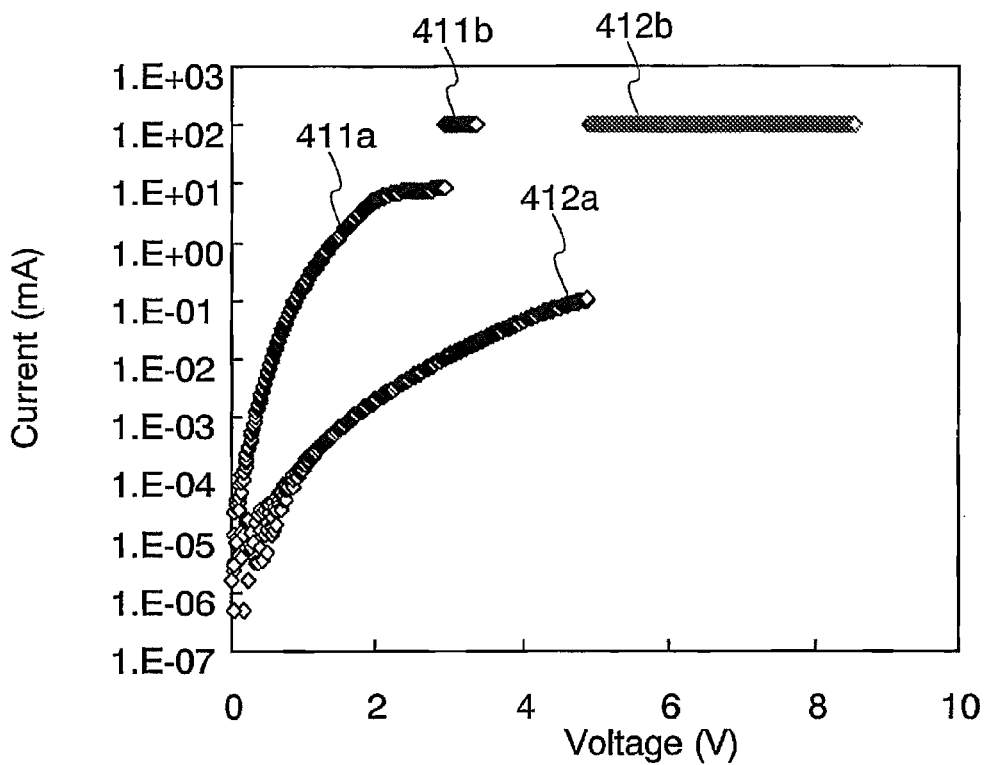
FIGS. 15A and 15B are graphs showing current-voltage characteristics of a memory element.

In FIG. 15A, plots 411a show behavior of the amount of current of the sample 1 before data was written in the sample 1 by applying voltage, whereas plots 411b show behavior of the amount of current of the sample 1 after data was written in the sample 1.

Plots 412a show behavior of the amount of current of the comparative sample 1 before data was written in the comparative sample 1 by applying voltage, whereas plots 412b show behavior of the amount of current of the comparative sample 1 after data was written in the comparative sample 1.

When data was written in the sample 1, voltage was 2.9 V and the amount of current was 82,000 μA. When data was written in the comparative sample 1, voltage was 4.9 V and the amount of current was 110 μA. Further, the amount of current of the sample 1 before data was written in the sample 1 was higher than that of the comparative sample 1 before data was written in the comparative sample 1. Accordingly, since the memory element of the sample 1 had the insulating layer between the first conductive layer and the organic compound layer, the sample 1 had a higher charge injecting property. Furthermore, since the insulating layer was formed using stable calcium fluoride, a mechanism of this insulating layer is tunnel injection. In addition, the charge injecting property was improved, and therefore, voltage required for writing data in the sample 1 was reduced.

Next, voltage-current characteristics when data was written in the samples 2 and 3 and the comparative samples 2 and 3, will be described with reference to FIG. 15B. In FIG. 15B, a horizontal axis indicates voltage whereas a vertical axis indicates current.

Figure 15B:
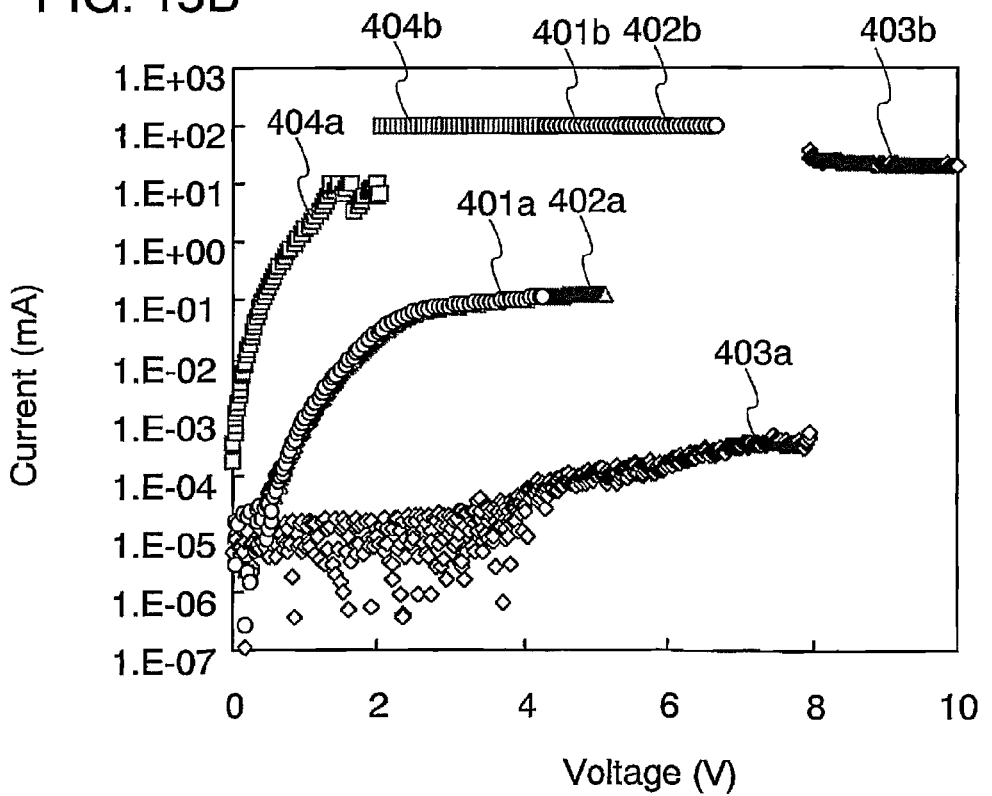

In FIG. 15B, plots 401a show behavior of the amount of current of the sample 3 before data was written in the sample 3 by applying voltage, whereas plots 401b show behavior of the amount of current of the sample 3 after data was written in the sample 3.

Plots 402a show behavior of the amount of current of the sample 2 before data was written in the sample 2 by applying voltage, whereas plots 402b show behavior of the amount of current of the sample 2 after data was written in the sample 2.

Plots 403a show behavior of the amount of current of the comparative sample 3 before data was written in the comparative sample 3 by applying voltage, whereas plots 403b show behavior of the amount of current of the comparative sample 3 after data was written in the comparative sample 3.

Plots 404a show behavior of the amount of current of the comparative sample 2 before data was written in the comparative sample 2 by applying voltage, whereas plots 404b show behavior of the amount of current of the comparative sample 2 after data was written in the comparative sample 2.

When data was written in the sample 2, voltage was 5.1 V and the amount of current was 130 μA. When data was written in the sample 3, voltage was 4.2 V and the amount of current was 110 μA. Accordingly, there are few variations in voltage and amount of current in writing data in the samples 2 and 3. Thus, it is also known that providing the insulating layer between the first conductive layer and the organic compound layer reduces variations in voltage and amount of current when data is written in the memory elements.

On the other hand, when data was written in the comparative sample 2, voltage was 2.0 V and the amount of current was $6.8 \times 10^3$ μA. Further, when data was written in the comparative sample 3, voltage was 7.9 V and the amount of current was 0.45 μA. Accordingly, there are many variations in voltage and amount of current when data was written in the comparative samples 2 and 3.

Next, voltage-current characteristics of memory elements in each of which an organic compound layer was formed by spin coating, will be described with reference to Tables 1 to 3. A memory element included a first conductive layer, an insulating layer, an organic compound layer, and a second conductive layer, was laminated in this order over a substrate. The first conductive layer was formed using titanium. The insulating layer was formed using calcium fluoride. The organic compound layer was formed using polyvinyl carbazole (PVK). The second conductive layer was formed using aluminum A thickness of the insulating layer was set to be 1 nm. A thickness of the organic compound layer was set to be 15 nm. A thickness of the second conductive layer was set to be 200 nm. The first conductive layer was formed by sputtering. The insulating layer and the second conductive layer were formed by evaporation. The organic compound layer was formed by spin coating. Further, prior to forming the insulating layer over the first conductive layer by evaporation, a titanium layer was formed as the first conductive layer by sputtering, an aluminum layer with a thickness of 100 nm was formed over the titanium layer, and then, the aluminum layer was removed by using TMAH (tetramethylammonium hydroxide).

Memory elements each including the above mentioned structure and each having a square top surface with 10 μm on a side, are referred to as samples 4 and 5.

As comparative examples with respect to the samples 4 and 5, an element in which a first conductive layer, an organic compound layer, and a second conductive layer were laminated over a substrate in this order, was formed. The first conductive layer was formed using titanium. The organic compound layer was formed using polyvinyl carbazole (PVK). The second conductive layer was formed using aluminum. A thickness of the organic compound layer was set to be 15 nm. A thickness of the second conductive layer was set to be 200 nm. Further, the first conductive layer was formed by sputtering. The organic compound layer was formed by spin coating. The second conductive layer was formed by evaporation. Memory elements each including the above described structure and each having a square top surface with 10 μM on a side, are referred to as comparative samples 4 to 6.

Voltage and current of the samples 4 and 5 and the comparative samples 4 to 6 when voltage was applied thereto and data was written therein, are shown in Table 1.

TABLE 1

|  | Voltage (V) | Current (μA) |
| --- | --- | --- |
| Sample 4 | 8.5 | 1.12 |
| Sample 5 | 8.2 | 0.95 |
| Comparative sample 4 | 14.8 | 3.6 |
| Comparative sample 5 | 13.3 | 37.1 |
| Comparative sample 6 | 11.2 | 90.2 |

There are few variations in the voltage and current when data was written in the samples 4 and 5. On the other hand, when data was written in the comparative samples 4 to 6, the voltage of the comparative samples was higher than the voltage of the samples 4 and 5. In addition, there were variations in current of the comparative samples 4 to 6.

Further, memory elements including the same laminated structure as the samples 1 to 5 and each having a square top surface with 5 μm on a side, are referred to as samples 6 and 7. Similarly, memory elements including the same laminated structure as the comparative samples 1 to 6 and each having a square top surface with 5 μm on a side, are referred to as comparative examples 7 to 10.

Voltage and current of the samples 6 and 7 and the comparative samples 7 to 10 when voltage was applied thereto and data was written therein, are shown in Table 2.

TABLE 2

|  | Voltage (V) | Current (μA) |
| --- | --- | --- |
| Sample 6 | 10.1 | 0.34 |
| Sample 7 | 11 | 0.26 |
| Comparative sample 7 | 21.2 (insulated) |  |
| Comparative sample 8 | 19.3 | 2.62 |
| Comparative sample 9 | 20.7 | 3.17 |
| Comparative sample 10 | 13 (insulated) |  |

There are few variations in the voltage and current when data was written in the samples 6 and 7. On the other hand, data was not written in the comparative samples 7 and 10 and the comparative samples 7 and 10 were insulated. The comparative samples 8 and 9 had high voltage and large amounts of current when data was written in the comparative samples 8 and 9.

Further, memory elements including the same laminated structure as the samples 4 and 5 and each having a square top surface with 3 μm on a side, are referred to as samples 8 to 10. Similarly, memory elements including the same laminated structure as the comparative samples 4 to 6 and each having a square top surface with 3 μm on a side, are referred to as comparative examples 11 to 13.

Voltage and current of the samples 8 to 10 and the comparative samples 11 to 13 when voltage was applied thereto and data was written therein, are shown in Table 3.

TABLE 3

|  | Voltage (V) | Current (μA) |
| --- | --- | --- |
| Sample 8 | 12.9 | 0.08 |
| Sample 9 | 13.6 | 0.02 |
| Sample 10 | 14.1 | 0.04 |
| Comparative sample 11 | 29.6 (insulated) |  |
| Comparative sample 12 | 10.8 (insulated) |  |
| Comparative sample 13 | 29.7 |  |

There are few variations in voltage and current when data was written in the samples 8 to 10. On the other hand, data was not written in the comparative samples 11 to 13 and the comparative samples 11 to 13 were insulated.

As shown in Tables 1 to 3, in a memory element including an organic compound layer, providing an insulating layer with a thickness of 4 nm or less, and preferably, 2 nm or less, between a first conductive layer and the organic compound layer reduces variations in voltage and an amount of current when data was written in the memory element regardless of an area of a top surface of the memory element.

(Embodiment 2)

Figure 12A:
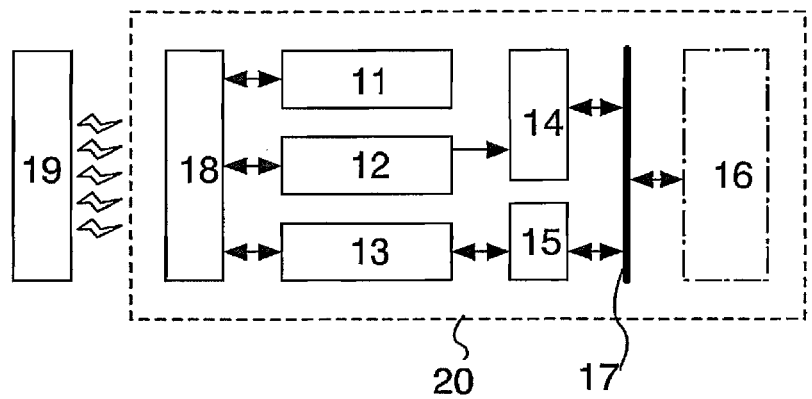
FIGS. 12A to 12C are diagrams explaining structural examples of a semiconductor device of the present invention.

Structures of semiconductor devices according to the present invention will be described in this embodiment with reference to FIGS. 12A to 12C. As shown in FIG. 12A, a semiconductor device 20 of the present invention has a function of receiving/sending data without contact, and includes a power supply circuit 11, a clock generation circuit 12, a data demodulation/modulation circuit 13, a control circuit 14 controlling other circuit, an interface circuit 15, a memory circuit 16, a bus 17, and an antenna 18.

Figure 12B:
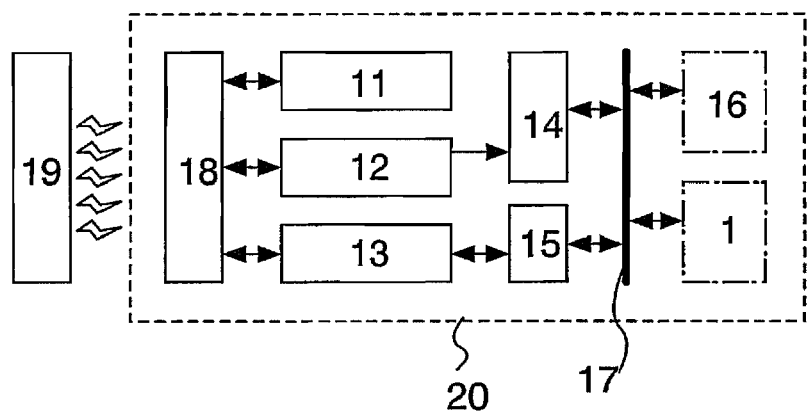

Further, as shown in FIG. 12B, the semiconductor device 20 of the present invention has a function of receiving/sending data without contact, and may include a central processing unit 1, in addition to the power supply circuit 11, the clock generation circuit 12, the data demodulation/modulation circuit 13, the control circuit 14 controlling other circuit, the interface circuit 15, the memory circuit 16, the bus 17, and the antenna 18.

Figure 12C:
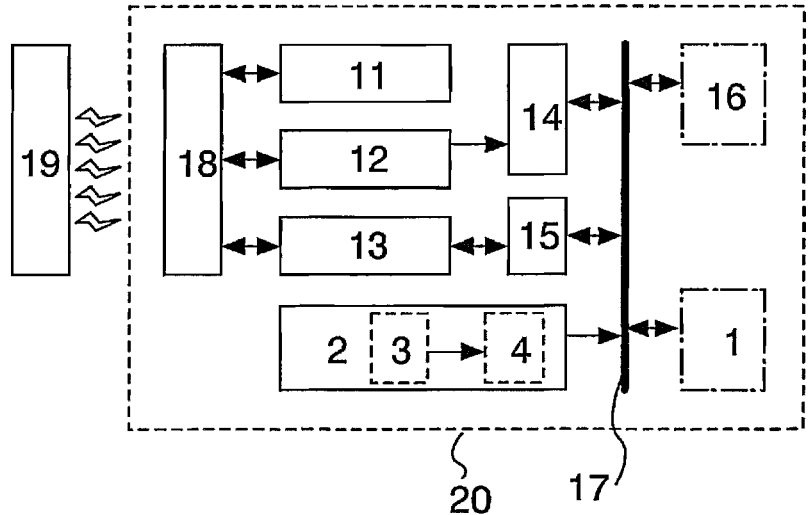

As shown in FIG. 12C, the semiconductor device 20 of the present invention has a function of receiving/sending data without contact, and may include a detecting portion 2 including a detecting element 3 and a detection control circuit 4, in addition to the power supply circuit 11, the clock generation circuit 12, the data demodulation/modulation circuit 13, the control circuit 14 controlling other circuit, the interface circuit 15, the memory circuit 16, the bus 17, the antenna 18, and the central processing unit 1.

When the semiconductor device according to the present invention constitutes the power supply circuit 11, the clock generation circuit 12, the data demodulation/modulation circuit 13, the control circuit 14 controlling other circuit, the interface circuit 15, the memory circuit 16, the bus 17, the antenna 18, the central processing unit 1, and the detecting portion 2 including the detecting element 3 and the detection control circuit 4 by a transistor of a layer having transistors, a small semiconductor device having a sensing function can be formed.

The power supply circuit 11 generates various kinds of power sources to be supplied to various circuits inside of the semiconductor device 20 based on alternating current signals input from the antenna 18. The clock generation circuit 12 generates various clock signals to be supplied to various circuits inside of the semiconductor device 20 based on alternating current signals input from the antenna 18. The data demodulation/modulation circuit 13 includes a function of demodulating/modulating data for communicating with a reader/writer 19. The control circuit 14 has a function of controlling the memory circuit 16. The antenna 18 has a function of sending and receiving electromagnetic waves or radio waves. The reader/writer 19 controls communication with the semiconductor device and processing of data of communication. Note that the semiconductor device of the present invention is not limited to the above described structures. For example, the semiconductor device further includes other elements such as a limiter circuit of power voltage and hardware for encryption processing.

The memory circuit 16 includes one or more of the memory elements shown in Embodiment Modes 1 and 2. Since a memory element including an organic compound layer can simultaneously realize miniaturization, reduction in thickness, and increase in capacitance, when the memory circuit 16 is provided using the memory element including the organic compound layer, a small and lightweight semiconductor device can be achieved.

The detecting portion 2 can detect temperature, pressure, flow rate, light, magnetism, sonic waves, acceleration, humidity, a gas component, a fluid component, and other characteristics by physical means or chemical means. The detecting portion 2 includes the detecting element 3 for detecting a physical quantity or a chemical quantity and the detection control circuit 4, which converts a physical quantity or a chemical quantity detected by the detecting element 3 into a suitable signal such as an electronic signal. The detecting element 3 can be formed by using an element such as a resistance element, a capacitance coupled element, an inductively-coupled element, a photovoltaic element, a photoelectric conversion element, a thermovoltaic element, a transistor, a thermistor, a diode, an electrostatic capacitance type element, and a piezoelectric element. Note that, a plurality of detecting portions 2 may be provided. In this case, a plurality of physical quantities or chemical quantities can be detected simultaneously.

Further, the physical quantities mentioned here indicate temperature, pressure, flow rate, light, magnetism, sonic waves, acceleration, humidity, and the like. The chemical quantities mentioned here indicate chemical substances and the like such as a gas component like a gas etc. and a fluid component like an ion etc. In addition to the above, the chemical quantities further include an organic compound like a certain biologic material contained in blood, sweat, urine, and the like (e.g., a blood-sugar level contained in blood). In particular, in order to detect a chemical quantity, a certain substance is inevitably detected selectively, and therefore, a substance to be detected and a substance which is selectively reacted are preferably provided in advance in the detecting element 3. For example, when detecting a biologic material, enzyme, an antibody molecule, a microbial cell, and the like, which are selectively reacted with the biologic material to be detected by the detecting element 3, are preferably immobilized to a high molecule and the like.

(Embodiment 3)

Figure 14A:
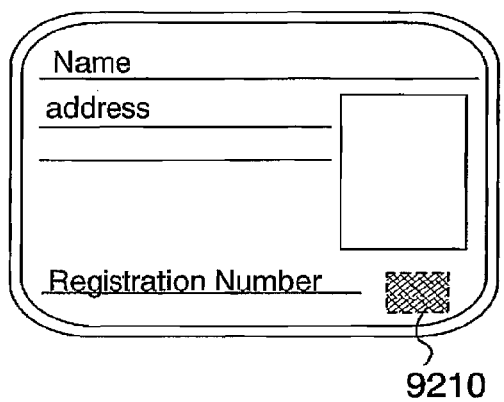
FIGS. 14A to 14F are diagrams showing use modes of a semiconductor device of the present invention.
Figure 14B:
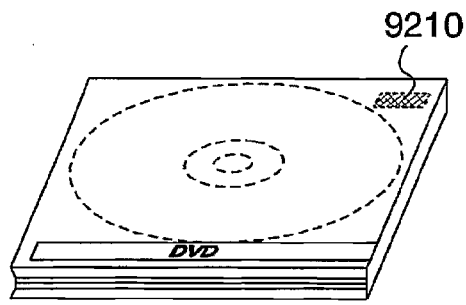
Figure 14C:
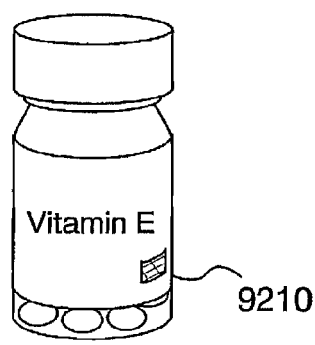
Figure 14D:
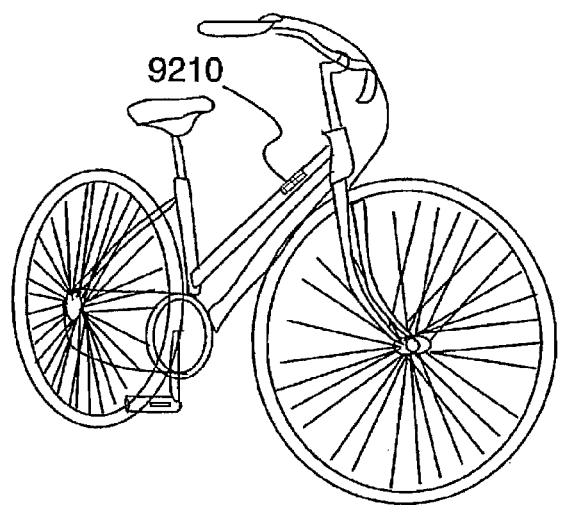
Figure 14E:
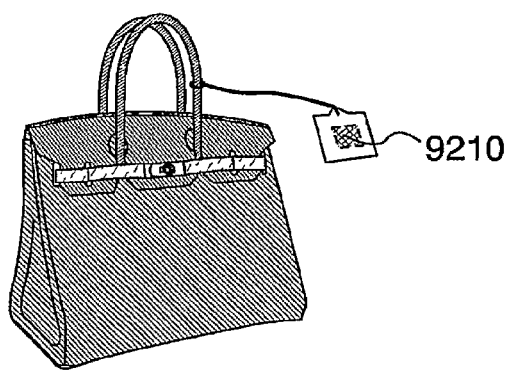
Figure 14F:
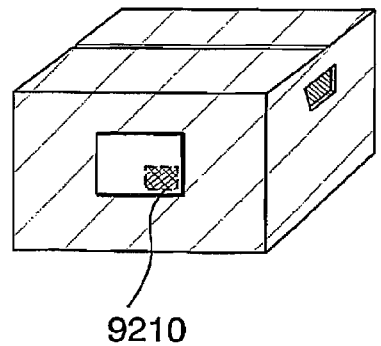

According to the present invention, a semiconductor device serving as a wireless chip can be formed. An application range of the wireless chip is wide. For example, the wireless chip can be, for example, used by being attached with bills, coins, portfolios, bearer bonds, certificates (such as a driver's certificate and a certificate of residence, see FIG. 14A), wrapping containers (such as a wrapping paper and a bottle, see FIG. 14C), recording mediums such as DVD software and a video tape (see FIG. 14B), vehicles (such as a bicycle, see FIG. 14D), belongings (such as a bag and eye glasses), foods, plants, clothes, livingwares, tags for commodities such as electronic appliances and baggage (see FIGS. 14E and 14F), and the like.

Further, the wireless chips can be attached to or embedded in animals and human bodies. The electronic appliances indicate a liquid crystal display device, an EL display device, a television device (also simply referred to as a television or a television receiver), a cellular phone, and the like. Further, the semiconductor device 20 of the present invention can be fixed to goods by mounting it on a printed substrate, or by attaching the semiconductor device to a surface of the goods or embedding the semiconductor device in the goods. For example, the semiconductor device may be embedded in a paper of a book, or embedded in an organic resin of a package that is formed using the organic resin. Since the semiconductor device 20 of the present invention is small, thin, and lightweight, after fixing it to goods, design of the good is not impaired by the semiconductor device. By providing semiconductor devices 2707 to bills, coins, portfolios, bearer bonds, certificates, and the like, identification functions can be provided to these things. By utilizing the identification functions, forgery of these things can be prevented. In addition, by providing the semiconductor devices to wrapping containers, recording mediums, belongings, foods, clothes, livingwares, electronic appliances, and the like, an inspection system can be improved efficiently.

Figure 13:
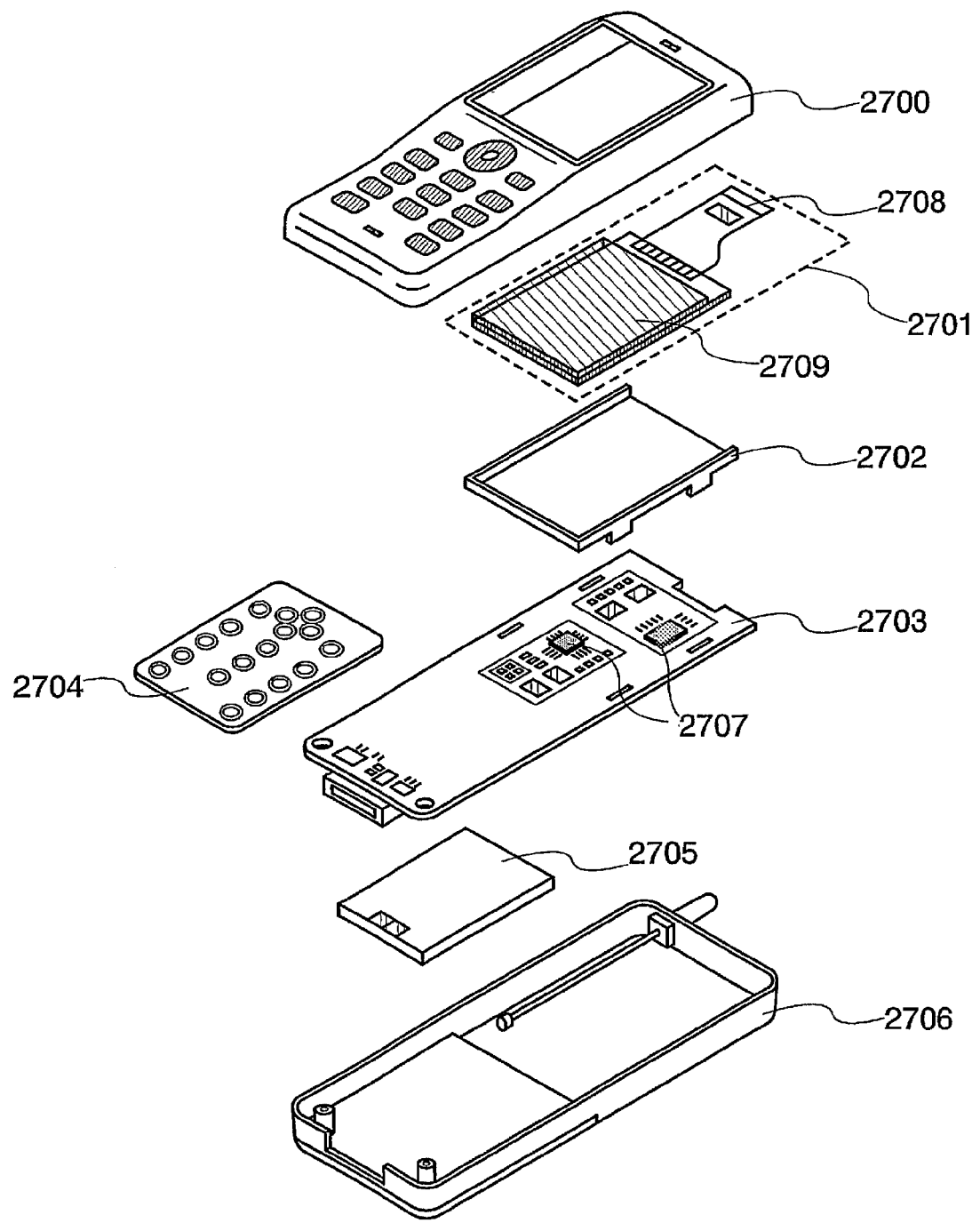
FIG. 13 is a diagram showing an electronic appliance having a semiconductor device of the present invention.

Next, an example of an electronic appliance equipped with a semiconductor device of the present invention will be described with reference to the drawing. A mobile phone is shown as an example here. The mobile phone includes casings 2700 and 2706, a panel 2701, a housing 2702, a printed wiring board 2703, operation buttons 2704, and a battery 2705 (see FIG. 13). The panel 2701 is built in the housing 2702 and is freely detachable. The housing 2702 is firmly attached to the printed wiring board 2703. The shape and the size of the housing 2702 are arbitrarily changed in accordance with an electronic appliance to which the panel 2701 is built in. A plurality of semiconductor devices that are packaged are mounted over the printed wiring board 2703. The semiconductor device of the present invention can be used as one of the plurality of semiconductor devices. The plurality of semiconductor devices mounted over the printed wiring board 2703 have any functions of a controller, a central processing unit (CPU), a memory, a power supply circuit, an audio processing circuit, a transmitting/receiving circuit, and the like.

The panel 2701 is connected to the printed wiring board 2703 through a connection film 2708. The panel 2701, the housing 2702, and the printed wiring board 2703 are housed inside of the casings 2700 and 2706 along with the operation buttons 2704 and the battery 2705. A pixel region 2709 included in the panel 2701 is arranged such that the pixel region 2709 can be recognized by sight through an opening window.

As set forth above, the semiconductor device of the present invention is small, thin, and lightweight, and therefore, a limited space inside of the casings 2700 and 2706 of the electronic appliance can be efficiently utilized.

Furthermore, since the semiconductor device of the present invention includes a memory element having a simple structure in which an organic compound layer, which is changed by being applied with voltage from an external portion, is interposed between a pair of conductive layers, electronic appliances using less expensive semiconductor devices can be provided. In addition, since the semiconductor device of the present invention can be highly integrated easily, an electronic appliance using the semiconductor device having a high-capacity memory circuit can be provided.

Moreover, data is written in a memory device included in a semiconductor device of the present invention by applying voltage to the semiconductor device from an external portion, and the memory device is nonvolatile and data can be added to the memory device. Accordingly, forgery due to rewriting can be inhibited while adding new data to the memory device. Accordingly, an electronic appliance using a high-performance and high-value added semiconductor device can be provided.

Note that the casings 2700 and 2706 only show example of an exterior shape of the mobile phone, and electronic appliance to which the present invention is applied can be varied in accordance with its performance and intended purpose.

(Embodiment 4)

In this embodiment, a writing characteristic of a memory element will be described with reference to FIGS. 17A and 17B and FIG. 18.

Figure 17A:
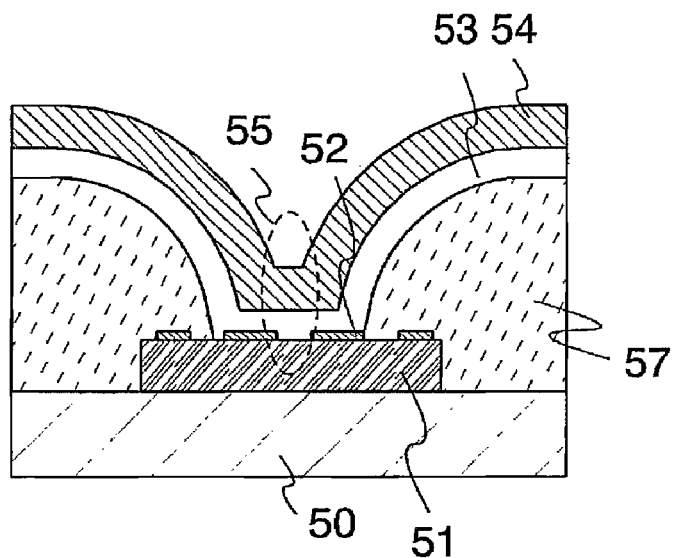
FIGS. 17A and 17B are cross sectional views explaining structures of memory elements of the present invention.
Figure 17B:
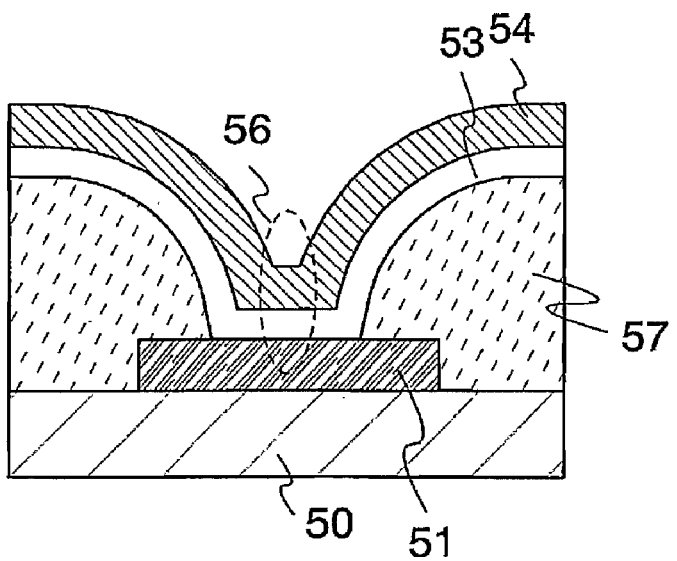

FIG. 17A shows a structure of a sample 11 used in this embodiment while FIG. 17B shows a structure of a comparative sample 14 with respect to the sample 11.

The sample 11 has a memory element 55, which includes a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

The comparative sample 14 has a memory element 56, which includes the first conductive layer 51 formed over the substrate 50, the organic compound layer 53 formed over the first conductive layer 51, and the second conductive layer 54 formed over the organic compound layer 53.

Note that in each of the memory elements 55 and 56, an edge portion of the first conductive layer 51 is covered with partition walls (insulating layers) 57.

In each of the memory elements 55 and 56, a glass substrate was used as the substrate 50, a titanium layer with a thickness of 100 nm was formed as the first conductive layer 51 by sputtering, the organic compound layer 53 was formed using NPB with a thickness of 10 nm by evaporation, and an aluminum layer with a thickness of 200 nm was formed as the second conductive layer 54 by evaporation. Further, in the memory element 55, a calcium fluoride layer with a thickness of 1 nm was formed by evaporation as the insulating layers 52. A top surface, in which the first conductive layer 51 and the second conductive layer 54 of each of the memory elements 55 and 56 are overlapped with each other, was a square shape and one side of the top surface was set to be 5 μm.

Figure 18:
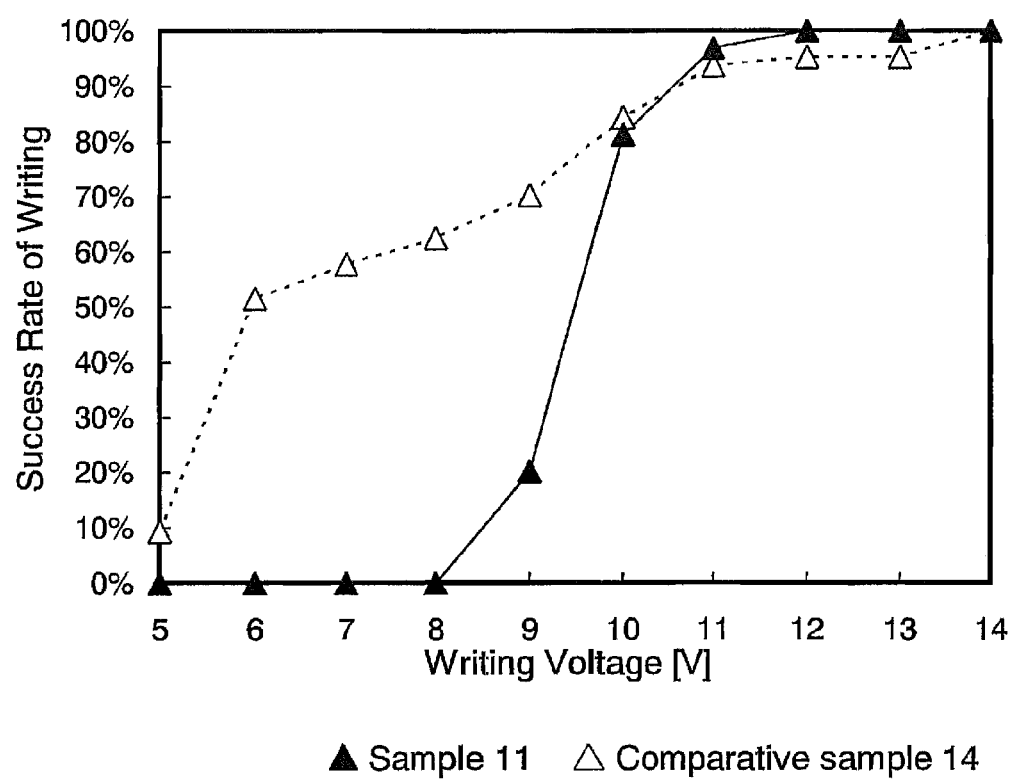
FIG. 18 is a graph showing results of an experiment using memory elements of the present invention.

FIG. 18 shows writing characteristics of the sample 11 and the comparative sample 14. A horizontal axis indicates writing voltage whereas a vertical axis indicate a success rate of writing data at the writing voltage or less. Further, writing time was set to be 100 ms. Sixty four memory elements formed in the respective sample 11 and the comparative sample 14 were evaluated. In the memory elements of the sample 11, writing was started at 9 V, and a success rate of writing reached 100% at 12 V. On the other hand, in the memory elements of the comparative sample 14, writing was started at 5 V; however, a success rate of writing was slowly increased with respect to increase in voltage, and 14 V of writing voltage was required until the success rate of writing reached 100%.

Accordingly, providing the insulating layer between the first conductive layer and the organic compound layer to be in contact with the first conductive layer makes it possible to reduce variations in voltage required for writing data.

(Embodiment 5)

In this embodiment, writing characteristics of memory elements having different insulating layers will be described with reference to FIGS. 17A and 17B and FIGS. 19A to 19C.

Figure 19A:
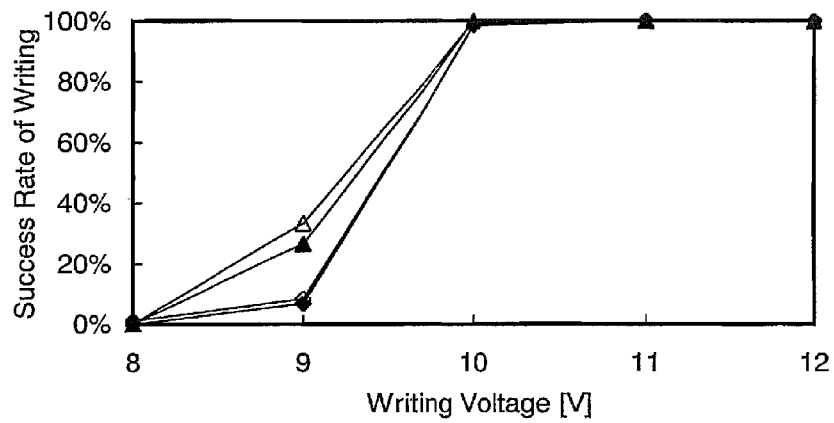
FIGS. 19A to 19C are graphs showing results of an experiment using memory elements of the present invention.
Figure 19B:
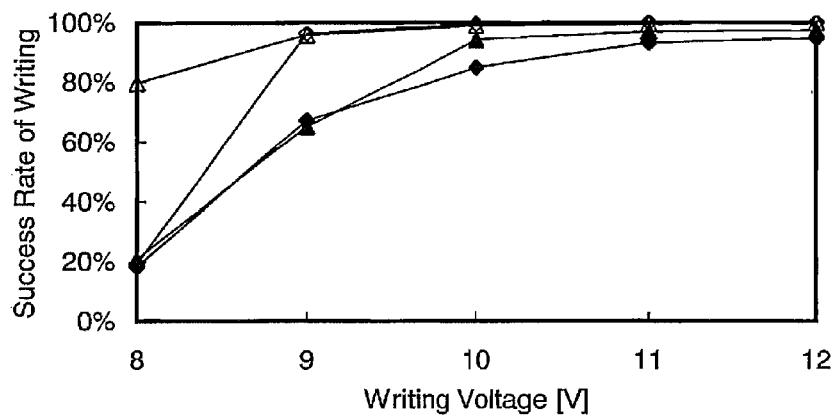
Figure 19C:
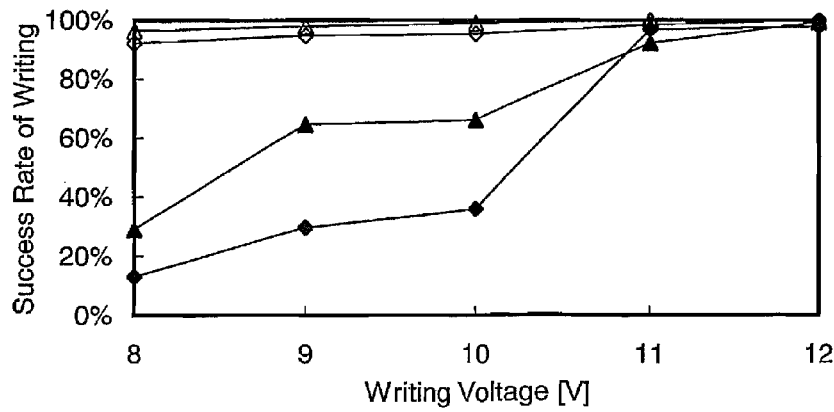

With respect to samples 12 to 14 having memory elements whose insulating layers are made from lithium salt halide, writing characteristics in accordance with kinds of lithium salt halide and areas of top surfaces of the memory elements, are shown in FIGS. 19A to 19C.

Each of the samples 12 to 14 has a memory element 55 as shown in FIG. 17A, which includes a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

In each of the samples 12 to 14, a glass substrate was used as the substrate 50, a titanium layer with a thickness of 100 nm was formed as the first conductive layer 51 by sputtering, the organic compound layer 53 was formed using TPAQn with a thickness of 10 nm by evaporation, and an aluminum layer with a thickness of 200 nm was formed as the second conductive layer 54 by evaporation. A top surface, in which the first conductive layer 51 and the second conductive layer 54 of each of the samples 12 to 14 are overlapped with each other, was a square shape and one side of the top surface was set to be 2 μm or 3 μm.

Data was written in the memory elements of the samples 12 to 14 by applying 8 to 12 V. In this case, writing time was set to be 10 ms.

With respect to the memory element of the sample 12, a lithium fluoride layer with a thickness of 1 nm formed by evaporation was used as the insulating layers 52. Success rates of writing with respect to writing voltage in this case are shown in FIG. 19A.

With respect to the memory element of the sample 13, a lithium chloride layer with a thickness of 1 nm formed by evaporation was used as the insulating layers 52. Success rates of writing with respect to writing voltage in this case are shown in FIG. 19B.

With respect to the memory element of the sample 14, a lithium bromide layer with a thickness of 1 nm formed by evaporation was used as the insulating layers 52. Success rates of writing with respect to writing voltage in this case are shown in FIG. 19C.

Structures of the memory elements of the samples 12 to 14 are shown in Table 4.

TABLE 4

| | First conductive layer (film thickness) | Insulating layer (film thickness) | Organic compound layer (film thickness) | Second conductive layer (film thickness) |
|---|---|---|---|---|
| Sample 12 | Ti (100 nm) | LiF (1 nm) | TPAQn (10 nm) | Al (200 nm) |
| Sample 13 | Ti (100 nm) | LiCl (1 nm) | TPAQn (10 nm) | Al (200 nm) |
| Sample 14 | Ti (100 nm) | LiBr (1 nm) | TPAQn (10 nm) | Al (200 nm) |

As compared to the sample 13 having the insulating layer made from lithium chloride (FIG. 19B) and the sample 14 having the insulating layer made from lithium bromide (FIG. 19C), the success rates of writing of the sample 12 having the insulating layer made from lithium fluoride (FIG. 9A) were drastically increased. In addition, there were slight variations in success rates of writing with respect to the writing voltage regardless of the area of the top surface of the memory elements. Accordingly, in memory elements each having an insulating layer made from lithium fluoride, variations in writing voltage between the memory elements can be reduced.

(Embodiment 6)

Figure 20A:
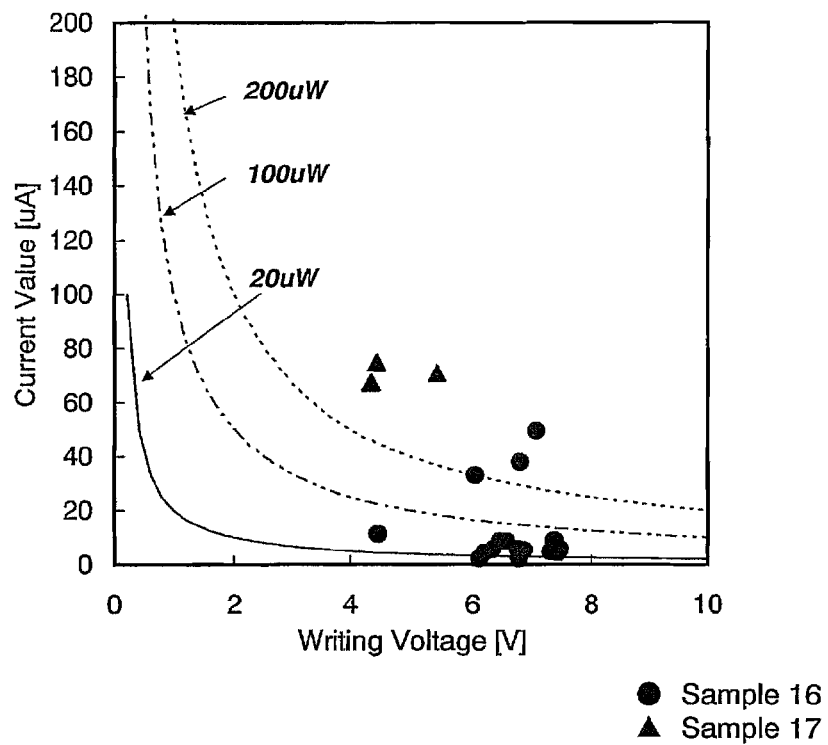
FIGS. 20A and 20B are graphs showing results of an experiment using memory elements of the present invention.
Figure 20B:
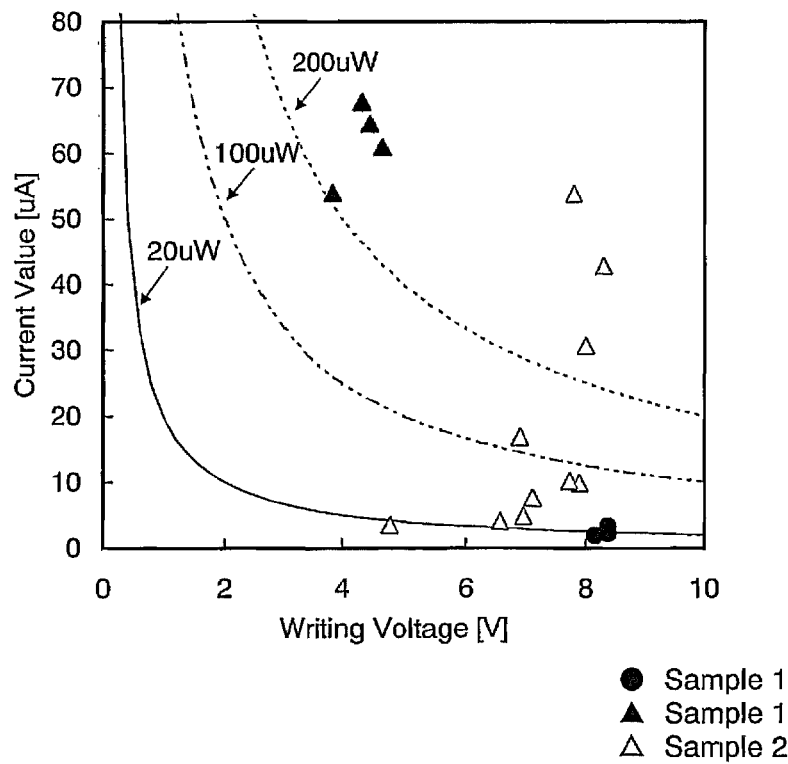

Next, writing voltage and current of memory elements using different insulating layers are shown in FIGS. 20A and 20B. In this embodiment, samples having memory elements including insulating layers made from fluoride salt of alkali earth metal, were evaluated.

Each of the samples 15 to 20 had a memory element as shown in FIG. 17A, which included a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

In each of the samples 15 to 17, a glass substrate was used as the substrate 50, a titanium layer with a thickness of 100 nm was formed as the first conductive layer 51 by sputtering, the organic compound layer 53 was formed using NPB with a thickness of 10 nm by evaporation, and an aluminum layer with a thickness of 200 nm was formed as the second conductive layer 54 by evaporation. A top surface, in which the first conductive layer 51 and the second conductive layer 54 of each of the samples 15 to 17 are overlapped with each other, was a square shape and one side of the top surface was set to be 10 μm.

The memory element of the sample 15 included insulating layers 52 with a thickness of 1 nm, which were formed using magnesium fluoride by evaporation.

The memory element of the sample 16 included insulating layers 52 with a thickness of 1 nm, which were formed using calcium fluoride by evaporation.

The memory element of the sample 17 included insulating layers 52 with a thickness of 1 nm, which were formed using barium fluoride by evaporation.

Structures of the memory elements of the samples 15 to 17 are shown in Table 5.

TABLE 5

| | First conductive layer (film thickness) | Insulating layer (film thickness) | Organic compound layer (film thickness) | Second conductive layer (film thickness) |
|---|---|---|---|---|
| Sample 15 | Ti (100 nm) | MgF$_2$ (1 nm) | NPB (10 nm) | Al (200 nm) |
| Sample 16 | Ti (100 nm) | CaF$_2$ (1 nm) | NPB (10 nm) | Al (200 nm) |
| Sample 17 | Ti (100 nm) | BaF$_2$ (1 nm) | NPB (10 nm) | Al (200 nm) |

Further, memory elements having organic compound layers, which were formed using a different material from those of the samples 15 to 17, were formed as samples 18 to 20. In this case, the organic compound layers are formed using SFDCz as a substitute for NPB. Further, the substrate 50, the first conductive layer 51, and the second conductive layer 54 for each of the samples 18 to 20 were the same as those of the samples 15 to 17.

In the memory element of the sample 18, insulating layers 52 were formed using calcium fluoride to have a thickness of 1 nm by evaporation, and an organic compound layer 53 was formed using SFDCz to have a thickness of 10 nm by evaporation.

In the memory element of the sample 19, insulating layers 52 were formed using barium fluoride to have a thickness of 0.1 nm by evaporation, and an organic compound layer 53 was formed using SFDCz to have a thickness of 10 nm by evaporation.

In the memory element of the sample 20, insulating layers 52 were formed using barium fluoride to have a thickness of 1 nm by evaporation, and an organic compound layer 53 was formed using SFDCz to have a thickness of 10 nm by evaporation.

Structures of the memory elements of the samples 18 to 20 are shown in Table 6.

TABLE 6

| | First conductive layer (film thickness) | Insulating layer (film thickness) | Organic compound layer (film thickness) | Second conductive layer (film thickness) |
|---|---|---|---|---|
| Sample 18 | Ti (100 nm) | CaF$_2$ (1 nm) | SFDCz (10 nm) | Al (200 nm) |
| Sample 19 | Ti (100 nm) | BaF$_2$ (0.1 nm) | SFDCz (10 nm) | Al (200 nm) |
| Sample 20 | Ti (100 nm) | BaF$_2$ (1 nm) | SFDCz (10 nm) | Al (200 nm) |

Writing voltage and current of the samples 15 to 17 are shown in FIG. 20A whereas voltage and current of the samples 18 to 20 are shown in FIG. 20B. Further, in each of FIGS. 20A and 20B, equivalent power curves of 20 μW, 100 μW, and 200 μW are shown. A sweep measurement was performed as a writing method, wherein while voltage was increased by 0.1 V from 0 V, an amount of current of each sample was measured at each voltage. Further, applied time of each voltage was set to 100 ms.

As shown in FIG. 20A, and as compared to the sample 17 of the memory element having the insulating layer made from barium fluoride, the amount of current of the sample 16 including the memory element having the insulating layer made from calcium fluoride was lower, though the writing voltage was higher. Accordingly, power consumption can be reduced. Further, since initial short-circuiting was generated in the memory element of the sample 15, there are no plots in FIG. 20A. A state in which data had been already written in a memory element prior to writing data in the memory element by applying voltage, is hereinafter referred to as the initial short-circuiting.

In comparing FIG. 20A and FIG. 20B, in the case of forming the organic compound layer by using SFDCz instead of NPB, the memory element of the sample 18 having the insulating layer made from calcium fluoride had lower amount of current than the memory elements of the samples 19 and 20 having the insulating layers made from barium fluoride, though the sample 18 has higher writing voltage. As a consequence, it was possible to reduce power consumption.

As shown in FIG. 20B, in comparing the memory elements of the samples 19 and 20 having the insulating films made from barium fluoride, when the thickness of the insulating layer was reduced like the sample 19, the writing voltage can be reduced.

(Embodiment 7)

Figure 21:
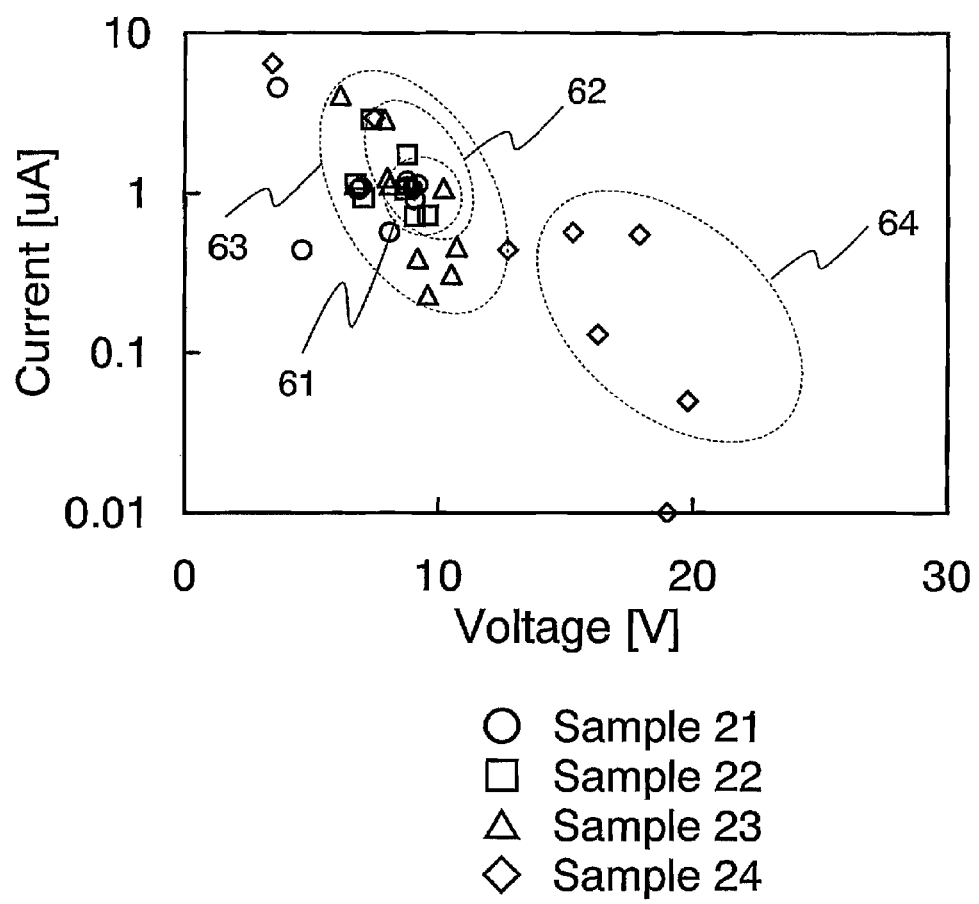
FIG. 21 is a graph showing results of an experiment using memory elements of the present invention.

Next, writing voltage and current of memory elements with respect to thicknesses of insulating layers are shown in FIG. 21.

Each of samples 21 to 24 has a memory element as shown in FIG. 17A, which includes a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

In each of the samples 21 to 24, a glass substrate was used as the substrate 50, a titanium layer with a thickness of 100 nm was formed as the first conductive layer 51 by sputtering, the organic compound layer 53 was formed using NPS with a thickness of 10 nm by evaporation, and an aluminum layer with a thickness of 200 nm was formed as the second conductive layer 54 by evaporation.

The memory element of the sample 21 included insulating layers 52 with a thickness of 1 nm, which were formed using calcium fluoride by evaporation.

The memory element of the sample 22 included insulating layers 52 with a thickness of 2 nm, which were formed using calcium fluoride by evaporation.

The memory element of the sample 23 included insulating layers 52 with a thickness of 3 nm, which were formed using calcium fluoride by evaporation.

The memory element of the sample 24 included insulating layers 52 with a thickness of 5 nm, which were formed using calcium fluoride by evaporation.

Structures of the memory elements of the samples 21 to 24 are shown in Table 7.

TABLE 7

| | First conductive layer (film thickness) | Insulating layer (film thickness) | Organic compound layer (film thickness) | Second conductive layer (film thickness) |
|---|---|---|---|---|
| Sample 21 | Ti (100 nm) | $CaF_2$ (1 nm) | NPB (10 nm) | Al (200 nm) |
| Sample 22 | Ti (100 nm) | $CaF_2$ (2 nm) | NPB (10 nm) | Al (200 nm) |
| Sample 23 | Ti (100 nm) | $CaF_2$ (3 nm) | NPB (10 nm) | Al (200 nm) |
| Sample 24 | Ti (100 nm) | $CaF_2$ (5 nm) | NPB (10 nm) | Al (200 nm) |

Next, a measurement method will be shown below. First, 0 to 3 V of reading voltage was applied to each sample, and presence or absence of a memory element, in which the initial short-circuiting was generated, and a initial short-circuiting position were specified.

Subsequently, data is written in the memory elements in which the initial short-circuiting was not generated, by applying voltage. In this case, voltage, which was increased by using a booster circuit, was set to be writing voltage and applied to the memory element of each sample. At this moment, an operating frequency of the booster circuit was set to be 5 MHz and the writing voltage was set to be 3 V. Next, a sweep measurement was performed, wherein while the voltage was increased by 0.1 V from 0 V to 50 V, the amounts of current of the samples at each voltage were measured. Further, time of applying each voltage was set to be 20 ms.

As shown in FIG. 21, plots of the writing voltage and the amounts of current of the sample 21 are surrounded by a dashed line 61. Plots of writing voltage and amounts of current of the sample 22 are surrounded by a dashed line 62. Plots of writing voltage and amounts of current of the sample 23 are surrounded by a dashed line 63. Plots of writing voltage and amounts of current of the sample 24 are surrounded by a dashed line 64. When the plots of the samples 21 to 23 are compared to the plots of the sample 24, the writing voltage of the memory elements having the thin insulating layers (with the thicknesses of 1 to 3 nm) is lowered while the amount of current thereof is increased. However, there are almost no changes in the current-voltage characteristics when data was written in the samples 21 to 23. Accordingly, it is known that when a thickness of an insulating layer of a memory element is set to be 1 to 3 nm, writing voltage and an amount of current can be stabilized.

(Embodiment 8)

Figure 22:
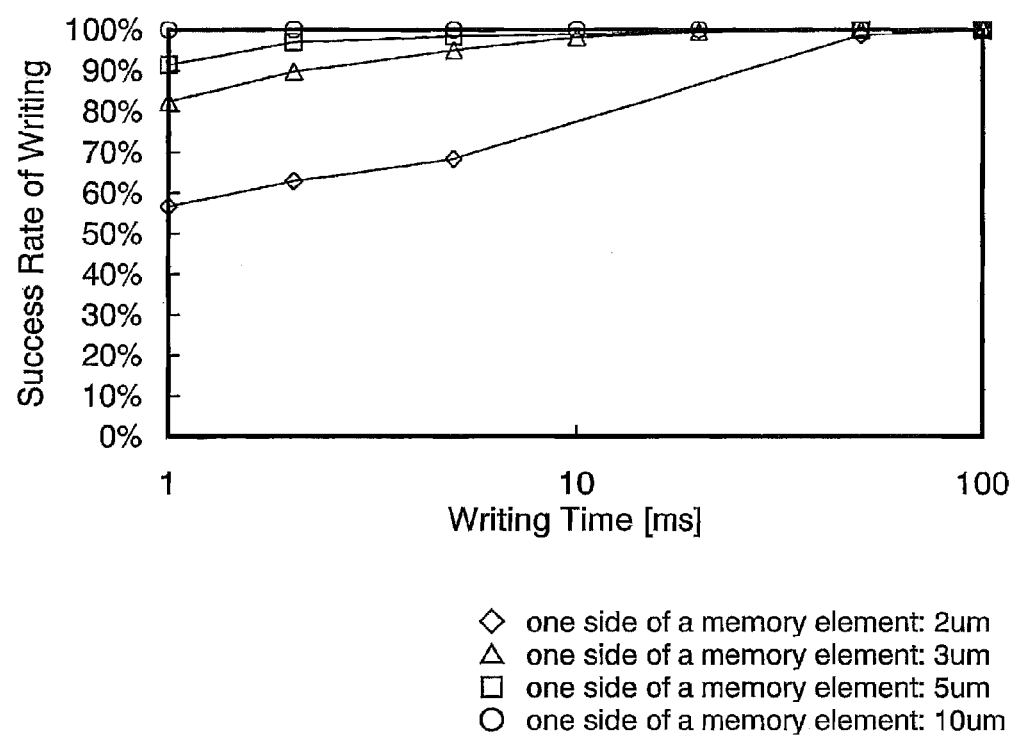
FIG. 22 is a graph showing results of an experiment using memory elements of the present invention.

In this embodiment, measurement results of writing time and writing characteristics of memory elements having different insulating layers, are shown in Tables 9 to 11 and FIG. 22.

Each of samples 25 to 27 has a memory element as shown in FIG. 17A, which includes a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

In each of the samples 25 to 27, a glass substrate was used as the substrate 50, a titanium layer with a thickness of 100 nm was formed as the first conductive layer 51 by sputtering, the organic compound layer 53 was formed using NPB with a thickness of 10 nm by evaporation, and an aluminum layer with a thickness of 200 nm was formed as the second conductive layer 54 by evaporation. A top surface, in which the first conductive layer 51 and the second conductive layer 54 of each of the samples 25 to 27 are overlapped with each other, was a square shape and one side of the top surface was set to be 2 μm, 3 μm, 5 μm, or 10 μm.

The memory element of the sample 25 included insulating layers 52 with a thickness of 1 nm, which were formed using calcium fluoride by evaporation.

The memory element of the sample 26 included insulating layers 52 with a thickness of 1 nm, which were formed using barium fluoride by evaporation.

The memory element of the sample 27 included insulating layers 52 with a thickness of 1 nm, which were formed using lithium fluoride by evaporation.

Structures of the memory elements of the samples 25 to 27 are shown in Table 8.

TABLE 8

| | First conductive layer (film thickness) | Insulating layer (film thickness) | Organic compound layer (film thickness) | Second conductive layer (film thickness) |
|---|---|---|---|---|
| Sample 25 | Ti (100 nm) | $CaF_2$ (1 nm) | NPB (10 nm) | Al (200 nm) |
| Sample 26 | Ti (100 nm) | $BaF_2$ (1 nm) | NPB (10 nm) | Al (200 nm) |
| Sample 27 | Ti (100 nm) | LiF (1 nm) | NPB (10 nm) | Al (200 nm) |

Next, a measurement method will be shown below. First, 3 V of reading voltage was applied to each sample, and presence or absence of a memory element in which the initial short-circuiting was generated and a initial short-circuiting position were specified.

Subsequently, data is written in the memory elements in which the initial short-circuiting was not generated, by applying voltage. In this case, voltage, which was increased by using a booster circuit, was set to be writing voltage and applied to the memory element of each sample. At this moment, an operating frequency of the booster circuit was set to be 5 MHz and the writing voltage was set to be 3 V.

First, voltage is applied to the memory elements of the respective samples for 1 ms. Voltage is further applied to the memory element in which data could not be written for 2 ms, 5 ms, 10 ms, 20 ms, 50 ms, and 100 ms as writing time so as to write data therein.

Evaluation results of the sample 25, in which data was written, are shown in Table 9. Evaluation results of the sample 26, in which data was written, are shown in Table 10. Evaluation results of the sample 27, in which data was written, are shown in Table 11.

TABLE 9

| | Length of one side of memory element (μm) | Number of evaluated element | Rate of initial short-circuiting (%) | Success rate of writing (%) | | |
|---|---|---|---|---|---|---|
| | | | | 1 ms | 10 ms | 100 ms |
| Sample 25 | 2 × 2 | 1536 | 0 | 0 | 5.6 | 99.87 |
| | 3 × 3 | 1536 | 0 | 0.07 | 11.65 | 100 |

TABLE 9-continued

| | Length of one side of memory element (μm) | Number of evaluated element | Rate of initial short-circuiting (%) | Success rate of writing (%) | | |
|---|---|---|---|---|---|---|
| | | | | 1 ms | 10 ms | 100 ms |
| | 5 × 5 | 512 | 0 | 0 | 28.52 | 100 |
| | 10 × 10 | 512 | 0 | 0.39 | 43.95 | 100 |

TABLE 10

| | Length of one side of memory element (μm) | Number of evaluated element | Rate of initial short-circuiting (%) | Success rate of writing (%) | | |
|---|---|---|---|---|---|---|
| | | | | 1 ms | 10 ms | 100 ms |
| Sample 26 | 2 × 2 | 1536 | 0 | 0 | 13.09 | 98.63 |
| | 3 × 3 | 1536 | 0 | 0.13 | 26.5 | 100 |
| | 5 × 5 | 512 | 0 | 0.59 | 44.14 | 100 |
| | 10 × 10 | 512 | 0 | 1.17 | 46.29 | 100 |

TABLE 11

| | Length of one side of memory element (μm) | Number of evaluated element | Rate of initial short-circuiting (%) | Success rate of writing (%) | | |
|---|---|---|---|---|---|---|
| | | | | 1 ms | 10 ms | 100 ms |
| Sample 27 | 2 × 2 | 1536 | 0.39 | 56.64 | — | 100 |
| | 3 × 3 | 1536 | 0.52 | 82.42 | 98.18 | 100 |
| | 5 × 5 | 512 | 0.78 | 91.41 | — | 100 |
| | 10 × 10 | 512 | 1.17 | 100 | 100 | 100 |

As shown in Table 9 and Table 10, the memory element of the sample 26 having the insulating layer made from barium fluoride and the memory element of the sample 25 having the insulating layer made from calcium fluoride have almost the same writing characteristics. On the other hand, as shown in Tables 9 to 11, the memory element of the sample 27 having the insulating layer made from lithium fluoride has higher success rate of writing than the memory element of the sample 25 having the insulating layer made from calcium fluoride and the memory element of the sample 26 having the insulating layer made from barium fluoride.

Next, a relation between the success rate of writing of the sample 27 whose success rate of writing was high, and writing time is shown in FIG. 22. According to FIG. 22, in a case of a memory element with 10 μm on a side, a success rate of writing of this memory element reaches 100% for 1 ms of writing time.

As described above, a success rate of writing can be improved by using a memory element having an insulating layer made from lithium fluoride. In particular, the memory element having the insulating layer made from lithium fluoride has a high success rate of writing even for a short period of writing time, and hence, this memory element is suitable for a semiconductor device, which is required to be operated at high speed.

(Embodiment 9)

In this embodiment, measurement results of writing characteristics of memory elements having different organic compound layers will be described with reference to Table 13 and FIG. 23.

Each of samples 28 to 33 has a memory element as shown in FIG. 17A, which includes a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

In each of the samples 28 to 33, a glass substrate was used as the substrate 50, a titanium layer with a thickness of 100 nm was formed as the first conductive layer 51 by sputtering, calcium fluoride layers with a thickness of 1 nm were formed as the insulating layers 52 by evaporation, and an aluminum layer with a thickness of 200 nm was formed as the second conductive layer 54 by evaporation. A top surface, in which the first conductive layer 51 and the second conductive layer 54 of each of the samples 28 to 30 are overlapped with each other, was a square shape and one side of the top surface was set to be 5 μm.

The memory element of the sample 28 included an organic compound layer 53 with a thickness of 10 nm, which was formed using NPB by evaporation.

The memory element of the sample 29 included an organic compound layer 53 with a thickness of 10 nm, which was formed using t-BuDNA by evaporation.

The memory element of the sample 30 included an organic compound layer 53 with a thickness of 10 nm, which was formed using TPAQn by evaporation.

Structures of the memory elements of the samples 28 to 30 are shown in Table 12.

TABLE 12

| | First conductive layer (film thickness) | Insulating layer (film thickness) | Organic compound layer (film thickness) | Second conductive layer (film thickness) |
|---|---|---|---|---|
| Sample 28 | Ti (100 nm) | CaF$_2$ (1 nm) | NPB (10 nm) | Al (200 nm) |

TABLE 12-continued

| | First conductive layer (film thickness) | Insulating layer (film thickness) | Organic compound layer (film thickness) | Second conductive layer (film thickness) |
|---|---|---|---|---|
| Sample 29 | Ti (100 nm) | CaF$_2$ (1 nm) | t-BuDNA (10 nm) | Al (200 nm) |
| Sample 30 | Ti (100 nm) | CaF$_2$ (1 nm) | TPAQn (10 nm) | Al (200 nm) |

First, rates of initial short-circuiting of the memory elements of the respective samples (hereinafter, referred to as initial short-circuiting rates) when applying reading voltage to the respective samples and success rates of writing when applying writing voltage of 5 V to 14 V to the memory elements in which short-circuiting was not generated, are shown in Table 13. Note that there were two conditions of writing time of 10 ms and 100 ms.

TABLE 13

| | Sample 28 | Sample 29 | Sample 30 |
|---|---|---|---|
| Initial short-circuiting rate | 1/3072 | 0/4096 | 1/4096 |
| Success rate of writing (14 V) | 1724/2048 | 4055/4096 | 3070/3072 |

As shown in Table 13, the initial short-circuiting rates of the respective samples are extremely low in the cases of using the organic compound layer made from NPB, the organic compound layer made from t-BuDNA, and the organic compound layer made from TPAQn for the memory elements.

The success rates of writing at 5 V to 14V of the sample 29 including the memory element having the organic compound layer made from t-BuDNA and the sample 30 including the memory element having the organic compound layer made from TPAQn were higher than that of the sample 28 including the memory element having the organic compound layer made from NPB.

Figure 23:
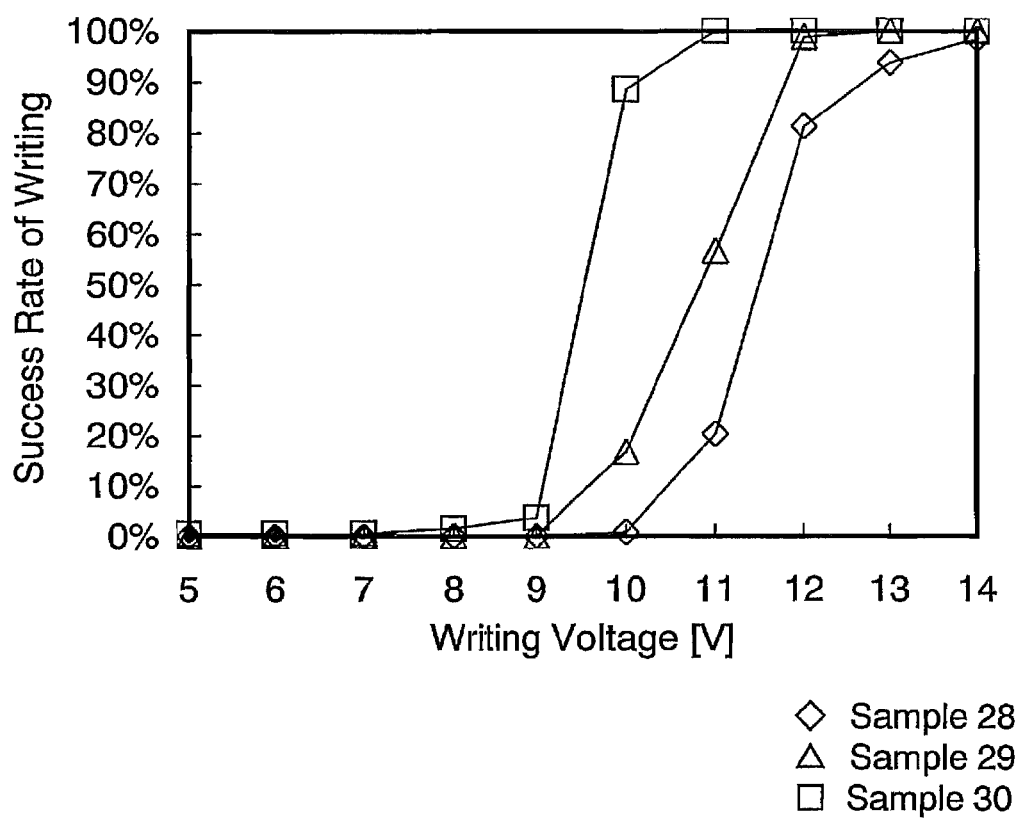
FIG. 23 is a graph showing results of an experiment using memory elements of the present invention.

Next, voltage-current characteristics when data was written in the memory elements of the samples 28 to 30 by applying voltage thereto are shown in FIG. 23. Note that, a top surface of each of the memory elements of the respective samples was a square with 5 μm on a side and writing time was set to be 10 ms.

As shown in FIG. 23, the writing voltage of the sample 30 including the memory element having the organic compound layer made from TPAQn was lowest. The writing voltage of the sample 29 including the memory element having the organic compound layer made from t-BuDNA was increased higher than that of the sample 30. The writing voltage of the sample 28 including the memory element having the organic compound layer made from NPB was increased higher than that of the sample 29. Accordingly, by using an organic compound layer made from TPAQn, writing voltage of a memory element can be reduced.

(Embodiment 10)

In this embodiment, measurement results of writing voltage and current when data was written in memory elements having different organic compound layers by applying voltage, will be described with reference to FIGS. 24A and 24B, as well as Embodiment 9.

In this embodiment, samples including memory elements having organic compound layers made from different materials from one another were manufactured. Measurement results of these samples are shown in FIGS. 24A and 24B. FIG. 24A shows writing voltage and amounts of current of samples 31 to 34 including memory elements having organic compound layers made from hole transporting materials. FIG. 24B shows writing voltage and amounts of current of samples 35 to 40 including memory elements having organic compound layers made from electron transporting materials.

Each of samples 31 to 40 has a memory element as shown in FIG. 17A, which includes a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

In each of the samples 31 to 40, a glass substrate was used as the substrate 50, a titanium layer with a thickness of 100 nm was formed as the first conductive layer 51 by sputtering, a calcium fluoride layer with a thickness of 1 nm was formed as the insulating layers 52 by evaporation, and an aluminum layer with a thickness of 200 nm was formed as the second conductive layer 54 by evaporation. A top surface, in which the first conductive layer 51 and the second conductive layer 54 of each of the samples 31 to 40 are overlapped with each other, was a square shape and one side of the top surface was set to be 2 μm, 3 μm, 5 μm, or 10 μm.

The memory element of the sample 31 included an organic compound layer 53 with a thickness of 10 nm, which was formed using NPB by evaporation.

The memory element of the sample 32 included an organic compound layer 53 with a thickness of 10 nm, which was formed using SFDCz by evaporation.

The memory element of the sample 33 included an organic compound layer 53 with a thickness of 10 nm, which was formed using PVK by evaporation.

The memory element of the sample 34 included an organic compound layer 53 with a thickness of 10 nm, which was formed using TCTA by evaporation.

The memory element of the sample 35 included an organic compound layer 53 with a thickness of 10 nm, which was formed using InTz by evaporation.

The memory element of the sample 36 included an organic compound layer 53 with a thickness of 10 nm, which was formed using TPQ by evaporation.

The memory element of the sample 37 included an organic compound layer 53 with a thickness of 10 nm, which was formed using Alq by evaporation.

The memory element of the sample 38 included an organic compound layer 53 with a thickness of 10 nm, which was formed using BAlq by evaporation.

The memory element of the sample 39 included an organic compound layer 53 with a thickness of 10 nm, which was formed using TPAQn by evaporation.

The memory element of the sample 40 included an organic compound layer 53 with a thickness of 10 nm, which was formed using t-BuDNA by evaporation.

Structures of the memory elements of the samples 31 to 40 are shown in Table 14.

TABLE 14

| | First conductive layer (film thickness) | Insulating layer (film thickness) | Organic compound layer (film thickness) | Second conductive layer (film thickness) |
|---|---|---|---|---|
| Sample 31 | Ti (100 nm) | CaF$_2$ (1 nm) | NPB (10 nm) | Al (200 nm) |
| Sample 32 | Ti (100 nm) | CaF$_2$ (1 nm) | SFDCz (10 nm) | Al (200 nm) |
| Sample 33 | Ti (100 nm) | CaF$_2$ (1 nm) | PVK (10 nm) | Al (200 nm) |

TABLE 14-continued

| | First conductive layer (film thickness) | Insulating layer (film thickness) | Organic compound layer (film thickness) | Second conductive layer (film thickness) |
|---|---|---|---|---|
| Sample 34 | Ti (100 nm) | CaF$_2$ (1 nm) | TCTA (10 nm) | Al (200 nm) |
| Sample 35 | Ti (100 nm) | CaF$_2$ (1 nm) | InTz (10 nm) | Al (200 nm) |
| Sample 36 | Ti (100 nm) | CaF$_2$ (1 nm) | TPQ (10 nm) | Al (200 nm) |
| Sample 37 | Ti (100 nm) | CaF$_2$ (1 nm) | Alq (10 nm) | Al (200 nm) |
| Sample 38 | Ti (100 nm) | CaF$_2$ (1 nm) | BAlq (10 nm) | Al (200 nm) |
| Sample 39 | Ti (100 nm) | CaF$_2$ (1 nm) | TPAQn (10 nm) | Al (200 nm) |
| Sample 40 | Ti (100 nm) | CaF$_2$ (1 nm) | t-BuDNA (10 nm) | Al (200 nm) |

Note that, in this case, a sweep measurement was performed as a writing method, wherein while voltage was increased by 0.1 V from 0 V, an amount of current of each sample was measured at each voltage. Further, time of applying each voltage was set to be 100 ms.

Figure 24A:
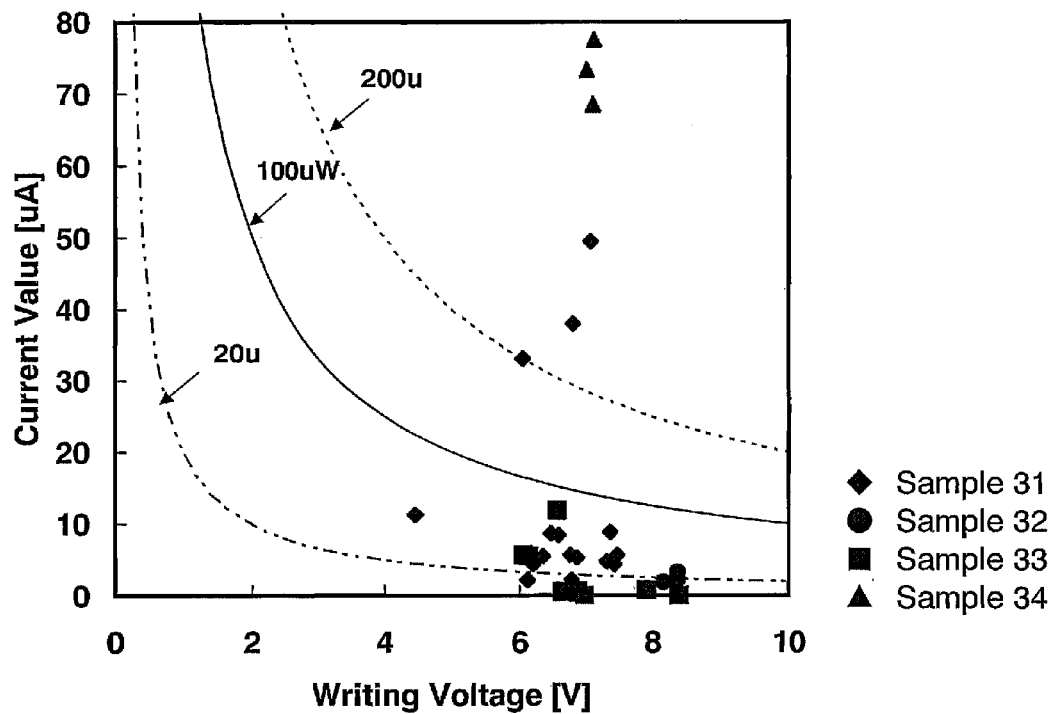
FIGS. 24A and 24B are graphs showing results of an experiment using memory elements of the present invention.
Figure 24B:
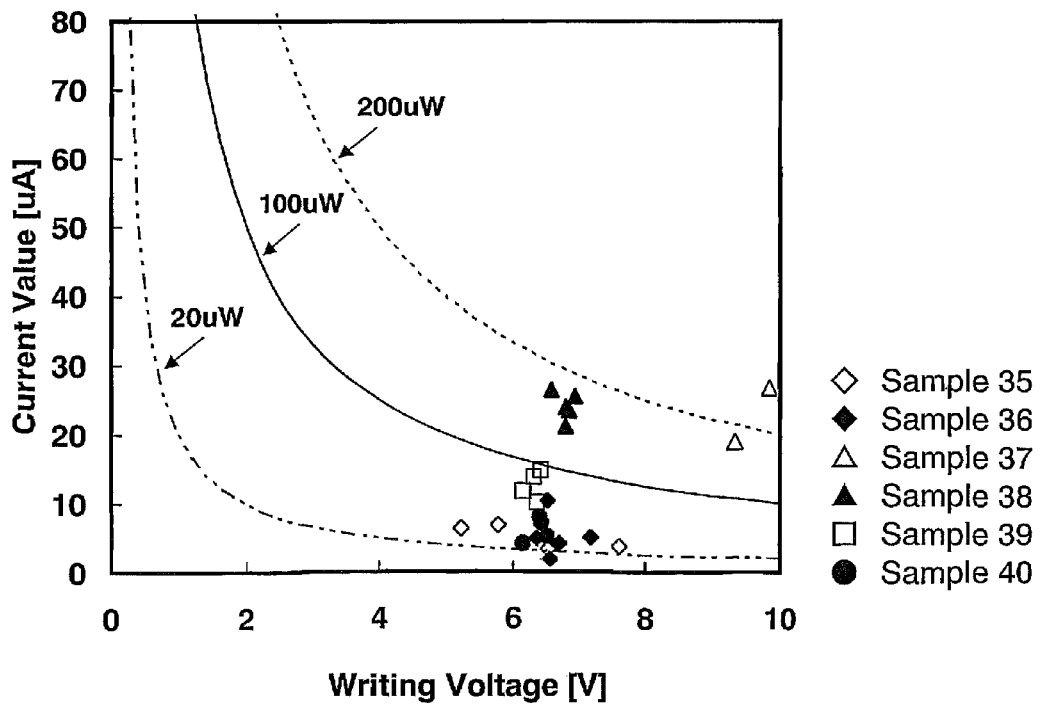

As shown in FIG. 24A, the writing voltage of the sample 34 including the memory element having the organic compound layer made from TCTA was drastically increased. On the other hand, plots of writing voltage of the sample 31 including the memory element having the organic compound layer made from NPB, plots of the sample 32 including the memory element having the organic compound layer made from SFDCz, and plots of the sample 33 including the memory element having the organic compound layer made from PVK are positioned under an equivalent power curve of 200 μW. Therefore, by using memory elements having such organic compound layers, power consumption of a semiconductor device can be reduced.

As shown in FIG. 24A, the plots of the writing voltage of the sample 37 including the memory element having the organic compound layer made from Alq and the sample 38 including the memory element having the organic compound layer made from BAlq were placed almost under the equivalent power curve of 200 μW. Further, the plots of the writing voltage of the sample 35 including the memory element having the organic compound layer made from InTz, the plots of the sample 36 including the memory element having the organic compound layer made from TPQ, the plots of the sample 39 including the memory element having the organic compound layer made from TPAQn, and the plots of the sample 40 including the memory element having the organic compound layer made from t-BuDNA, were placed under an equivalent power curve of 100 μW. Accordingly, by using the memory elements having these organic compound layers, power consumption of a semiconductor device can be reduced.

(Embodiment 11)

In this embodiment, measurement results of current-voltage characteristics when data was written in a memory element in which different organic compound layers were laminated, by applying voltage thereto, are shown in Table 15.

A sample 41 was a memory element as shown in FIG. 17A, which included a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

In this case, the memory element of the sample 41 included an organic compound layer formed of BCP with a thickness of 10 nm by evaporation and another organic compound layer formed of NPB with a thickness of 10 nm by evaporation, which was laminated over the organic compound layer of BCP.

In the memory element 41, a glass substrate was used as the substrate 50, a titanium layer with a thickness of 100 nm was formed as the first conductive layer 51 by sputtering, a calcium fluoride layer with a thickness of 1 nm was formed as the insulating layers 52 by evaporation, and an aluminum layer with a thickness of 200 nm was formed as the second conductive layer 54 by evaporation.

A top surface of the memory element was a square. Writing voltage and amounts of current of the memory element with respect to one side of the memory element are shown in Table 15.

TABLE 15

| | Length of one side of memory element (μm) | Voltage (V) | Current (μA) |
|---|---|---|---|
| Sample 41 | 2 × 2 | 18.7 | 2.7 |
| | 2 × 2 | 24.3 | 2.4 |
| | 2 × 2 | 20 | 7.4 |
| | 3 × 3 | 22.3 | 4.6 |
| | 3 × 3 | 23.1 | 4 |
| | 3 × 3 | 21.8 | 3.3 |
| | 5 × 5 | 20.2 | 6.8 |
| | 5 × 5 | 20.7 | 5.8 |
| | 10 × 10 | 18.6 | 8.9 |
| | 10 × 10 | — | — |

As shown in Table 15, data could be written in the memory element in which the organic compound layers are laminated. Further, it was possible to reduce the amount of current when data was written in the memory element, though the writing voltage remained high. Furthermore, there were slight variations in writing voltage.

(Embodiment 12)

In this embodiment, changes of writing voltage and an amount of current with respect to changes in an area of a top surface of a memory element and a thickness of an organic compound layer, will be described with reference to FIG. 25, FIG. 26, and FIG. 27.

Each of samples 42 to 48 has a memory element as shown in FIG. 17A, which includes a first conductive layer 51 formed over a substrate 50, insulating layers 52 formed over the first conductive layer 51, an organic compound layer 53 formed over the first conductive layer 51 and the insulating layers 52, and a second conductive layer 54 formed over the organic compound layer 53.

In each of the samples 42 to 48, a glass substrate was used as the substrate 50, a titanium layer with a thickness of 100 nm was formed as the first conductive layer 51 by sputtering, a calcium fluoride layer with a thickness of 1 nm was formed as the insulating layers 52 by evaporation, and an aluminum layer with a thickness of 200 nm was formed as the second conductive layer 54 by evaporation.

The memory element of the sample 42 included an organic compound layer 53 with a thickness of 5 nm, which was formed using NPB by evaporation.

The memory element of the sample 43 included an organic compound layer 53 with a thickness of 10 nm, which was formed using NPB by evaporation.

The memory element of the sample 44 included an organic compound layer 53 with a thickness of 10 nm, which was formed using NPB by evaporation.

The memory element of the sample 45 included an organic compound layer 53 with a thickness of 20 nm, which was formed using NPB by evaporation.

The memory element of the sample 46 included an organic compound layer 53 with a thickness of 30 nm, which was formed using NPB by evaporation.

The memory element of the sample 47 included an organic compound layer 53 with a thickness of 40 nm, which was formed using NPB by evaporation.

The memory element of the sample 48 included an organic compound layer 53 with a thickness of 50 nm, which was formed using NPB by evaporation.

Structures of the memory elements of the samples 42 to 48 are shown in Table 16.

TABLE 16

| | First conductive layer (film thickness) | Insulating layer (film thickness) | Organic compound layer (film thickness) | Second conductive layer (film thickness) |
|---|---|---|---|---|
| Sample 42 | Ti (100 nm) | $CaF_2$ (1 nm) | NPB (5 nm) | Al (200 nm) |
| Sample 43 | Ti (100 nm) | $CaF_2$ (1 nm) | NPB (10 nm) | Al (200 nm) |
| Sample 44 | Ti (100 nm) | $CaF_2$ (1 nm) | NPB (10 nm) | Al (200 nm) |
| Sample 45 | Ti (100 nm) | $CaF_2$ (1 nm) | NPB (20 nm) | Al (200 nm) |
| Sample 46 | Ti (100 nm) | $CaF_2$ (1 nm) | NPB (30 nm) | Al (200 nm) |
| Sample 47 | Ti (100 nm) | $CaF_2$ (1 nm) | NPB (40 nm) | Al (200 nm) |
| Sample 48 | Ti (100 nm) | $CaF_2$ (1 nm) | NPB (50 nm) | Al (200 nm) |

With respect to the sample 42, memory elements each having a square top surface, in which the first conductive layer 51 and second conductive layer 54 are overlapped with each other and one side was set to be 2 μm, 3 μm, 5 μm, or 10 μm, were manufactured. A sweep measurement was performed as a writing method, wherein while voltage was increased by 0.1 V from 0 V, an amount of current of each sample was measured at each voltage. Note that, time of applying voltage was set to be 100 ms.

Figure 25:
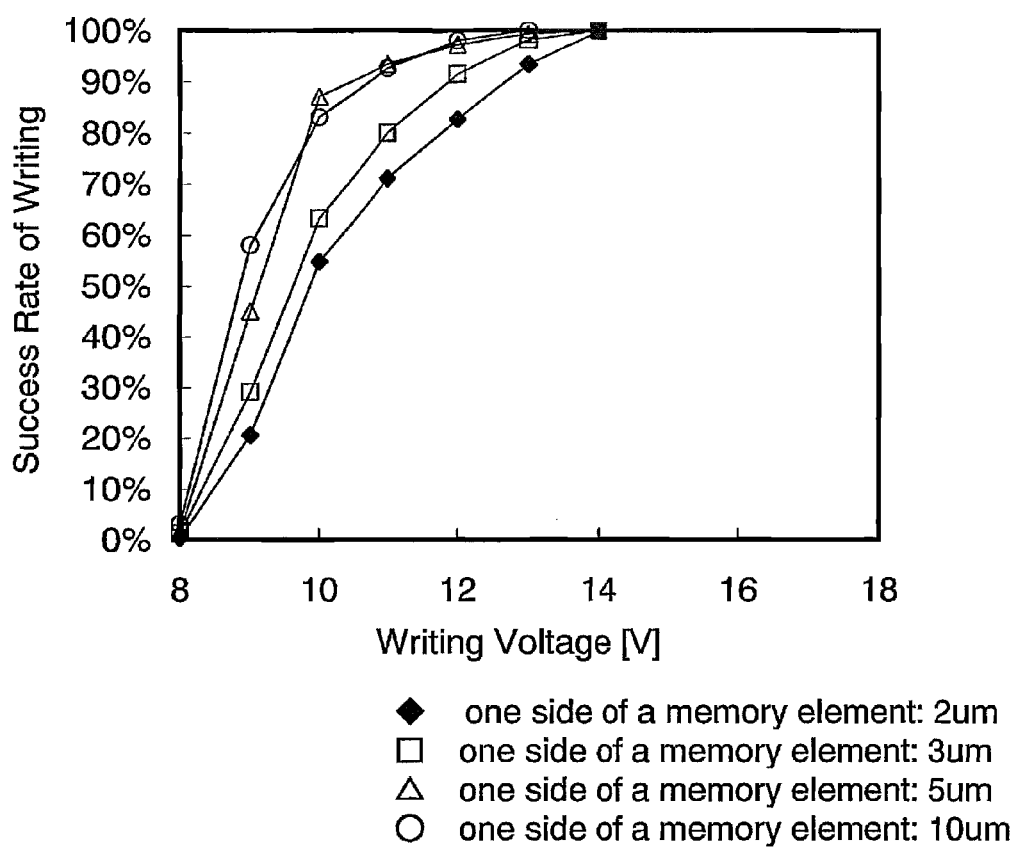
FIG. 25 is a graph showing results of an experiment using memory elements of the present invention.

FIG. 25 shows measurement results of writing voltage and writing characteristics of the memory elements having the structure of the sample 42, wherein one side of each memory element was set to be 2 μm, 3 μm, 5 μm, or 10 μm.

As shown in FIG. 25, as the length of one side of the memory element is increased, the writing characteristics can be improved. The same tendency can be confirmed in the sample 43 and the evaluated results where writing time was changed, though not shown in the drawings.

Figure 26:
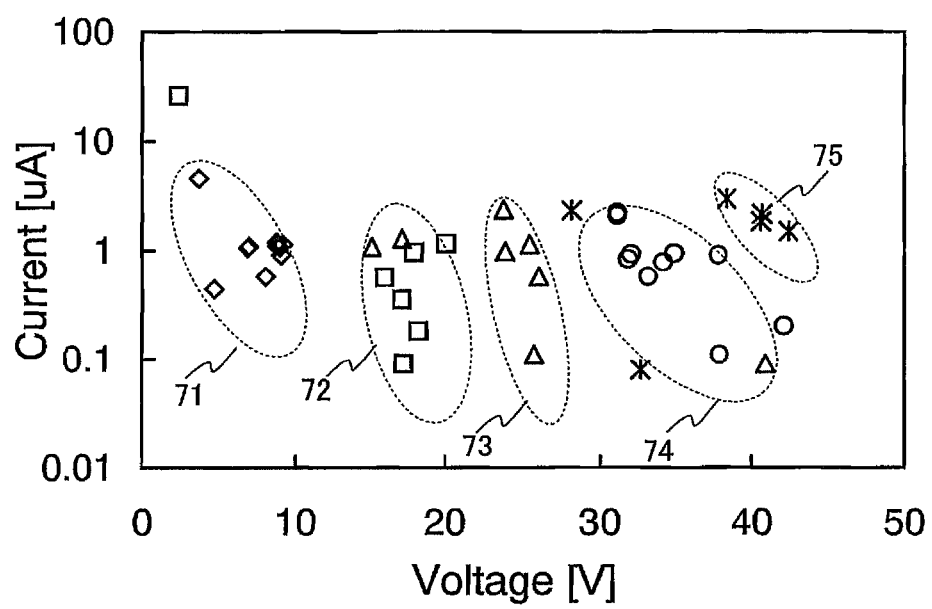
FIG. 26 is a graph showing results of an experiment using memory elements of the present invention.
Figure 27:
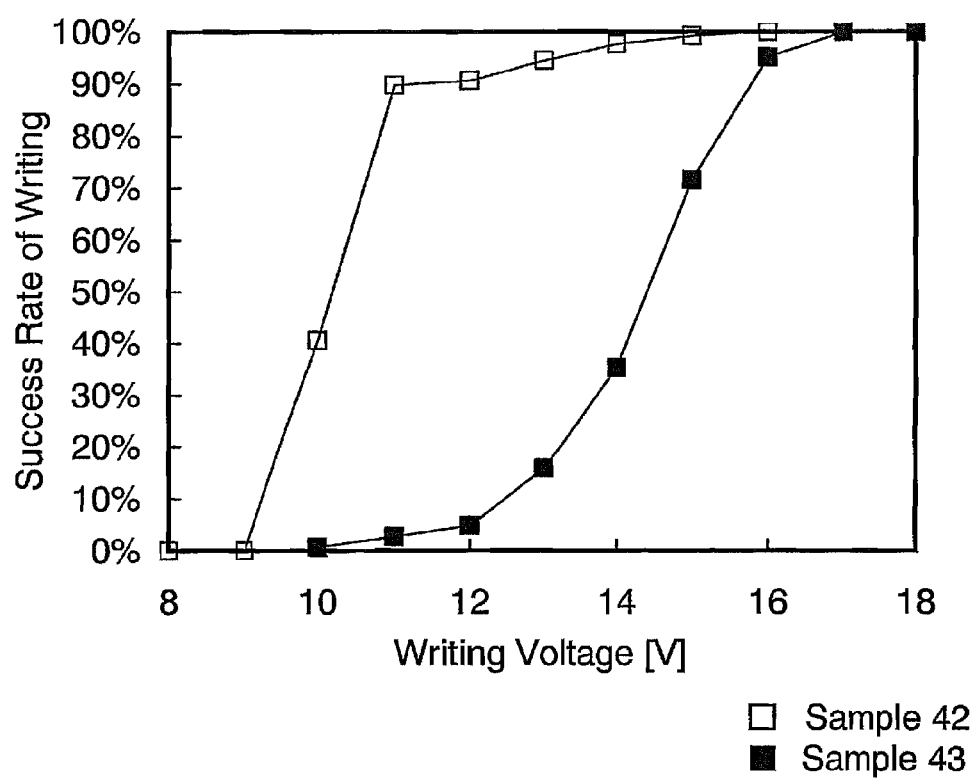
FIG. 27 is a graph showing results of an experiment using memory elements of the present invention.

Next, measurement results of writing voltage, amounts of current, and writing characteristics when a thickness of an organic compound layer was changed, are shown in FIG. 26 and FIG. 27.

Writing voltage and amounts of current when writing data in the memory elements of the samples 44 to 48 by applying voltage are shown in FIG. 26. In FIG. 26, plots surrounded by a dashed line 71 are plots of the sample 44, plots surrounded by a dashed line 72 are plots of the sample 45, plots surrounded by a dashed line 73 are plots of the sample 46, plots surrounded by a dashed line 74 are plots of the sample 47, and plots surrounded by a dashed line 75 are plots of the sample 48. Further, there are plots of measurement results of memory elements having different sizes though having the same structure in each of ellipses of the dashed lines. The sizes of the memory elements are larger toward a top left of each ellipse, meanwhile the sizes of the memory elements are smaller toward a bottom right of each ellipse.

According to FIG. 26, as a thickness of an organic compound layer is reduced, the writing voltage is reduced though there are almost no changes in the amount of current. Further, in the memory elements having the same structure, as the top surface of the memory element is reduced, the amount of current is increased though the writing voltage is reduced.

Next, writing voltage and writing characteristics of memory elements when thicknesses of organic compound layers are further reduced, are shown in FIG. 27. Further, one side of the memory element of each of the samples 42 and 43 was set to be 3 μM.

As shown in FIG. 27, in a case where the memory elements have the same length of one side, a success rate of writing at low voltage of the sample 42 including the memory element having an organic compound layer with the thickness of 5 nm is higher than that of the sample 43 including the memory element having the organic compound layer with the thickness of 10 nm. Specifically, data can be written in the sample 42 at about 4 V lower than the voltage required for the sample 43.

This application is based on Japanese Patent Application serial no. 2005-089114 filed in Japan Patent Office on 25th Mar., 2005, and the entire contents of which are hereby incorporated by reference.

EXPLANATION OF REFERENCE

1: central processing unit, 2: detecting portion, 3: detecting element, 4: detection control circuit, 11: power supply circuit, 12: clock generation circuit, 13: data demodulation/modulation circuit, 14: control circuit, 15: interface circuit, 16: memory circuit, 17: bus, 18: antenna, 19: reader/writer, 20: semiconductor device, 21: memory cell, 22: memory cell array, 23: interface, 24: word line driver circuit, 25: bit line driver circuit, 27: insulating layer, 28: conductive layer, 29: organic compound layer, 30: substrate, 31: conductive layer, 32: insulating layer, 33: insulating layer, 34: insulating layer, 35: insulating particle, 36: insulating layer, 37: insulating layer, 38: insulating layer, 39: partition wall (insulating layer), 41: conductive layer, 42: semiconductor layer, 44: diode, 46: resistance element, 47: differential amplifier, 48: transistor, 49: clocked inverter, 50: substrate, 51: conductive layer, 52: insulating layer, 53: organic compound layer, 54: conductive layer, 55: memory element, 56: memory element, 57: partition wall (insulating layer), 80: memory element, 81: conductive layer, 105: insulating layer, 216: memory circuit, 221: memory cell, 222: memory cell array, 223: interface, 224: word line driver circuit, 226: bit line driver circuit, 230: substrate, 240: transistor, 241: memory element, 242: insulating layer, 243: conductive layer, 244: organic compound layer, 245: conductive layer, 246: insulating layer, 247: differential amplifier, 248: insulating layer, 249: partition wall (insulating layer), 24a: row decoder, 24b: level shifter, 250: insulating layer, 251: layer, 252: insulating layer, 253: layer, 354: resistance element, 260: single crystalline semiconductor substrate, 262: field-effect transistor, 264: conductive layer, 26a: column decoder, 26b: circuit, 26c: selector, 28a: conducive layer, 29a: organic compound layer, 32a: insulating layer, 32b: insulating layer, 32c: insulating layer, 350: substrate, 351: layer, 352: memory element portion, 353: conductive layer, 356: memory element portion, 357: conductive layer, 358: conductive layer, 359: conductive particle, 360: conductive layer, 361: conductive layer, 365: substrate, 366: insulating layer, 370: insulating layer, 372: organic compound layer, 373: conductive layer, 374: partition wall (insulating layer), 375: resin, 378: connection terminal, 40a: interlayer insulating layer, 40b: partition wall (insulating layer), 451: transistor, 452: transistor, 461: substrate, 462: adhesive layer, 951: current-voltage characteristic, 952: current-voltage characteristic, 953: current-voltage characteristic, 1302: semiconductor layer, 1303: insulating layer, 1304: gate electrode, 1305: insulating layer, 1308: sidewall (sidewall spacer), 1309: channel protection layer, 1310: low concentration impurity region, 1401: substrate, 1402: gate electrode, 1403: insulating layer, 1404: semiconductor layer, 224a: row decoder, 224b: level shifter, 226a: column decoder, 226b: circuit, 226c: selector, 2700: casing, 2701: panel, 2702: housing, 2703: printed wiring substrate, 2704: operation button, 2705: buttery, 2707: semiconductor device, 2708: connection film, 2709: pixel region, 352a: memory element, 352b: memory element, 356a: memory element, 356b: memory element, 362a: organic compound layer, 362b: organic compound layer, 363a: conductive layer, 363b: conductive layer, 364a: insulating layer, 364b: insulating layer, 371 a: conductive layer, 371 b: conductive layer

What is claimed is:

1. A semiconductor device comprising:
a substrate;
a transistor over the substrate;
a first insulating layer over the transistor;
a first conductive layer over the first insulating layer;
a second conductive layer over the first conductive layer;
an organic compound layer interposed between the first conductive layer and the second conductive layer, the organic compound layer being partially in contact with the first conductive layer; and
a second insulating layer provided between the first conductive layer and the organic compound layer,
wherein the transistor is electrically connected to the first conductive layer,
wherein the second insulating layer has concavity and convexity, and
wherein the concavity of the second insulating layer is in contact with the first conductive layer.

2. The semiconductor device according to claim 1, wherein a thickness of the second insulating layer is 0.1 nm or more and 4 nm or less.

3. The semiconductor device according to claim 1, wherein the second insulating layer is a discontinuous layer.

4. The semiconductor device according to claim 1, wherein the second insulating layer has a striped shape or a reticulated shape.

5. The semiconductor device according to claim 1, wherein the second insulating layer is a continuous layer.

6. The semiconductor device according to claim 1, wherein the second insulating layer covers an upper surface of the first conductive layer.

7. The semiconductor device according to claim 1, further comprising a diode in contact with the first conductive layer or the second conductive layer.

8. The semiconductor device according to claim 1, wherein a material of the organic compound layer is an electron transporting material or a hole transporting material.

9. The semiconductor device according to claim 1, wherein the first conductive layer and the second conductive layer are connected to each other.

10. The semiconductor device according to claim 1, further comprising a transistor electrically connected to an antenna over the substrate.

11. An electronic appliance equipped with the semiconductor device according to claim 1 and at least one of operation buttons, a battery, a panel, and an external terminal.

12. A semiconductor device comprising:
a substrate;
a transistor over the substrate;
a first insulating layer over the transistor;
a first conductive layer over the first insulating layer;
a second conductive layer over the first conductive layer;
an organic compound layer interposed between the first conductive layer and the second conductive layer, the organic compound layer being partially in contact with the first conductive layer;
a second insulating layer provided between the first conductive layer and the organic compound layer; and
a third insulating layer provided between the second conductive layer and the organic compound layer,
wherein the transistor is electrically connected to the first conductive layer,
wherein the second insulating layer has concavity and convexity, and
wherein the concavity of the second insulating layer is in contact with the first conductive layer.

13. The semiconductor device according to claim 12, wherein a thickness of at least one of the second insulating layer and the third insulating layer is 0.1 nm or more and 4 nm or less.

14. The semiconductor device according to claim 12, wherein at least one of the second insulating layer and the third insulating layer is a discontinuous layer.

15. The semiconductor device according to claim 12, wherein at least one of the second insulating layer and the third insulating layer has a striped shape or a reticulated shape.

16. The semiconductor device according to claim 12, wherein at least one of the second insulating layer and the third insulating layer is a continuous layer.

17. The semiconductor device according to claim 12, wherein the second insulating layer covers an upper surface of the first conductive layer.

18. The semiconductor device according to claim 12, wherein the third insulating layer has concavity and convexity.

19. The semiconductor device according to claim 12, wherein a diode in contact with the first conductive layer or the second conductive layer.

20. The semiconductor device according to claim 12, wherein a material of the organic compound layer is an electron transporting material or a hole transporting material.

21. The semiconductor device according to claim 12, wherein the first conductive layer and the second conductive layer are connected to each other.

22. The semiconductor device according to claim 12, further comprising a transistor electrically connected to an antenna over the substrate.

23. An electronic appliance equipped with the semiconductor device according to claim 12 and at least one of operation buttons, a battery, a panel, and an external terminal.

24. A semiconductor device comprising:
a substrate;
a transistor over the substrate;
an insulating layer over the transistor;
a first conductive layer over the insulating layer;
a second conductive layer over the first conductive layer;

an organic compound layer interposed between the first conductive layer and the second conductive layer, the organic compound layer being partially in contact with the first conductive layer; and a plurality of insulating particles each provided between the first conductive layer and the organic compound layer; and wherein the transistor is electrically connected to the first conductive layer, wherein the plurality of insulating particles is arranged to have concavity and convexity, and wherein the concavity of the plurality of insulating particles is in contact with the first conductive layer.

25. The semiconductor device according to claim 24, wherein a diameter of the plurality of insulating particles is 0.1 nm or more and 4 nm or less.

26. The semiconductor device according to claim 24, further comprising a diode in contact with the first conductive layer or the second conductive layer.

27. The semiconductor device according to claim 24, wherein a material of the organic compound layer is an electron transporting material or a hole transporting material.

28. The semiconductor device according to claim 24, wherein the first conductive layer and the second conductive layer are connected to each other.

29. The semiconductor device according to claim 24, further comprising a transistor electrically connected to an antenna over the substrate.

30. An electronic appliance equipped with the semiconductor device according to claim 24 and at least one of operation buttons, a battery, a panel, and an external terminal.

31. A semiconductor device comprising:
a substrate;
a transistor over the substrate;
an insulating layer over the transistor;
a first conductive layer over the insulating layer;
a second conductive layer over the first conductive layer;
an organic compound layer interposed between the first conductive layer and the second conductive layer, the organic compound layer being partially in contact with the first conductive layer;
a plurality of first insulating particles each provided between the first conductive layer and the organic compound layer; and
a plurality of second insulating particles each provided between the second conductive layer and the organic compound layer;
wherein the transistor is electrically connected to the first conductive layer,
wherein the plurality of first insulating particles is arranged to have concavity and convexity, and
wherein the concavity of the plurality of first insulating particles is in contact with the first conductive layer.

32. The semiconductor device according to claim 31, wherein a diameter of at least one of the plurality of first insulating particles and the plurality of second insulating particles is 0.1 nm or more and 4 nm or less.

33. The semiconductor device according to claim 31, wherein the plurality of second insulating particles is arranged to have concavity and convexity.

34. The semiconductor device according to claim 31, further comprising a diode in contact with the first conductive layer or the second conductive layer.

35. The semiconductor device according to claim 31, wherein a material of the organic compound layer is an electron transporting material or a hole transporting material.

36. The semiconductor device according to claim 31, wherein the first conductive layer and the second conductive layer are connected to each other.

37. The semiconductor device according to claim 31, further comprising a transistor electrically connected to an antenna over the substrate.

38. An electronic appliance equipped with the semiconductor device according to claim 31 and at least one of operation buttons, a battery, a panel, and an external terminal.

* * * * *

UNITED STATES PATENT AND TRADEMARK OFFICE
CERTIFICATE OF CORRECTION

PATENT NO. : 8,399,881 B2  
APPLICATION NO. : 13/103293  
DATED : March 19, 2013  
INVENTOR(S) : Mikio Yukawa et al.

Page 1 of 1

It is certified that error appears in the above-identified patent and that said Letters Patent is hereby corrected as shown below:

In the Specifications:

At column 3, line 29, "sewing" should be --serving--;

At column 6, line 20, "AlLi" should be --AlLi--;

At column 7, lines 16 and 17, "amino]riphenylamine" should be --amino]-triphenylamine--;

At column 7, line 34, "BAN" should be --BAlq--;

At column 9, line 1, "imide" should be --amide--;

At column 10, line 50, "1'ET" should be --FET--;

At column 17, line 49, "bather" should be --barrier--;

At column 38, line 48, "NPS" should be --NPB--.

Signed and Sealed this  
Fourteenth Day of May, 2013

Teresa Stanek Rea  
*Acting Director of the United States Patent and Trademark Office*